US009544997B2

(12) United States Patent
Okumoto et al.

(10) Patent No.: US 9,544,997 B2
(45) Date of Patent: Jan. 10, 2017

(54) MULTI-LAYERED FILM, ELECTRONIC DEVICE, AND MANUFACTURING METHODS THEREOF

(71) Applicant: PANASONIC CORPORATION, Osaka (JP)

(72) Inventors: Kenji Okumoto, Osaka (JP); Arinobu Kanegae, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 246 days.

(21) Appl. No.: 14/193,382

(22) Filed: Feb. 28, 2014

(65) Prior Publication Data

US 2014/0254112 A1 Sep. 11, 2014

(30) Foreign Application Priority Data

Mar. 1, 2013 (JP) .................................. 2013-041146

(51) Int. Cl.
*H05K 1/00* (2006.01)
*H05K 1/03* (2006.01)
(Continued)

(52) U.S. Cl.
CPC .............. *H05K 1/0393* (2013.01); *G03F 7/00* (2013.01); *H01L 27/14643* (2013.01);
(Continued)

(58) Field of Classification Search
CPC ...... H01L 51/504; H01L 5/08; H01L 51/5278; H01L 33/52; H01L 33/54; H01L 33/56; H05B 33/24; H05B 33/22; H05K 1/00; H05K 1/02; H05K 1/056
(Continued)

(56) References Cited

U.S. PATENT DOCUMENTS 5,652,067 A * 7/1997 Ito ....................... H01L 51/5048
313/500
6,866,901 B2 3/2005 Burrows et al.
(Continued)

FOREIGN PATENT DOCUMENTS

JP 4556757 7/2010

OTHER PUBLICATIONS

"Flexible Flat Panel Displays," edited by Gregory P. Crawford, Wiley, Inc., Chapter, 12, Wagner et al., Mechanics: ch12, pp. 1-20 (2005).

*Primary Examiner* — Binh Tran
(74) *Attorney, Agent, or Firm* — Greenblum & Bernstein P.L.C.

(57) ABSTRACT

A multi-layered film includes: a plate-like flexible base member; first inorganic members that are each plate-like and arranged on the base member in separation from each other in a direction parallel to a main surface of the base member; a first organic member provided on the base member so as to be positioned between each adjacent two first inorganic members and surround each first inorganic member; a second inorganic member that covers an upper surface and lateral surfaces of the first organic member; and a second organic member that is provided on or above the first inorganic members, and is surrounded by the second inorganic member. Each lateral surface portion of the second inorganic member covering a corresponding lateral surface of the first organic member is thinner than each first inorganic member and each upper surface portion of the second inorganic member covering a corresponding portion of the upper surface.

11 Claims, 25 Drawing Sheets

(51) Int. Cl.
*H05B 33/24* (2006.01)
*H01L 51/50* (2006.01)
*G03F 7/00* (2006.01)
*H01L 27/146* (2006.01)
*H01L 51/52* (2006.01)
*H05K 1/18* (2006.01)
*H05K 1/09* (2006.01)
*G02F 1/1333* (2006.01)

(52) U.S. Cl.
CPC ........ *H01L 51/504* (2013.01); *H01L 51/5256* (2013.01); *H05B 33/24* (2013.01); *G02F 1/133305* (2013.01); *G02F 2001/133311* (2013.01); *H05K 2201/0179* (2013.01); *Y10T 428/24752* (2015.01)

(58) Field of Classification Search
USPC ........ 361/748, 750, 762; 313/506, 507, 508; 257/100; 174/250, 251, 256
See application file for complete search history.

(56) References Cited

U.S. PATENT DOCUMENTS

| | | |
|---|---|---|
| 7,314,834 B2 | 1/2008 | Koizumi |
| 8,310,152 B2 | 11/2012 | Yoshida et al. |
| 8,466,468 B2 | 6/2013 | Kondoh et al. |
| 2006/0138078 A1 | 6/2006 | Koizumi |
| 2007/0075627 A1* | 4/2007 | Kimura ............... H01L 27/3213 313/503 |
| 2012/0119235 A1 | 5/2012 | Nishiyama et al. |

* cited by examiner

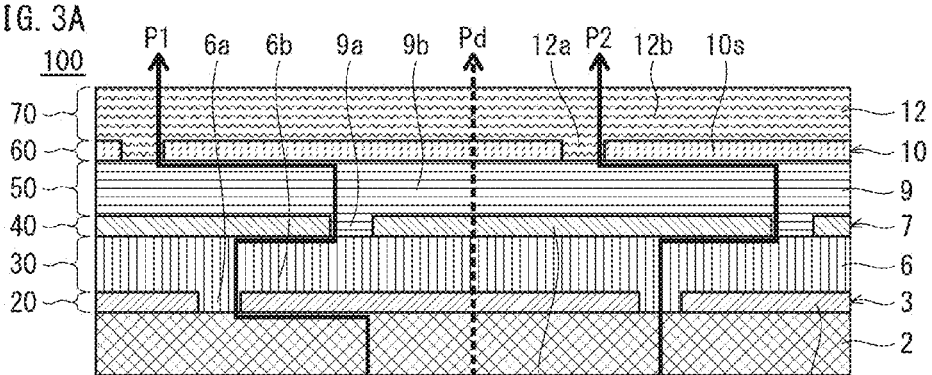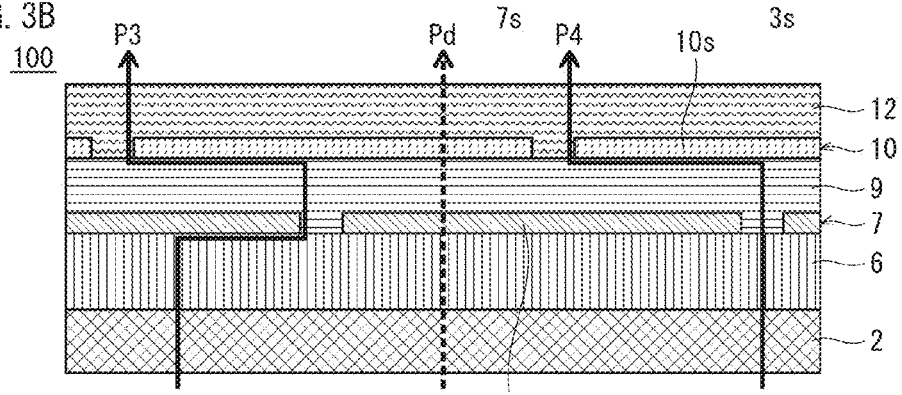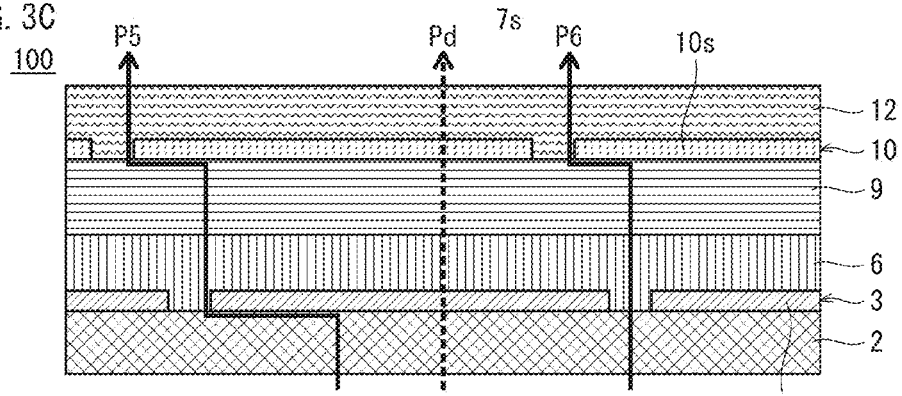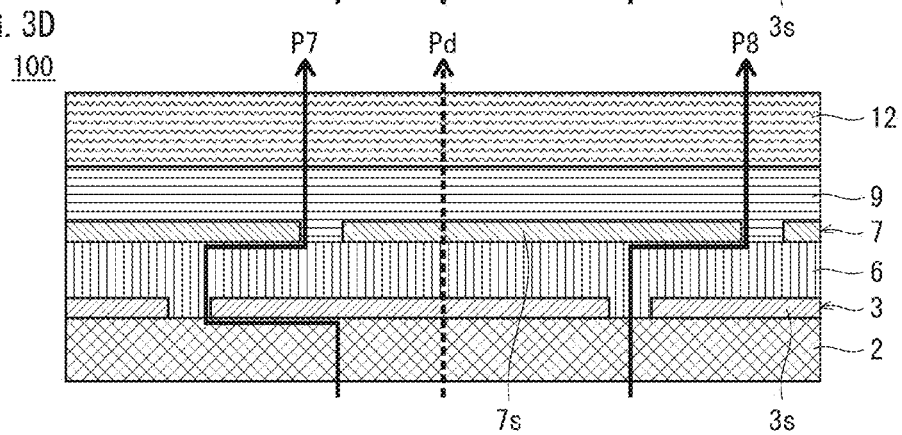

FIG. 10A
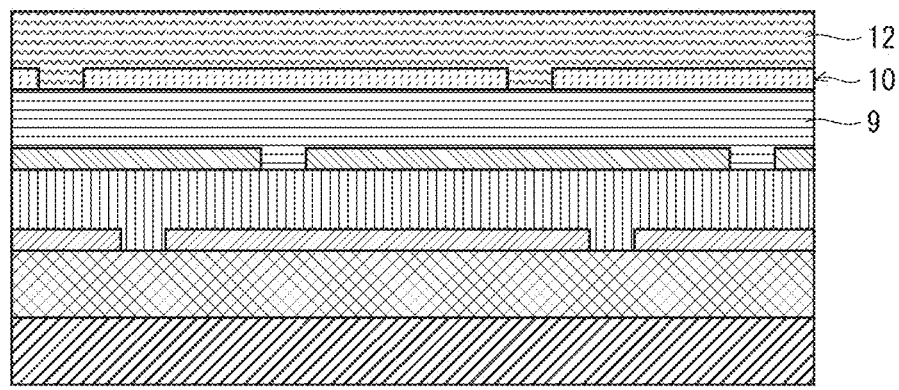
FIG. 10B
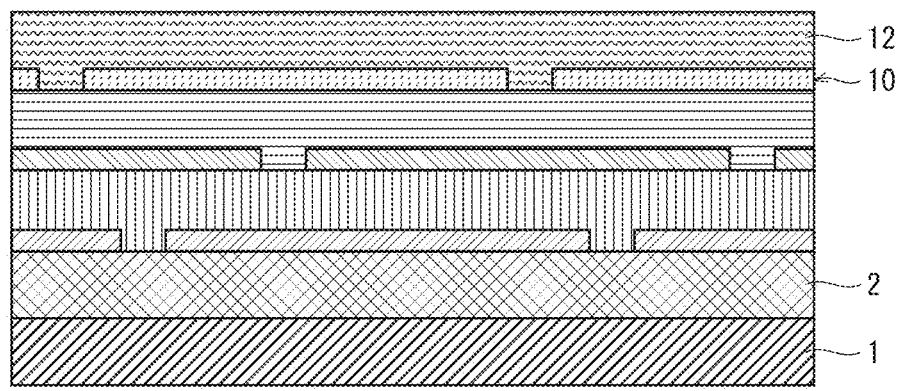
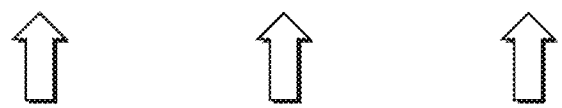
FIG. 10C
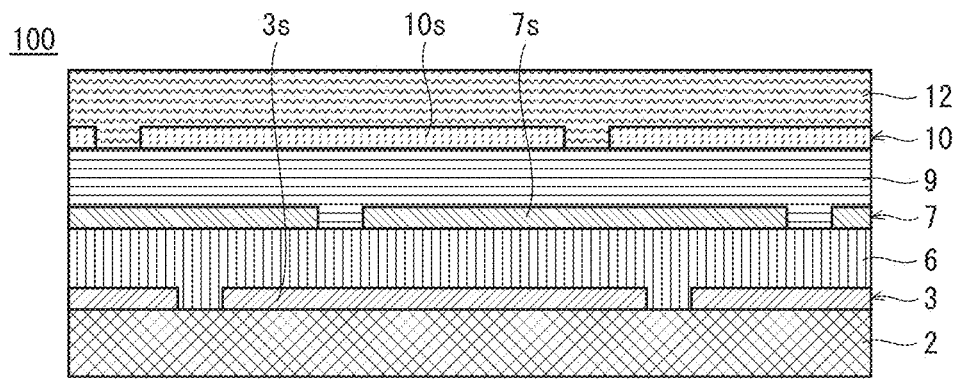

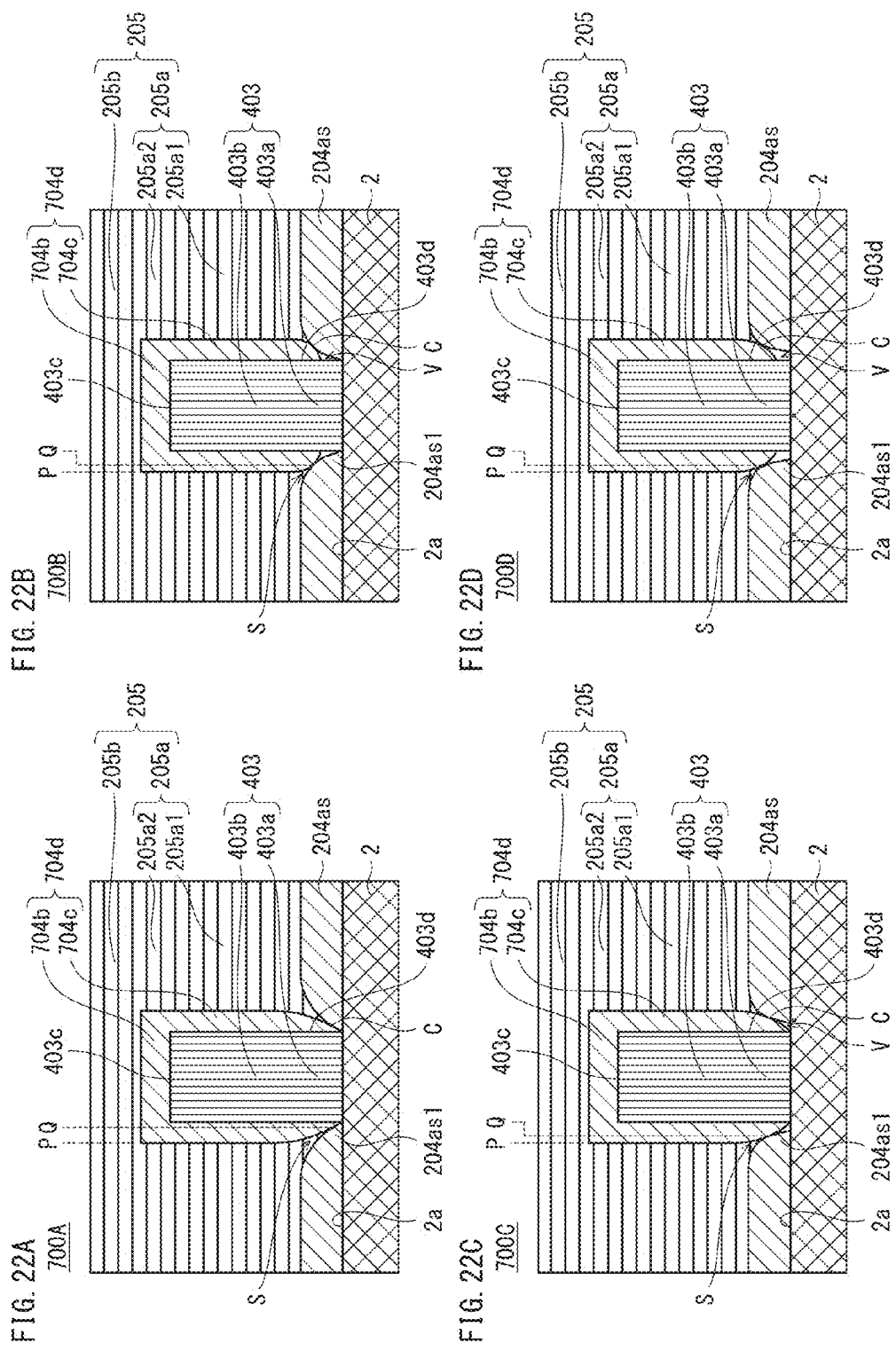

MULTI-LAYERED FILM, ELECTRONIC DEVICE, AND MANUFACTURING METHODS THEREOF

This application is based on applications No. 2013-041146 filed in Japan, the content of which is hereby incorporated by reference.

BACKGROUND OF THE INVENTION (1) Field of the Invention

The present invention relates to a multi-layered film, an electronic device, and manufacturing methods thereof.

(2) Description of Related Art

Electronic devices having features of being light, thin, less subject to splitting, bendable, and so on are realized by being formed on a plastic film. Such electronic devices are collectively called flexible electronics devices, and development of the flexible electronics devices has been actively promoted in recent years. Examples of such electronic devices include displays, photoelectric conversion elements, and RF tags. An outline of flexible displays is for example found in Flexible Flat Panel Displays, Gregory P. Crawford, 2005, Wiley.

A plastic film is more gas-permeable than a conventional glass substrate. This might cause deterioration of an electronic device due to gas permeation. In particular, moisture vapor is generally known for promoting temporal deterioration of a metal wiring, a semiconductor layer, and so on. In order to prevent this, a method of forming a gas barrier layer on a film has been adopted. For example, Specification of U.S. Pat. No. 6,866,901 discloses a configuration of alternately laminating inorganic films and organic films.

A moisture vapor transmission rate is evaluated by mass of water that transmits per unit area per day. Generally, an inorganic thin film has higher gas barrier properties than an organic thin film.

The inorganic film has a lower moisture vapor transmissivity than the organic film. This is because the inorganic film is denser than the organic film, and accordingly is less subject to permeation of gas molecule (water molecule in the case of moisture vapor) than the organic film.

In contrast, the inorganic film is generally easier to break than the organic film when bent or stressed. In the case where the organic film is split, gas barrier properties are lost. Furthermore, an electronic device formed on the film is destroyed, and as a result suffers from a fatal defect. It is generally known that the higher a density of a film is, the higher an elastic modulus of the film is, and the higher an elastic modulus of a film is, the more subject to splitting the film is.

In order to fully utilize the bendability which is an advantage of a flexible electronic device for industrial application, it is necessary to exhibit both gas barrier properties and bending tolerance of a gas barrier layer.

According to the configuration which is disclosed in Specification of U.S. Pat. No. 6,866,901, when an inorganic film is bent or stressed, a stress is spread inside the inorganic film. This configuration results in that the inorganic film is subject to splitting at a part thereof where a stress concentrates compared with a case where an organic film is used.

SUMMARY OF THE INVENTION

A multi-layered film relating to one aspect of the present invention comprises: a base member that is plate-like and flexible; a plurality of first inorganic members that are each plate-like, and are arranged on the base member so as to be separated from each other in a direction parallel to a main surface of the base member; a first organic member that is provided on the base member so as to be positioned between each adjacent two of the first inorganic members and surround each of the first inorganic members; a second inorganic member that covers an upper surface and lateral surfaces of the first organic member; and a second organic member that is provided on or above the first inorganic members, and is surrounded by the second inorganic member, wherein each of lateral surface portions of the second inorganic member that covers a corresponding one of the lateral surfaces of the first organic member is thinner than each of the first inorganic members and each of upper surface portions of the second inorganic member that covers a corresponding portion of the upper surface of the first organic member.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the drawings:

FIG. 3A is a partial cross-sectional view showing a configuration of the multi-layered film relating to Embodiment 1 taken along a straight line A-A in FIG. 2;

FIG. 3B is a partial cross-sectional view taken along a straight line B-B in FIG. 2;

FIG. 3C is a partial cross-sectional view taken along a straight line C-C in FIG. 2;

FIG. 3D is a partial cross-sectional view taken along a straight line D-D in FIG. 2;

FIG. 10A is a partial cross-sectional view showing a state where a third organic layer is formed on a third inorganic section and the second organic layer;

FIG. 10B a partial cross-sectional view showing a state where excimer laser irradiation is performed from a side of the glass substrate;

FIG. 10C is a partial cross-sectional view showing the multi-layered film relating to Embodiment 1 that is completed after the glass substrate is removed;

FIG. 22A is a partial cross-sectional view schematically showing a configuration of a multi-layered film relating to Modification 10;

FIG. 22B is a partial cross-sectional view schematically showing a configuration of a multi-layered film relating to Modification 11;

FIG. 22C is a partial cross-sectional view schematically showing a configuration of a multi-layered film relating to Modification 12;

FIG. 22D is a partial cross-sectional view schematically showing a configuration of a multi-layered film relating to Modification 13;

DETAILED DESCRIPTION

Figure 1:
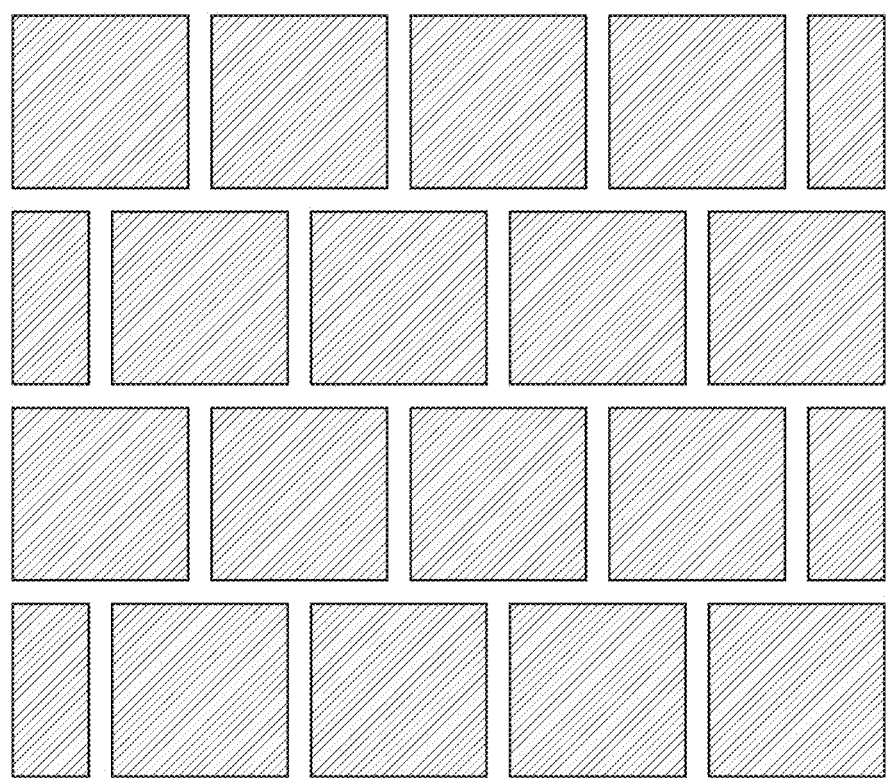
FIG. 1 is a plan view showing a pattern of inorganic members included in a multi-layered film relating to Embodiment 1.

Outline of One Aspect of the Present Invention

A multi-layered film relating to one aspect of the present invention comprises: a base member that is plate-like and flexible; a plurality of first inorganic members that are each plate-like, and are arranged on the base member so as to be separated from each other in a direction parallel to a main surface of the base member; a first organic member that is provided on the base member so as to be positioned between each adjacent two of the first inorganic members and surround each of the first inorganic members; a second inorganic member that covers an upper surface and lateral surfaces of the first organic member; and a second organic member that is provided on or above the first inorganic members, and is surrounded by the second inorganic member, wherein each of lateral surface portions of the second inorganic member that covers a corresponding one of the lateral surfaces of the first organic member is thinner than each of the first inorganic members and each of upper surface portions of the second inorganic member that covers a corresponding portion of the upper surface of the first organic member.

According to the configuration of the multi-layered film relating to the one aspect of the present invention, the first inorganic members are arranged so as to be separated from each other in the direction parallel to the main surface of the base member, and the first organic member is provided so as to be positioned between each adjacent two of the first inorganic members. In other words, the first inorganic members and portions of the first organic member are alternately arranged in the parallel direction. The upper surface and the lateral surfaces of the first organic member are covered by the second inorganic member, and the second organic member is provided on or above the first inorganic members, and is surrounded by the second inorganic member. Accordingly, in part of the multi-layered film that is on or above the first inorganic member and below the upper surface portions of the second inorganic member, organic members and inorganic members are alternately arranged in the parallel direction. Specifically, a portion of the second organic member, a portion of the second inorganic member (lateral surface portion), a portion of the first organic member, a portion of the second inorganic member (lateral surface portion), and a portion of the second organic member are arranged in respective orders in the parallel direction. Furthermore, in part of the multi-layered film where the upper surface portions of the second inorganic member are positioned, portions of the second organic member and portions of the second inorganic member (upper surface portions) are alternately arranged in the parallel direction. Accordingly, when the multi-layered film is bent, a stress in the parallel direction is absorbed by the first organic member and the second organic member which are each made of an organic material having a low elastic modulus (a high bending tolerance). This suppresses transfer of a stress in the parallel direction, thereby improving resistance to splitting.

Also, according to the multi-layered film relating to the one aspect of the present invention as described above, the first inorganic members and the portions of the first organic member are alternately arranged in the parallel direction, and the second inorganic member covers the upper surface and the lateral surfaces of the second organic member. With this configuration, the first inorganic members firstly block further infiltration of moisture that infiltrates through a surface of a plastic film as the base member. Also, the second inorganic member blocks further infiltration of moisture that infiltrates through the first organic member that is provided so as to be positioned between each adjacent two of the first inorganic members.

Furthermore, according to the multi-layered film relating to the one aspect of the present invention, each of the lateral surface portions of the second inorganic member, which is formed in a direction perpendicular to the main surface of the base member, is thinner than each of the first inorganic members and the upper surface portions of the second inorganic member, which is formed in the direction parallel to the main surface of the base member. Accordingly, when the multi-layered film is bent, a bending stress is absorbed by the lateral surface portions to a certain extent. As a result, crack and the like are less likely to occur in the lateral surface portions, and excellent gas barrier properties are exhibited.

Note that a stress in the present invention expresses not only a stress applied due to bending but also a residual stress that spontaneously occurs in a film formation process or the like.

Also, in a specific phase of the multi-layered film relating to the one aspect of the present invention, the first inorganic members are each separated from the first organic member.

The first inorganic members are each discontinuous with a corresponding one of the portions of the first organic member, and a space exists therebetween. Accordingly, when the multi-layered film is bent, a bending stress is absorbed owing to existence of the space, and this exhibits an excellent bending tolerance.

Also, in a specific phase of the multi-layered film relating to the one aspect of the present invention, the first inorganic members each have a contact portion that is in contact with a corresponding one of the lateral surface portions of the second inorganic member.

The first inorganic members are each discontinuous with a corresponding one of the portions of the first organic member. Accordingly, when the multi-layered film is bent, a bending stress is absorbed owing to existence of the space, and this exhibits an excellent bending tolerance. In addition, the first inorganic members are each in contact with a corresponding one of the portions of the first organic member. Accordingly, a space between the first inorganic member and the corresponding portion of the first organic member is extremely minute. This makes difficult for moisture to infiltrate through the space, thereby exhibiting excellent gas barrier properties.

Also, in a specific phase of the multi-layered film relating to the one aspect of the present invention, when viewed in plan, the contact portion of each of the first inorganic members overlaps the second inorganic member.

With this configuration, when moisture infiltrates through a minute space between each of the first inorganic members and a corresponding one of the portions of the second inorganic member, the moisture cannot move straight upward via the shortest route and needs to detour around the corresponding portion of the second organic member. This lengthens an infiltration route of the moisture. Accordingly, in the case where an electronic device layer or the like is provided on or above the multi-layered film, a longer time is necessary for the moisture to reach the electronic device layer or the like. As a result, excellent gas barrier properties are exhibited, and therefore an operating life of an electronic device is increased.

Also, in a specific phase of the multi-layered film relating to the one aspect of the present invention, in a cross section perpendicular to the main surface of the base member, each of bottom portions of the first organic member that is in contact with the base member is shorter than each of upper portions of the first organic member that is positioned on or above a corresponding one of the bottom portions, in terms of length in the direction parallel to the main surface of the base member.

The first organic member is in the shape as described above. Accordingly, each of the upper surface portions of the second inorganic member, which covers a corresponding one of the portions of the upper surface of the first organic member, is longer than each of the bottom portions of the first organic member, in terms of the length in the parallel direction. Therefore, the upper surface portions of the second inorganic member are each longer than an interval between each adjacent two of the first inorganic members in terms of length in the parallel direction. When moisture infiltrate through a space between each of the first inorganic members and a corresponding one of the portions of the first organic member, the moisture cannot move straight upward via the shortest route and needs to detour around the second inorganic member. This lengthens an infiltration route of the moisture. Accordingly, in the case where an electronic device layer or the like is provided on or above the multi-layered film, a longer time is necessary for the moisture to reach the electronic device layer or the like. As a result, excellent gas barrier properties are exhibited, and therefore an operating life of an electronic device is increased.

Also, in a specific phase of the multi-layered film relating to the one aspect of the present invention, the first organic member is composed of laminated layers that include at least two layers differing from each other in terms of length in the parallel direction, the bottom portions of the first organic member constitute a first phase layer that is included in the laminated layers and is positioned on the base member, and the upper portions of the first organic member constitute one or more layers that are included in the laminated layers, and at least one of the one or more layers is longer than the first phase layer in terms of length in the parallel direction.

Since a plurality of layers, which include at least two layers differing from each other in terms of the length in the parallel direction, are laminated, the first organic member is easily formed with a long layer laminated on or above a short layer in terms of the length in the parallel direction.

Also, according to a specific phase of the multi-layered film relating to the one aspect of the present invention, an end edge portion of each of the first inorganic members that is in the most proximity to the first organic member is continuous with a corresponding one of the lateral surface portions of the second inorganic member.

Since the first inorganic members are each continuous with a corresponding one of the portions of the second inorganic member, moisture is further surely blocked from moving in the direction parallel to the main surface of the substrate. In addition, a continuous layer of an inorganic member is made of the first inorganic members and the second inorganic member, and therefore further excellent gas barrier properties are exhibited.

A multi-layered film relating to another aspect of the present invention comprises: a base member that is plate-like and flexible; a first layer that is provided on or above the base member, and includes a first inorganic section; an interlayer that is laminated on the first layer, and includes an organic material; and a second layer that is laminated on the interlayer, and includes a second inorganic section, wherein the first inorganic section is constituted from a plurality of first inorganic members that are each plate-like, and are arranged so as to be separated from each other in a direction perpendicular to a laminating direction, the first layer includes an organic material that is provided so as to be positioned between each adjacent two of the first inorganic members, and the second layer includes the second inorganic section that is provided so as to be positioned on or above part of a space between each adjacent two of the first inorganic members.

Also, in a specific phase of the multi-layered film relating to the other aspect of the present invention, the first inorganic members have the same thickness.

This configuration allows manufacturing of the first inorganic members by the same manufacturing method. Also, the first inorganic members exhibit uniform gas barrier properties, and therefore the entire gas barrier properties of the multi-layered film are uniformized. Furthermore, an upper surface of the first layer is easily planarized compared with the case where the first inorganic members do not have the same thickness. This reduces roughness of a layer that is to be formed on or above the first layer.

Also, in a specific phase of the multi-layered film relating to the other aspect of the present invention, the first inorganic members have respective lower surfaces that are positioned on the same plane.

This configuration allows simultaneous formation of the first inorganic members on the same plane, thereby facilitating manufacturing of the multi-layered film.

Also, in a specific phase of the multi-layered film relating to the other aspect of the present invention, when viewed in plan, the first inorganic members are arranged in a regular pattern.

This configuration facilitates manufacturing of the multi-layered film compared with the case where the first inorganic members are irregularly arranged.

Also, in a specific phase of the multi-layered film relating to the other aspect of the present invention, when viewed in plan, the first inorganic members have the same shape and size.

This configuration facilitates manufacturing of the multi-layered film compared with the case where the first inorganic members vary in shape and size.

Also, in a specific phase of the multi-layered film relating to the other aspect of the present invention, the second inorganic section is provided so as to be positioned on or above the entire space between each adjacent two of the first inorganic members.

With this configuration, when moisture permeates through the space between each adjacent two of the first inorganic members, the moisture is inevitably blocked from further infiltrating by the second inorganic section. Accordingly, excellent gas barrier properties are exhibited.

Also, in a specific phase of the multi-layered film relating to the other aspect of the present invention, in the second layer, the second inorganic section is constituted from a plurality of second inorganic members that are arranged so as to be separated from each other in the direction perpendicular to the laminating direction, and an organic material is provided in a space between each adjacent two of the second inorganic members. Alternatively, the second inorganic section is formed in a mesh shape in the direction perpendicular to the laminating direction, and an organic material is provided in each of hole regions of the mesh shape constituting the second inorganic section.

With this configuration, when the multi-layered film is bent, a stress in the second layer is absorbed by an organic material having a lower elastic modulus (a higher bending tolerance) than an inorganic material, as well as in the first layer. This suppresses transfer of the stress in the second layer, thereby improving resistance to splitting.

Also, in a specific phase of the multi-layered film relating to the other aspect of the present invention, the second inorganic section is constituted from the second inorganic members, the multi-layered film further comprises a third layer that is laminated on the second layer via the interlayer including the organic material, and that includes a third inorganic section constituted from a plurality of third inorganic members that are arranged so as to be separated from each other in the direction perpendicular to the laminating direction, the first inorganic members and the second inorganic members have the same shape and size, and are arranged in the same regular pattern in the direction perpendicular to the laminating direction in plan view, the respective patterns of the first inorganic members and the second inorganic members are shifted from each other, and any of the third inorganic members is provided on or above a part where the first inorganic members do not overlap the second inorganic members due to the shift.

This configuration allows formation of the first inorganic members and the second inorganic members with use of the same pattern mask, thereby facilitating manufacturing of the multi-layered film. Also, the respective arrangement patterns of the first inorganic members and the second inorganic members are shifted from each other, and accordingly a further broad area is covered. Furthermore, any of the third inorganic members is provided on or above a part where the first inorganic members do not overlap the second inorganic members. Accordingly, when moisture permeates through this part where the first inorganic members do not overlap the second inorganic members, the moisture is blocked from further infiltrating by any of the third inorganic members which exists in the part in plan view.

Also, in a specific phase of the multi-layered film relating to the other aspect of the present invention, the third layer further includes an organic material that is positioned between each adjacent two of the third inorganic members.

With this configuration, when the multi-layered film is bent, a stress in the third layer is absorbed by an organic material having a low elastic modulus (a high bending tolerance), as well as in the first layer. This suppresses transfer of the stress in the third layer, thereby improving resistance to splitting.

Also, in a specific phase of the multi-layered film relating to the other aspect of the present invention, when viewed in plan, the third inorganic members are arranged in the same pattern as the patterns of the first inorganic members and the second inorganic members.

This configuration allows formation of the first inorganic members, the second inorganic members, and the third inorganic members with use of the same mask.

Also, in a specific phase of the multi-layered film relating to the other aspect of the present invention, the multi-layered film further comprises a plurality of intermediate inorganic members that each extend downward from an edge end of a corresponding one of the second inorganic members to reach an edge end of a corresponding one of the first inorganic members, and a thickness of each of the intermediate inorganic members in the direction perpendicular to the laminating direction is thinner than a thickness of each of the second inorganic members in the laminating direction.

This configuration allows blocking of moisture from moving in the direction perpendicular to the laminating direction by the intermediate inorganic member, thereby exhibiting further excellent gas barrier properties.

An electronic device relating to still another aspect of the present invention comprises the multi-layered film having any of the above characteristics and a device layer that is provided on or above the multi-layered film.

This configuration realizes an electronic device having both excellent gas barrier properties and bending tolerance.

Also, in a specific phase of the electronic device relating to the still other aspect of the present invention, the electronic device further comprises a planarization layer that is provided between the multilayered-film and the device layer, wherein the planarization layer has a surface roughness of 100 nm or less.

This configuration suppresses occurrence of failure in the device layer, thereby exhibiting an excellent quality.

Also, in a specific phase of the electronic device relating to the still other aspect of the present invention, the device layer is constituted from one type of organic EL elements, liquid crystal elements, photoelectric conversion elements, and RFID elements.

This configuration realizes any of an organic EL device, a liquid crystal device, a photoelectric conversion device, an RFID that are flexible and have an excellent quality stability.

Also, in a specific phase of the electronic device relating to the still other aspect of the present invention, the device layer has a display region for displaying images, and when viewed in plan, at least one type of the first inorganic members and the second inorganic member occupies 90% or more of an area of the display region.

Since deterioration in image quality is easily noticed by a user, it is important to maintain an excellent quality in the display region. The above configuration suppresses deterioration in quality in the display region.

A manufacturing method of a multi-layered film relating to yet another aspect of the present invention comprises: preparing a base member that is plate-like and flexible; laminating a first organic layer on or above the base member; forming a first organic member that is patterned in a mesh shape in a direction parallel to a main surface of the base member, by patterning the first organic layer in a mesh shape; by forming an inorganic layer on the first organic member, simultaneously forming a plurality of plate-like first inorganic members on or above portions of the base member that correspond to hole regions of the mesh shape constituting the first organic member such that the first inorganic members are separated from each other in the parallel direction, and a second inorganic member in a mesh shape in the parallel direction on the first organic member; and forming a second organic layer on the first inorganic members and the second inorganic member.

This configuration allows simultaneous formation of the first inorganic members and the second inorganic member, thereby facilitating manufacturing of the multi-layered film and suppressing increase in number of manufacturing processes. As a result, increase in working efficiency and reduction in cost are realized.

Also, in a specific phase of the manufacturing method of the multi-layered film relating to the yet other aspect of the present invention, the manufacturing method further comprises, between the forming the first inorganic members and the second inorganic member and the forming the second organic layer, performing surface treatment on respective surfaces of the first inorganic members and the second inorganic member, by performing one of plasma processing, light irradiation, and formation of a self-assembled monolayer.

This configuration increases an adhesive strength between each of the first inorganic members and the second organic layer and an adhesive strength between the second inorganic member and the second organic layer, thereby blocking moisture from infiltrating through an interface between each of the first inorganic members and the second organic layer and an interface between the second inorganic member and the second organic layer.

A manufacturing method of an electronic device relating to further aspect of the present invention comprises forming a device layer on or above a multi-layered film that is manufactured by any of the manufacturing methods of multi-layered film.

Also, in a specific phase of the manufacturing method of the electronic device relating to the further aspect of the present invention, the device layer is constituted from one type of organic EL elements, liquid crystal elements, photoelectric conversion elements, and RFID elements.

A manufacturing method of a multi-layered film relating to a still further aspect of the present invention comprises: preparing a base member that is plate-like and flexible; forming a first inorganic material layer as a continuous and uniform film on or above the base member; forming a first inorganic section that is constituted from a plurality of plate-like first inorganic members, by turning the first inorganic material layer into the shape of islands such that the first inorganic members are separated from each other in a direction parallel to a main surface of the base member; forming a first organic layer including an organic material so as to be provided on or above the first inorganic members and in a space between each adjacent two of the first inorganic members; forming a second inorganic material layer as a continuous and uniform film on or above the first organic layer; and forming a second inorganic section so as to be positioned on or above at least part of the space between each adjacent two of the first inorganic members, the second inorganic section being constituted from a plurality of plate-like second inorganic members, by turning the second inorganic material layer into the shape of islands such that the second inorganic members are separated from each other in the parallel direction.

Also, in a specific phase of the manufacturing method of the multi-layered film relating to the still further aspect of the present invention, the manufacturing method further comprises: between the forming the first inorganic section and the forming the first organic layer, performing surface treatment on a surface of the first inorganic section, by performing one of plasma processing, light irradiation, and formation of a self-assembled monolayer.

This configuration increases an adhesive strength between the first inorganic section and the first organic layer, thereby blocking moisture from infiltrating through an interface between the first inorganic section and the first organic layer.

Also, in a specific phase of the manufacturing method of the multi-layered film relating to the still further aspect of the present invention, the manufacturing method further comprises: between the forming the second inorganic section and the forming the second organic layer, performing surface treatment on a surface of the second inorganic section, by performing one of plasma processing, light irradiation, and formation of a self-assembled monolayer.

This configuration increases an adhesive strength between the second inorganic section and the second organic layer, thereby blocking moisture from infiltrating through an interface between the second inorganic section and the second organic layer.

The following shows specific examples to describe configurations and effects of the present invention.

Note that embodiments shown in the following description are examples used for easy understanding of configurations and effects relating to one aspect of the present invention. The present invention is not limited by these embodiments excepting essential features thereof.

Embodiment 1

The configuration of the present invention is described in further detail with reference to the drawings.

1. Overall Configuration of Multi-Layered Film 100

FIG. 1 is a plan view showing an aspect of inorganic members constituting a layer included in a multi-layered film relating to Embodiment 1. As shown in FIG. 1, a plurality of plate-like inorganic members are formed in the shape of islands (separated from each other in a direction perpendicular to a laminating direction). The inorganic members are arranged in a regularly repeating pattern. Here, the laminating direction indicates a direction of layer thickness, and the direction perpendicular to the laminating direction indicates a direction parallel to a main surface of a base member 2 (see FIG. 3A to FIG. 3D). The repeating pattern shown in FIG. 1 is just an example. FIG. 1 shows only part of the inorganic members. In FIG. 1, shaded parts each represent an inorganic member, and an outlined part represents a space between each adjacent two of the inorganic members. Each inorganic member as a single island is substantially a square in plan view as shown in FIG. 1. In the present embodiment, each side of the square has a length of 40 μm for example, and a space between each adjacent two of the inorganic members has a length of 2 μm for example. However, the length is not limited to these values.

Figure 2:
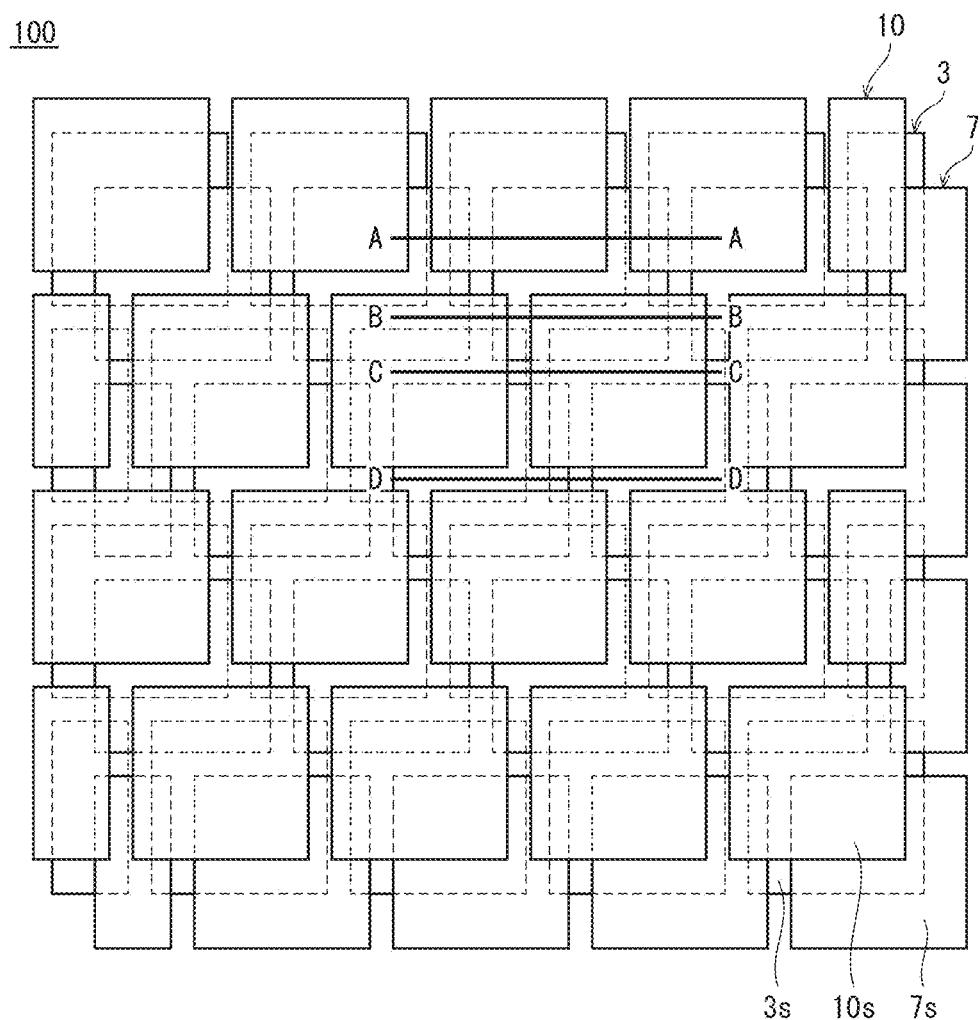
FIG. 2 is a plan view schematically showing an aspect in which patterns of inorganic members included in the multi-layered film relating to Embodiment 1 are overlaid each other.

FIG. 2 is a plan view schematically showing a configuration of a multi-layered film 100 relating to Embodiment 1. FIG. 3A is a cross-sectional view of the multi-layered film 100 taken along a straight line A-A in FIG. 2. FIG. 3B is a cross-sectional view of the multi-layered film 100 taken along a straight line B-B in FIG. 2. FIG. 3C is a cross-sectional view of the multi-layered film 100 taken along a straight line C-C in FIG. 2. FIG. 3D is a cross-sectional view of the multi-layered film 100 taken along a straight line D-D in FIG. 2. Note that FIG. 2 shows only a first inorganic section 3, a second inorganic section 7, and a third inorganic section 10 for easy understanding.

As shown in FIG. 2 and FIG. 3A to FIG. 3D, the multi-layered film 100 has a configuration in which three layers of inorganic sections (a layer of the first inorganic section 3, a layer of the second inorganic section 7, and a layer of the third inorganic section 10), each of which are constituted from a plurality of inorganic members arranged in the pattern shown in FIG. 1, overlap each other such that the respective patterns of the three layers are shifted from each other. Also as shown in FIG. 3A, the multi-layered film 100 is constituted from the base member 2 that is made of a flexible organic material on which the layer of the first inorganic section 3, a first organic layer 6, the layer of the second inorganic section 7, a second organic layer 9, the layer of the third inorganic section 10, and a third organic layer 12 are laminated in respective orders.

Due to alignment shift resulting from pattern shifting as described above, a space between each adjacent two of the inorganic members constituting the first inorganic section 3, a space between each adjacent two of the inorganic members constituting the second inorganic section 7, and a space between each adjacent two of the inorganic members constituting the third inorganic section 10 do not completely overlap each other. Accordingly, when viewed in plan, at least one of the three types of inorganic members inevitably exists in every part of the multi-layered film 100 except a peripheral part thereof.

Note that the alignment shift in the present embodiment is for example as described below. In FIG. 2, the pattern of the second inorganic members 7s constituting the second inorganic section 7 is formed by shifting the pattern of the first inorganic members 3s constituting the first inorganic section 3 by 20 µm in the lower direction and 10 µm in the right direction. The pattern of the third inorganic members 10s constituting the third inorganic section 10 is formed by shifting the pattern of the first inorganic members 3s constituting the first inorganic section 3 by 10 µm in the upper direction and 5 µm in the left direction.

The flexible organic material as the base member 2 is resin, a resin material containing an additive made from an inorganic material or an organic material, particles, or fillers, or the like.

The resin material may be polyethylene, polypropylene, polyvinyl, polyvinylidene chloride, polyethylene terephthalate, polyethylene naphthalate, polycarbonate, polyethylene sulfonic acid, silicone, acrylic resin, epoxy resin, phenolic resin, polyamide, polyimide, aramid resin, or the like. A mixture of two types or more of these resin materials may be used. Also, these resin materials may be chemically modified. The base member 2 in the present embodiment is for example made from polyimide.

The base member 2 needs to be flexible enough not to be easily split or destroyed when the multi-layered film 100 is bent.

The base member 2 should preferably have a film thickness within a range of 1 µm to 1000 µm so as to secure necessary mechanical strength and bendability.

As shown in FIG. 2 and FIG. 3A to FIG. 3D, the first inorganic section 3 is constituted from the inorganic members 3s which are arranged so as to be separated from each other in the direction perpendicular to the laminating direction (the direction of the layer thickness). Hereinafter, this perpendicular direction is referred to just as a layer direction. The second inorganic section 7 is constituted from the inorganic members 7s which are arranged so as to be separated from each other in the layer direction. The third inorganic section 10 is constituted from the inorganic members 10s which are arranged so as to be separated from each other in the layer direction.

The first inorganic members 3s are each plate-like, and have substantially the same thickness. Respective lower surfaces of the first inorganic members 3s are positioned on substantially the same plane. The second inorganic members 7s are each plate-like, and have substantially the same thickness. Respective lower surfaces of the second inorganic members 7s are positioned on substantially the same plane. The third inorganic members 10s are each plate-like, and have substantially the same thickness. Respective lower surfaces of the third inorganic members 10s are positioned on substantially the same plane.

According to the multi-layered film 100 relating to Embodiment 1, the first inorganic members 3s, the second inorganic members 7s, and the third inorganic members 10s all have substantially the same shape (square shape) and size in plan view.

The first inorganic section 3, the second inorganic section 7, and the third inorganic section 10 may be made of a metal film, a carbon film, a silicon film, or an insulating film. The material of the first inorganic section 3, the second inorganic section 7, and the third inorganic section 10 does not necessarily need to be constituted only from an inorganic material as long as the inorganic material is included as a main component. Inclusion of a small amount of components other than an inorganic material does not cause a concern at all. The metal film may preferably be made of one of gold, silver, copper, aluminum, molybdenum, and chrome, or alloy of these metal materials. The insulating film may preferably be made of metal oxide, metal salt, silicon oxide, silicon nitride, silicide, or the like. These materials have a low moisture permeability.

The first inorganic members 3s, the second inorganic members 7s, and the third inorganic members 10s each should preferably have a film thickness within a range of 10 nm to 100 µm. A film thickness that is below the range allows moisture permeation, and this results in difficulty exhibiting gas barrier properties. A film thickness that exceeds the range causes excessive difference in level, and this results in difficulty planarizing by an organic layer that covers above. As a result, formation of an electronic device on the multi-layered film 100 is difficult.

2. Flexibility and Bending Tolerance of Multi-Layered Film 1001

The first organic layer 6 is formed so as to cover the first inorganic section 3 and fill a space between each adjacent two of the first inorganic members 3s. In other words, the first organic layer 6 is constituted from a first organic member (organic material) 6a that is formed in a space between each adjacent two of the first inorganic members 3s and a first continuous organic layer portion 6b that is formed on the first inorganic members 3s as a continuous layer. Similarly, the second organic layer 9 is constituted from a second organic member (organic material) 9a that is formed in a space between each adjacent two of the second inorganic members 7s and a second continuous organic layer portion 9b that is formed on the second inorganic members 7s as a continuous layer. Furthermore, the third organic layer 12 is constituted from a third organic member (organic material) 12a that is formed in a space between each adjacent two of the third inorganic members 10s and a third continuous organic layer portion 12b that is formed on the third inorganic members 10s as a continuous layer. An organic material of the first organic layer 6, the second organic layer 9, and the third organic layer 12 may preferably be acrylic resin, phenolic resin, polycarbonate, polyxylene, polyimide, polyamide, aramid resin, or the like. The material of the first organic layer 6, the second organic layer 9, and the third organic layer 12 does not necessarily need to be constituted only from an organic material as long as the organic material is included as a main component. Inclusion of an inorganic material in addition to the main component does not cause a concern at all. The first organic layer 6, the second organic layer 9, and the third organic layer 12 need to have flexibility against bending. In other words, it is necessary that when the multi-layered film 100 is bent, the first organic layer 6, the second organic layer 9, and the third organic layer 12 can easily deform and relax a stress. This substantially means that a low elastic modulus is necessary.

Note that a material that is subject to cracking has a low aptitude for the organic material relating to the present invention even if the material has a low elastic modulus.

The first organic layer 6, the second organic layer 9, and the third organic layer 12 each should preferably have a film thickness within a range of 10 nm to 100 μm. A film thickness that is below the range results in difficulty completely covering the first inorganic members 3s, the second inorganic members 7s, and the third inorganic members 10s, respectively. As a result, diffusion of a stress resulting from bending is difficult. A film thickness that exceeds the range increases the entire thickness of the multi-layered film 100, and this results in difficulty bending the multi-layered film 100.

According to the multi-layered film 100 relating to the present embodiment as described above, a plurality of inorganic members, which are constituted mainly from an inorganic material, are intermittently positioned with an organic member, which is constituted mainly from an organic material, between each adjacent inorganic members. With this configuration, when the multi-layered film 100 is bent, not the inorganic members but the organic members mainly deform and absorb a stress resulting from bending. As a result, occurrence of split and crack is prevented.

In the case where a space between each adjacent two inorganic members is filled with an inorganic material, when the multi-layered film 100 is bent, one or both of the inorganic members and the inorganic materials might be easily destroyed. In order to achieve the effects of the present invention, each inorganic section needs to have the configuration in which a plurality of inorganic members are patterned in the layer direction to be intermittently positioned, in other words, the inorganic members are separated from each other in the layer direction. This configuration solves a problem, which tends to occur in the case where each inorganic section is formed as a continuous film, that the weakest part of a film is destroyed due to stress propagation.

Also, in the case where a space between each adjacent two inorganic members is not filled, each inorganic section has a large surface roughness, and this results in difficulty providing other sealing film, a functional device, and so on above the inorganic section.

The configuration of the multi-layered film 100 relating to Embodiment 1 is also expressed as follows. The first inorganic section 3 and the first organic member 6a constitute a first layer 20. The first continuous organic layer portion 6b constitutes a first interlayer 30. The second inorganic section 7 and the second organic member 9a constitute a second layer 40. The second continuous organic layer portion 9b constitutes a second interlayer 50. The third inorganic section 10 and the third organic member 12a constitute a third layer 60. The third continuous organic layer portion 12b constitutes an upper layer 70. When expressed as above, the multi-layered film 100 has a configuration in which the first layer 20, the first interlayer 30, the second layer 40, the second interlayer 50, the third layer 60, and the upper layer 70 are laminated on the base member 2 in respective orders.

The first layer 20 includes the first inorganic members 3s which are formed so as to be separated from each other in the layer direction. The second layer 40 includes the second inorganic members 7s which are formed so as to be separated from each other in the layer direction. The third layer 60 includes the third inorganic members 10s which are formed so as to be separated from each other in the layer direction. The first organic member 6a is formed so as to fill a space between each adjacent two of the first inorganic members 3s. The second organic member 9a is formed so as to fill a space between each adjacent two of the second inorganic members 7s. The third organic member 12a is formed so as to fill a space between each adjacent two of the third inorganic members 10s. Accordingly, respective bending stress that is transferred inside the first layer 20, the second layer 40, and the third layer 60 in the layer direction are absorbed by the first organic member 6a, the second organic member 9a, and the third organic member 12a, respectively. This prevents occurrence of split and crack in the first inorganic section 3, the second inorganic section 7, and the third inorganic section 10. Therefore, the multi-layered film 100 exhibits excellent flexibility and bending tolerance.

Also, the first interlayer 30 and the second interlayer 50, which are formed mainly from an organic material, are formed between the first layer 20 and the second layer 40, and between the second layer 40 and the third layer 60, respectively. Accordingly, the bending stress is also absorbed by the first interlayer 30 and the second interlayer 50. As a result, transfer of the bending stress in the laminating direction (the direction of the layer thickness) is suppressed. This further prevents occurrence of split and crack in the first inorganic section 3, the second inorganic section 7, and the third inorganic section 10, thereby exhibiting a further excellent bending tolerance.

3. Moisture Permeability of Multi-Layered Film 100

In FIG. 3A to FIG. 3D, arrows P1 to P4 each represent an infiltration route of moisture from outside, and a dashed arrow Pd represents the shortest infiltration route of moisture on the assumption that nothing blocks moisture infiltration.

As indicated by the arrow P1 in FIG. 3A, moisture that infiltrates from outside through the base member 2 is blocked from moving upward by the first inorganic member 3s having a low moisture permeability. The moisture moves in the layer direction (the lateral direction in FIG. 3A to FIG. 3D) along a lower surface of the first inorganic member 3s to detour around the first inorganic member 3. Then, the moisture reaches the first organic member 6a, which is formed in a space between adjacent first inorganic members 3s. Here, since the first organic member 6a has a higher moisture permeability than the first inorganic member 3s, the moisture infiltrates further above through the first organic member 6a to reach the second inorganic member 7s. The moisture is blocked from moving upward by the second inorganic member 7s having a low moisture permeability. Then, the moisture moves in the layer direction (the lateral direction in FIG. 3A to FIG. 3D) along a lower surface of the second inorganic member 7s to detour around the second inorganic member 7s. Then, the moisture reaches the second organic member 9a, which is formed in a space between adjacent second inorganic members 7s. Here, since the second organic member 9a has a higher moisture permeability than the second inorganic member 7s, the moisture infiltrates further above through the second organic member 9a to reach the third inorganic member 10s having a low moisture permeability. The moisture is blocked from moving upward by the third inorganic member 10s. The moisture moves in the layer direction (the lateral direction in FIG. 3A to FIG. 3D) along a lower surface of the third inorganic member 10s to detour around the third inorganic member 10s. Then, the moisture infiltrates into the third continuous organic layer portion 12b through the third organic member 12a, which is formed in a space between adjacent third inorganic members 10s. Finally, the moisture reaches a device layer 90 (see FIG. 17) formed on or above the third continuous organic layer portion 12b.

In this way, each time moisture, which infiltrates from outside the base member 2, is blocked from moving upward by the inorganic member (the first inorganic member 3s, the second inorganic member 7s, and the third inorganic member 10s), the moisture needs to detour around the inorganic member. As a result, this infiltration route of the moisture is longer than the shortest infiltration route Pd. This means that it takes a longer time for the moisture which infiltrates from outside, to infiltrate through the multi-layered film 100 and reach the device layer 90 (see FIG. 17) formed on or above the multi-layered film 100. Therefore, it is possible to prevent the device layer 90 (see FIG. 17) from suffering a harmful influence of moisture which infiltrates from outside for a long time.

As shown in FIG. 3B to FIG. 3D, the multi-layered film 100 has portions where only two of the first inorganic section 3, the second inorganic section 7, and the third inorganic section 10 overlap each other.

FIG. 3B shows a cross section of a part of the multi-layered film 100 where the first inorganic section 3 does not exist, and only the second inorganic section 7 and the third inorganic section 10 overlap each other. In the part of the multi-layered film 100 as shown in FIG. 3B, the infiltration route indicated by the arrow P3 shows a route that moisture reaches the second inorganic member 7s and detours around the second inorganic member 7s, and then reaches the third inorganic member 10s and detours around the third inorganic member 10s. Also, the infiltration route indicated by the arrow P4 shows a route that moisture infiltrates between adjacent second inorganic members 7s, reaches the third inorganic member 10s, and detours around the third inorganic member 10s.

FIG. 3C shows a cross section of a part of the multi-layered film 100 where the second inorganic section 7 does not exist, and only the first inorganic section 3 and the third inorganic section 10 overlap each other. In the part of the multi-layered film 100 as shown in FIG. 3C, the infiltration route indicated by the arrow P5 shows a route that moisture reaches the first inorganic member 3s and detours around the first inorganic members 3, and then reaches the third inorganic member 10s and detours around the third inorganic members 10s. Also, the infiltration route indicated by the arrow P6 shows a route that moisture infiltrates between adjacent first inorganic members 3s, reaches the third inorganic member 10s, and detours around the third inorganic member 10s.

FIG. 3D shows a cross section of a part of the multi-layered film 100 where the third inorganic section 10 does not exist, and only the first inorganic section 3 and the second inorganic section 7 overlap each other. In the part of the multi-layered film 100 as shown in FIG. 3D, the infiltration route indicated by the arrow P7 shows a route that moisture reaches the first inorganic member 3s and detours around the first inorganic member 3s, and then reaches the second inorganic member 7s and detours around the second inorganic member 7s. Also, the infiltration route indicated by the arrow P8 shows a route that moisture infiltrates between adjacent first inorganic members 3s, reaches the second inorganic member 7s, and detours around the second inorganic member 7s.

As described above, when viewed in plan, at least one of the first inorganic section 3, the second inorganic section 7, and the third inorganic section 10 exists in any part of the multi-layered film 100 except a peripheral part thereof. For this reason, moisture inevitably needs to detour around each of the inorganic sections which the moisture reaches. As a result, the infiltration route of the moisture is longer than the shortest infiltration route Pd. A longer time is necessary for the moisture, which infiltrates from outside, to permeate through the multi-layered film 100 and reach the device layer 90 (see FIG. 17) formed on or above the multi-layered film 100. Therefore, it is possible to prevent the device layer 90 (see FIG. 17) from suffering a harmful influence of moisture which infiltrates from outside for a long time.

Note that the first inorganic section 3, the second inorganic section 7, and the third inorganic section 10 all do not necessarily need to be formed for the purpose of sealing moisture, and at least one of these inorganic sections may also function as a functional layer such as a metal wiring layer.

It is desirable that when the multi-layered film 100 is viewed in plan, the entire first organic member 6a included in the first layer 20, which is positioned between each adjacent two of the first inorganic members 3s included in the first layer 20, should overlap at least one of the second inorganic member 7s included in the second layer 40 and the third inorganic member 10s included in the third layer 60. In the light of an infiltration route of moisture, this configuration does not allow the moisture to infiltrate in the direction of the film thickness by the shortest route, and cause the moisture to make a detour. Therefore, the gas barrier properties are improved.

4. Manufacturing Method of Multi-Layered Film 100

Figure 11:
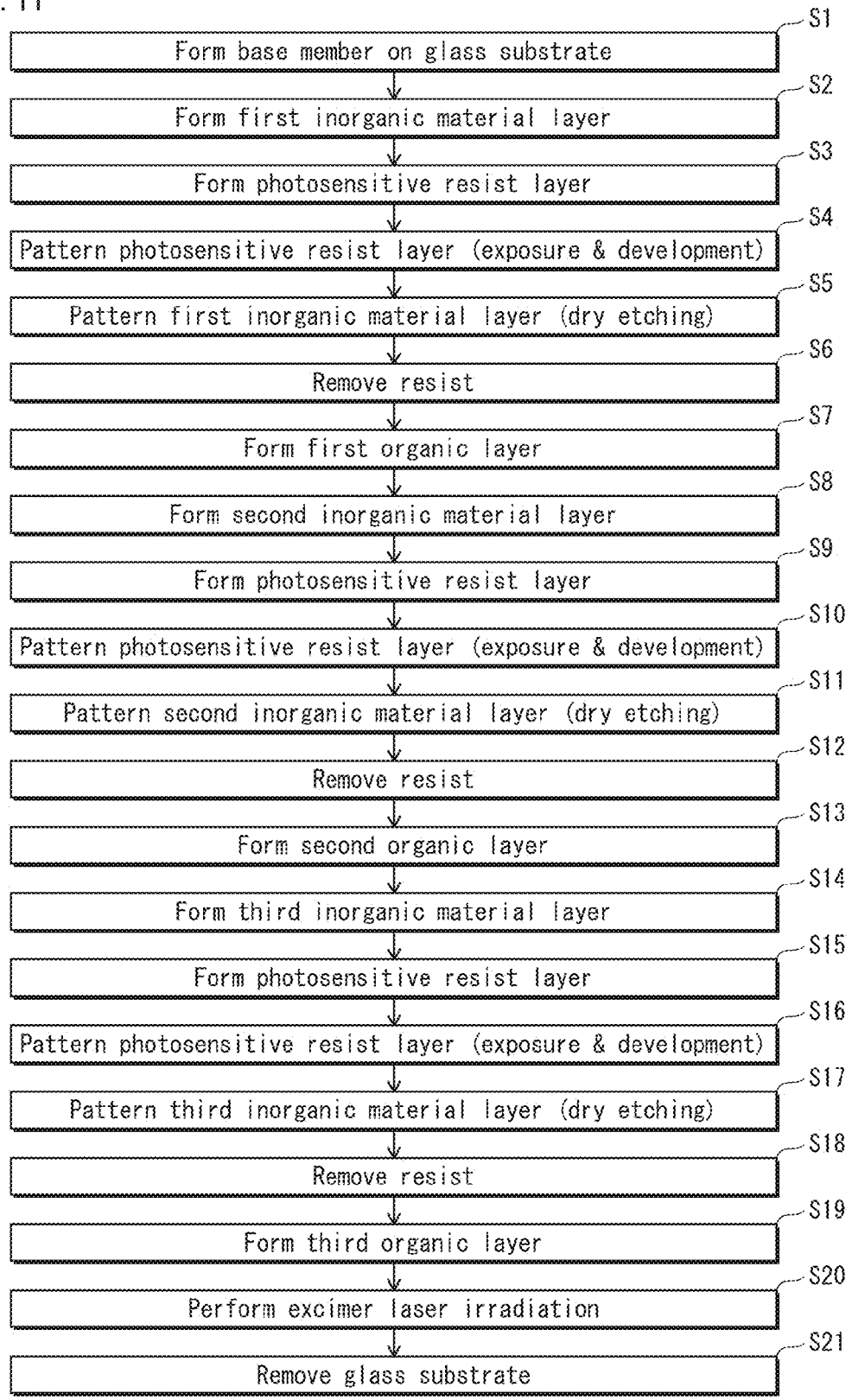
FIG. 11 is a schematic process diagram showing a manufacturing process of the multi-layered film relating to Embodiment 1.

FIG. 4A to FIG. 10C are each a partial cross-sectional view schematically showing a process in a manufacturing method of the multi-layered film 100 relating to Embodiment 1. FIG. 11 is a schematic process diagram showing a series of manufacturing process of the multi-layered film 100.

The following describes the manufacturing method of the multi-layered film 100 with reference to FIG. 4A to FIG. 11.

Figure 4A:
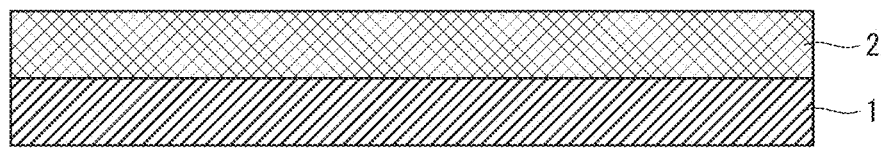
FIG. 4A is a partial cross-sectional view schematically showing part of a manufacturing process of the multi-layered film relating to Embodiment 1, specifically showing a state where a base member is formed on a glass substrate.

First, as shown in FIG. 4A, a base member 2 made of an organic material is formed on a glass substrate 1 (Step S1 in FIG. 11). Specifically, polyimide precursor is for example formed as a film by a die coater, and the film is baked at 400 degrees C. to chemically convert the polyimide precursor to polyimide. As a result, the base member 2 made of polyimide is obtained. Also, the glass substrate 1 is for example a 100 mm×100 mm glass substrate. The base member 2 has for example a film thickness of 25 μm.

Figure 4B:
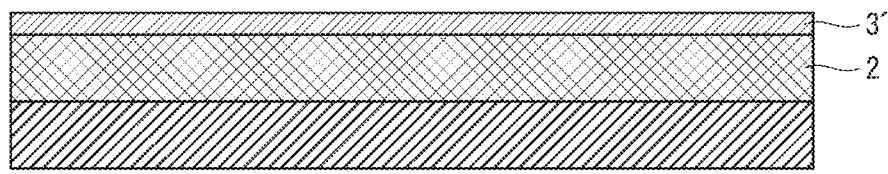
FIG. 4B is a partial cross-sectional view showing a state where a first inorganic material layer is formed on the base member.

Next, as shown in FIG. 4B, a first inorganic material layer 3' is formed on the base member 2 (Step S2 in FIG. 11). The first inorganic material layer 3' here is a silicon nitride film having a film thickness of 333 nm.

Figure 4C:
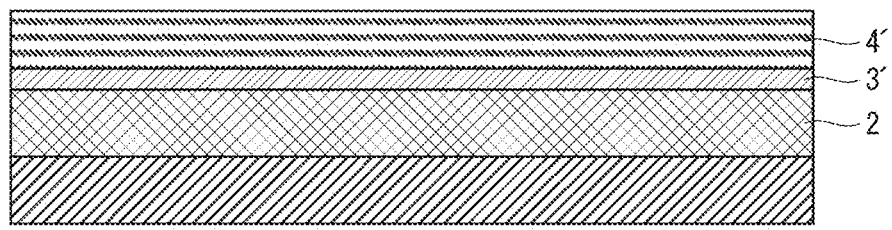
FIG. 4C is a partial cross-sectional view showing a state where a photosensitive resist layer is formed on the first inorganic material layer.

Then, as shown in FIG. 4C, a photosensitive resist layer 4' is formed on the first inorganic material layer 3' (Step S3 in FIG. 11). The photosensitive resist layer 4' here is formed for example by forming a film having a film thickness of 2 μm from a positive photosensitive novolac resist material, and then prebaking the film on a hot plate at 100 degrees C. for 60 seconds.

Figure 4D:
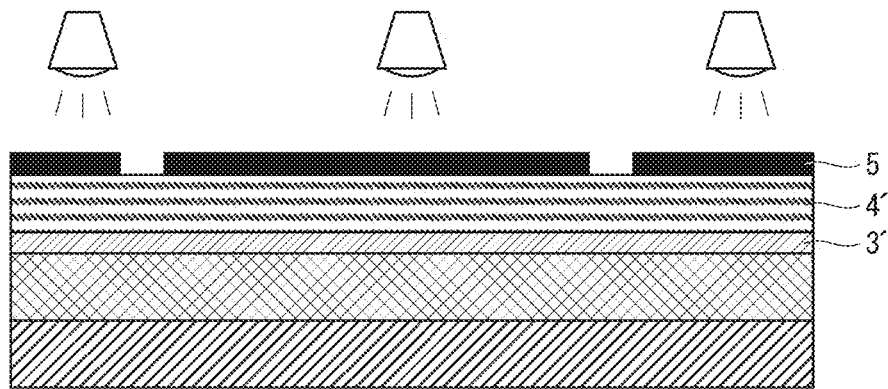
FIG. 4D is a partial cross-sectional view showing a state where the photosensitive resist layer is exposed.
Figure 5A:
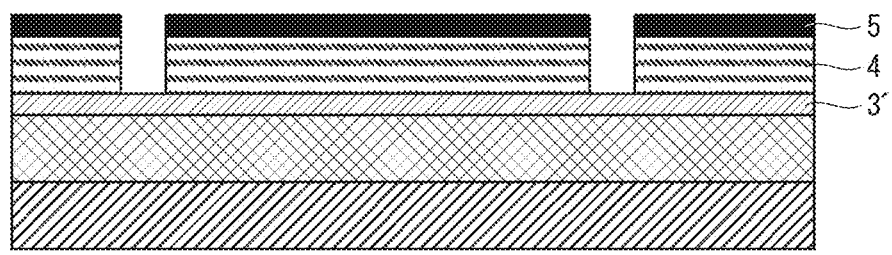
FIG. 5A is a partial cross-sectional view showing a state where the photosensitive resist layer is developed.

Next, as shown in FIG. 4D, the photosensitive resist layer 4' is patterned by exposure and development with use of a mask 5 having the repeating pattern shown in FIG. 1 (Step S4 in FIG. 11). Then, the photosensitive resist layer 4' is postbaked to form a resist 4. Exposure is performed for example by light having a wavelength of 355 nm at an exposure amount of 15 mJ. Development is performed for example by 2.3% aqueous solution of tetramethylammonium hydroxide. Also, postbaking is performed at 230 degrees C. for 180 seconds. FIG. 5A shows the state after patterning is performed.

Figure 5B:
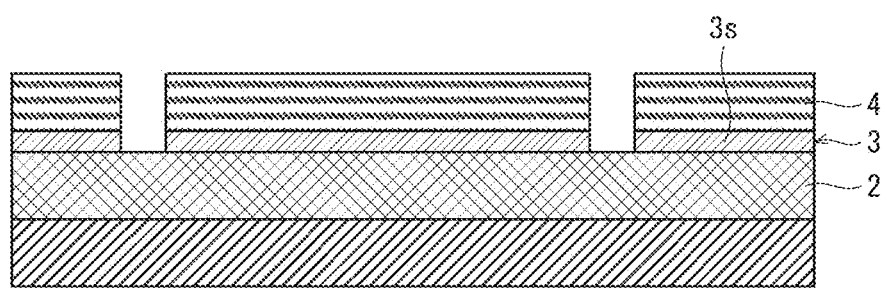
FIG. 5B is a partial cross-sectional view showing a state where a first inorganic material layer is patterned.

The mask 5 is removed. Then, as shown in FIG. 5B, a first inorganic section 3 is formed by patterning the first inorganic material layer 3' with the resist 4 to form a plurality of first inorganic members 3s (Step S5 in FIG. 11). Patterning is performed here for example by dry etching with use of tetra fluorocarbon gas for 240 seconds.

Figure 5C:
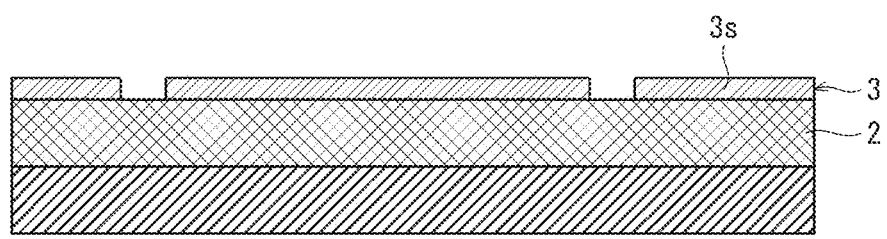
FIG. 5C is a partial cross-sectional view showing a state where a resist is removed.
Figure 5D:
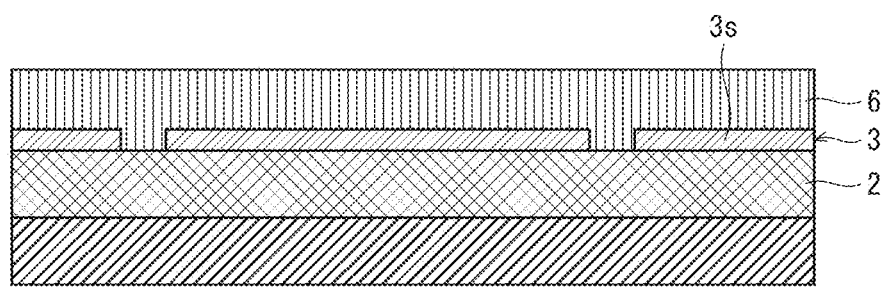
FIG. 5D is a partial cross-sectional view showing a state where a first organic layer is formed on a first inorganic section and the base member.

Next, as shown in FIG. 5C, the resist 4 is removed (Step S6 in FIG. 11). Then, as shown in FIG. 5D, a first organic layer 6 is formed (Step S7 in FIG. 11). The first organic layer 6 is formed here for example by forming an acrylic resin layer having a film thickness of 2 μm, and then baking the acrylic resin layer at 180 degrees C. for three hours.

Figure 6A:
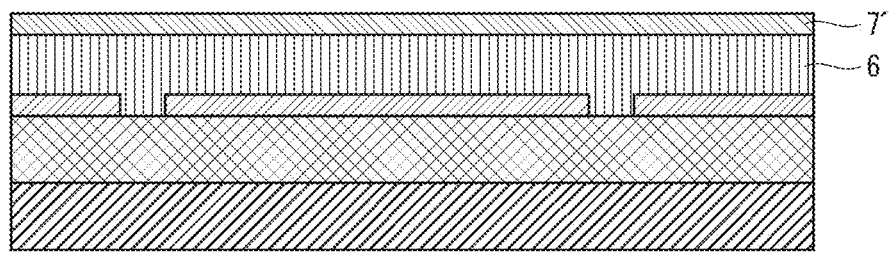
FIG. 6A is a partial cross-sectional view showing a state where a second inorganic material layer is formed on the first organic layer.

Next, as shown in FIG. 6A, a second inorganic material layer 7' is formed on the first organic layer 6 (Step S8 in FIG. 11). The second inorganic material layer 7' is formed here for example from a silicon nitride film having a film thickness of 333 nm by plasma CVD.

Figure 6B:
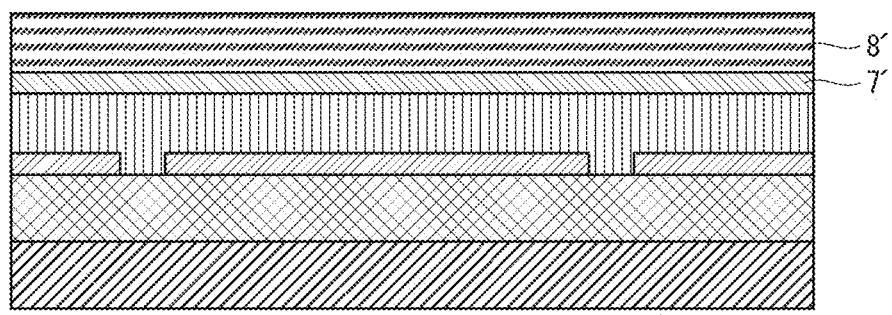
FIG. 6B is a partial cross-sectional view showing a state where a photosensitive resist layer is formed on the second inorganic material layer.

Next, as shown in FIG. 6B, a photosensitive resist layer 8' is formed on the second inorganic material layer 7' (Step S9 in FIG. 11). The photosensitive resist layer 8' is formed here for example by forming a film having a film thickness of 2 nm from a positive photosensitive novolac resist material.

Figure 6C:
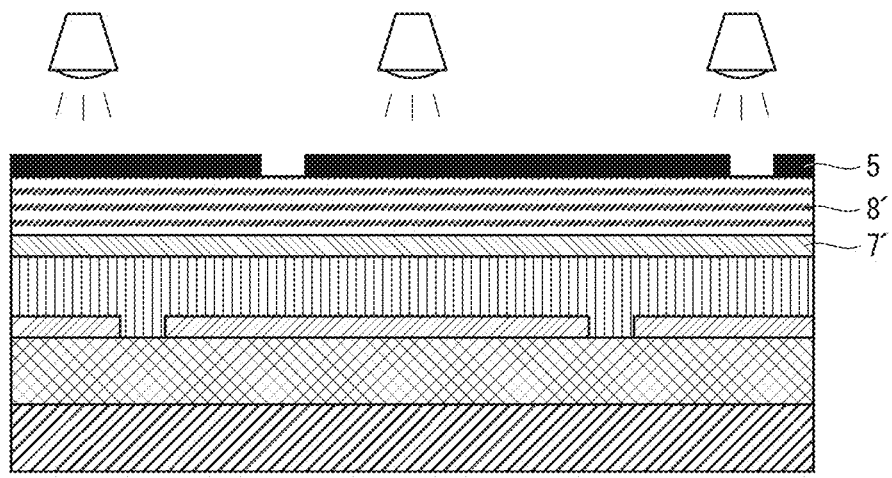
FIG. 6C is a partial cross-sectional view showing a state where the photosensitive resist layer is exposed.
Figure 7A:
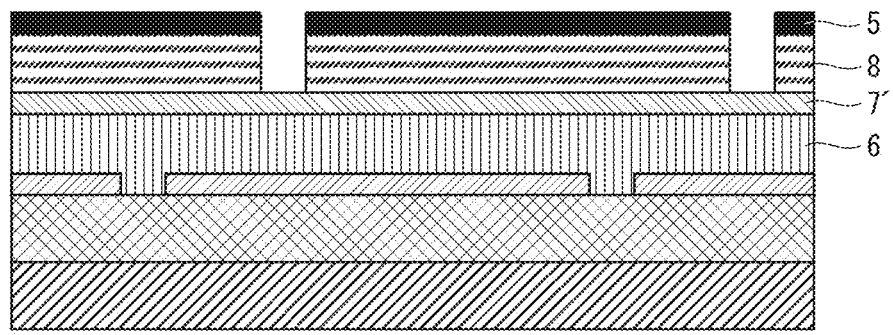
FIG. 7A is a partial cross-sectional view showing a state where the photosensitive resist layer is developed.

The photosensitive resist layer 8' is prebaked on a hot plate at 100 degrees C. for 60 seconds. Then, as shown in FIG. 6C, the photosensitive resist layer 8' is patterned by exposure and development with use of the mask 5 having the repeating pattern shown in FIG. 1 to form a resist 8 (Step S10 in FIG. 11). Exposure is performed for example by light having a wavelength of 355 nm at an exposure amount of 15 mJ. Development is performed for example by 2.3% aqueous solution of tetramethylammonium hydroxide. FIG. 7A shows the state after patterning is performed.

The mask 5 shown in FIG. 4D (Step S4 in FIG. 11) is also used here for performing exposure and development. The pattern of the mask 5 is shifted from that in FIG. 4D (Step S4 in FIG. 11). The pattern of the mask 5 is shifted for alignment shift for example here by 20 μm in the lower direction and 10 μm in the right direction in FIG. 2 from the pattern of the mask 5 shown in FIG. 4D (Step S4 in FIG. 11).

Figure 7B:
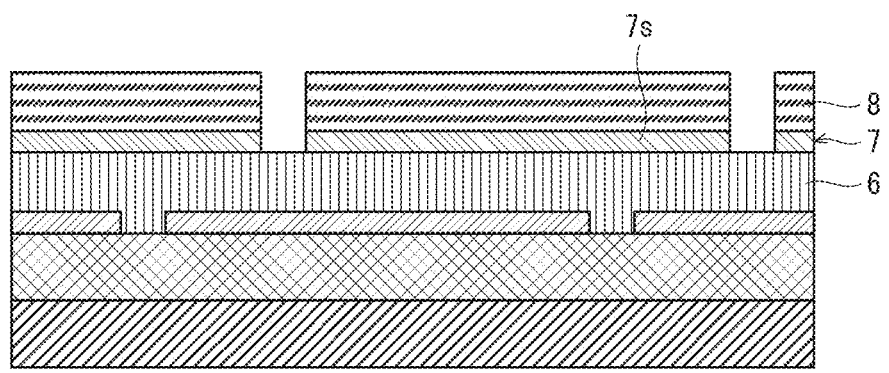
FIG. 7B is a partial cross-sectional view showing a state where the second inorganic material layer is patterned.

The mask 5 is removed. Then, as shown in FIG. 7B, a second inorganic section 7 is formed by patterning the second inorganic material layer 7' with the resist 8 to form a plurality of second inorganic members 7s (Step S11 in FIG. 11). Patterning is performed here for example by dry etching with use of tetra fluorocarbon gas for 240 seconds.

Figure 7C:
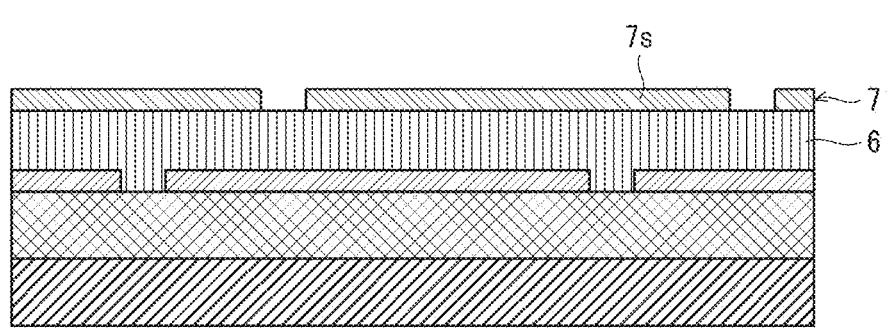
FIG. 7C is a partial cross-sectional view showing a state where a resist is removed.
Figure 7D:
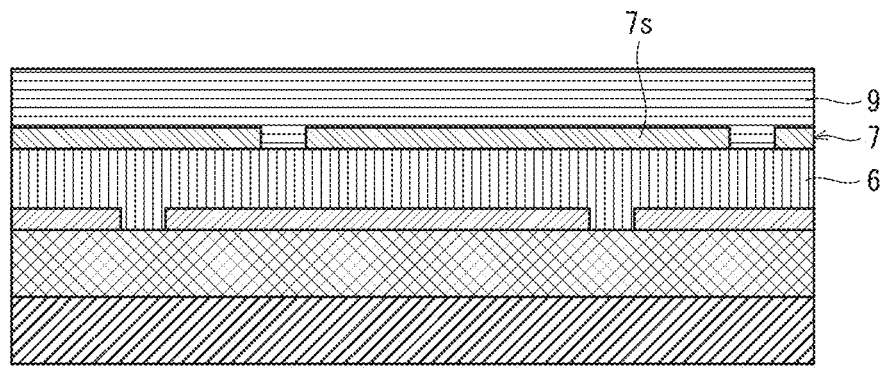
FIG. 7D is a partial cross-sectional view showing a state where a second organic layer is formed on a second inorganic section and the first organic layer.

Next, as shown in FIG. 7C, the resist 8 is removed (Step S12 in FIG. 11). Then, as shown in FIG. 7D, a second organic layer 9 is formed (Step S13 in FIG. 11). The second organic layer 9 is formed here for example by forming an acrylic resin layer having a film thickness of 2 μm, and then baking the acrylic resin layer at 180 degrees C. for three hours.

Figure 8A:
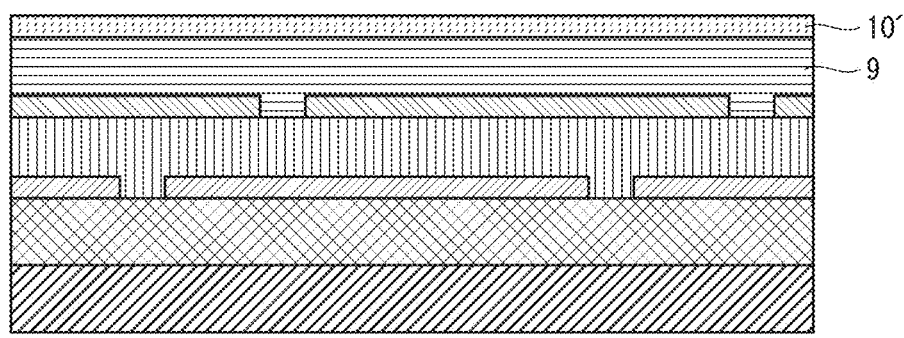
FIG. 8A is a partial cross-sectional view showing a state where a third inorganic material layer is formed on the second organic layer.

Next, as shown in FIG. 8A, a third inorganic material layer 10' is formed on the second organic layer 9 (Step S14 in FIG. 11). The third inorganic material layer 10' is formed here for example from a silicon nitride film having a film thickness of 334 nm by plasma CVD.

Figure 8B:
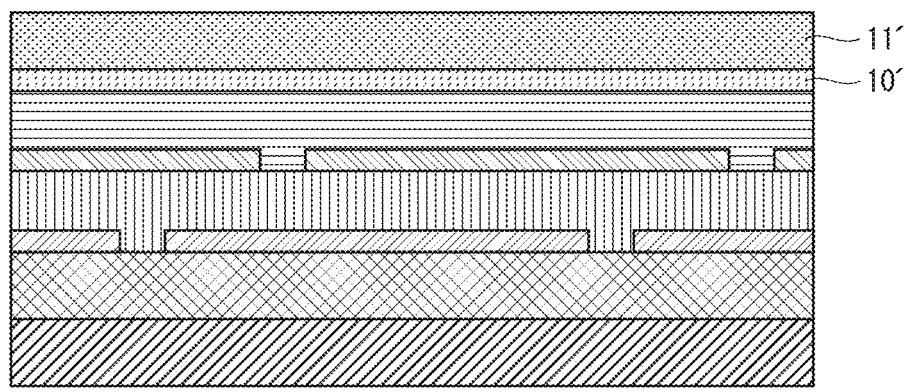
FIG. 8B is a partial cross-sectional view showing a state where a photosensitive resist layer is formed on the third inorganic material layer.

Next, as shown in FIG. 8B, a photosensitive resist layer 11' is formed on the third inorganic material layer 10' (Step S15 in FIG. 11). The photosensitive resist layer 11' is formed here for example by forming a film having a film thickness of 2 nm from a positive photosensitive novolac resist material, and then prebaking the film on a hot plate at 100 degrees C. for 60 seconds.

Figure 8C:
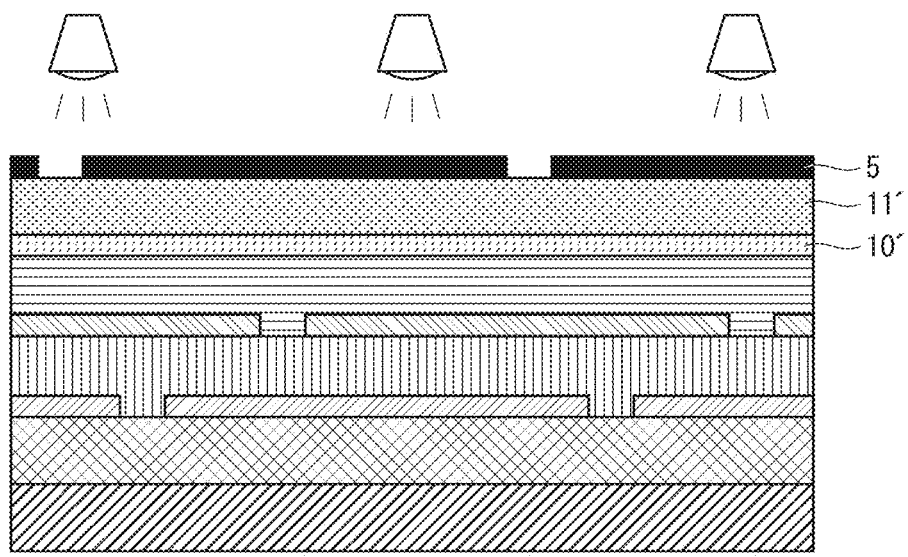
FIG. 8C is a partial cross-sectional view showing a state where the photosensitive resist layer is exposed.

Then, as shown in FIG. 8C, the photosensitive resist layer 11' is patterned by exposure and development with use of the mask 5 having the repeating pattern shown in FIG. 1 to form a resist 11 (Step S16 in FIG. 11). Exposure is performed for example by light having a wavelength of 355 nm at an exposure amount of 15 mJ. Development is performed for example by 2.3% aqueous solution of tetramethylammonium hydroxide, for example.

The mask 5 used in FIG. 4D (Step S4 in FIG. 11) and FIG. 6C (Step S10 in FIG. 11) is also used here for performing exposure and development. The pattern of the photosensitive resist layer 11' is shifted from those in FIG. 4D (Step S4 in FIG. 11) and FIG. 6C (Step S10 in FIG. 11). The pattern of the photosensitive resist layer 11' is shifted for alignment shift for example here by 10 μm in the upper direction and 5 μm in the left direction in FIG. 2 from the pattern of the mask 5 shown in FIG. 4D (Step S4 in FIG. 11).

Figure 9A:
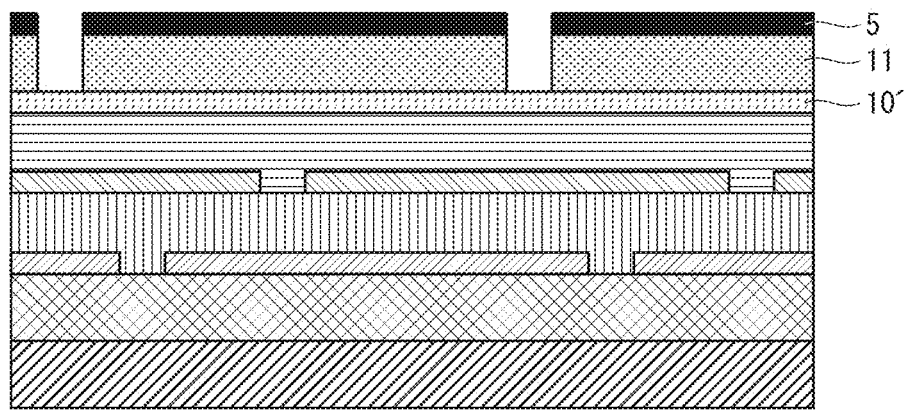
FIG. 9A is a partial cross-sectional view showing a state where the photosensitive resist layer is developed.
Figure 9B:
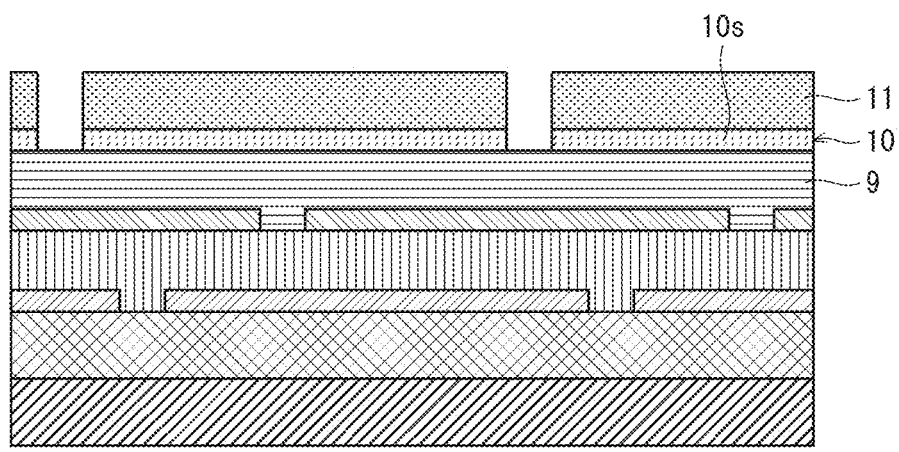
FIG. 9B is a partial cross-sectional view showing a state where the third inorganic material layer is patterned.

The mask 5 is removed. Then, as shown in FIG. 9B, a third inorganic section 10 is formed by patterning the third inorganic material layer 10' with the resist 11 to form a plurality of third inorganic members 10s (Step S17 in FIG. 11). Patterning is performed here for example by dry etching with use of tetra fluorocarbon gas for 240 seconds.

Figure 9C:
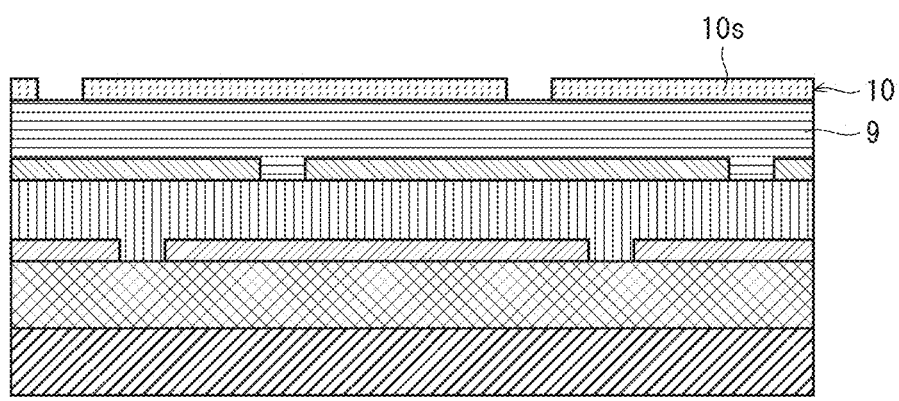
FIG. 9C is a partial cross-sectional view showing a state where a resist is removed.

Next, as shown in FIG. 9C, the resist 11 is removed (Step S18 in FIG. 11). Then, as shown in FIG. 10A, a third organic layer 12 is formed (Step S19 in FIG. 11). The third organic layer 12 is formed here for example by forming an acrylic resin layer having a film thickness of 2 μm, and then baking the acrylic resin layer at 180 degrees C. for three hours.

Then, as shown in FIG. 10B, the entire lower surface of the base member 2 is irradiated with excimer laser from a side of the glass substrate 1 (Step S20 in FIG. 11). This decreases an adhesive strength at an interface between the base member 2 and the glass substrate 1. As a result, the glass substrate 1 is removed (Step S21 in FIG. 11). Finally, a multi-layered film 100 relating to Embodiment 1 is obtained as shown in FIG. 10C.

Note that after the process of removing the resist 4 shown in FIG. 5C (Step S6 in FIG. 11) is complete, surface treatment may be performed on a surface of the first inorganic section 3 to increase an affinity with the first organic layer 6 prior to the process of forming the first organic layer 6 shown in FIG. 5D (Step S7 in FIG. 11). This surface treatment increases an adhesive strength between the first inorganic section 3 and the first organic layer 6, thereby preventing an interface between the first inorganic section 3 and the first organic layer 6 from serving as a route via which moisture easily infiltrates (route via which moisture moves faster).

Also, after the process of removing the resist 8 shown in FIG. 7C (Step S12 in FIG. 11) is performed, surface treatment may be performed on a surface of the second inorganic section 7 to increase an affinity with the second organic layer 9 prior to the process of forming the second organic layer 9 shown in FIG. 7D (Step S13 in FIG. 11). This surface treatment increases an adhesive strength between the second inorganic section 7 and the second organic layer 9, thereby preventing an interface between the second inorganic section 7 and the second organic layer 9 from serving as a route via which moisture easily infiltrates.

The surface treatment is for example plasma processing, light irradiation, or formation of a self-assembled monolayer such as hexamethyldisilazane (HMDS).

5. Summary of Embodiment 1

As described above, the multi-layered film 100 relating to the present embodiment has the configuration in which: the first inorganic members 3s are formed so as to be separated from each other in the layer direction, and the first organic member 6a is formed so as to be positioned in a space between each adjacent two of the first inorganic members 3s; the second inorganic members 7s are formed so as to be separated from each other in the layer direction, and the second organic member 9a is formed so as to be positioned in a space between each adjacent two of the second inorganic members 7s; and the third inorganic members 10s are formed so as to be separated from each other in the layer direction, and the third organic member 12a is formed so as to be positioned in a space between each adjacent two of the third inorganic members 10s. With this configuration, when the multi-layered film 100 is bent, a bending stress is absorbed by the first organic member 6a, the second organic member 9a, and the third organic member 12a, thereby preventing occurrence of split and crack in the first inorganic section 3, the second inorganic section 7, and the third inorganic section 10, respectively. Therefore, it is possible to block moisture from infiltrating from outside to reach the device layer 90 by the shortest route through split and crack.

Also, the multi-layered film 100 has the configuration in which when moisture infiltrates from outside through the base member 2, the moisture needs to detour around at least one of the first inorganic member 3s, the second inorganic member 7s, and the third inorganic members 10s. This also lengthens an infiltration route of the moisture. Furthermore, since split and crack are less likely to occur in the first inorganic members 3s, the second inorganic members 7s, and the third inorganic members 10s as described above, it is possible to block moisture from shortcutting through split and crack to reach the device layer 90. As a result, it takes a longer time for moisture which infiltrates from outside to reach the device layer 90. This prevents the device layer 90 from suffering a harmful influence of moisture which infiltrates from outside for a long time.

According to the configuration of the multi-layered film 100 relating to the present embodiment as described above, it is possible to realize a multi-layered film having both excellent bending tolerance and gas barrier properties.

Embodiment 2

Although the multi-layered film 100 relating to Embodiment 1, which is one aspect of the present invention, has been described above, the exemplified multi-layered film 100 may be modified as described below. The present invention is of course not limited to the multi-layered film 100 described in the above Embodiment 1.

The following describes a multi-layered film relating to Embodiment 2 that is another aspect of the present invention.

In order to avoid duplicate description, configuration elements in Embodiment 2 that are the same as those in Embodiment 1 have the same numerical references, and description thereof is omitted. The same applies to Embodiment 3 and Modifications that are described later.

1. Overall Configuration of Multi-Layered Film 200

Figure 12:
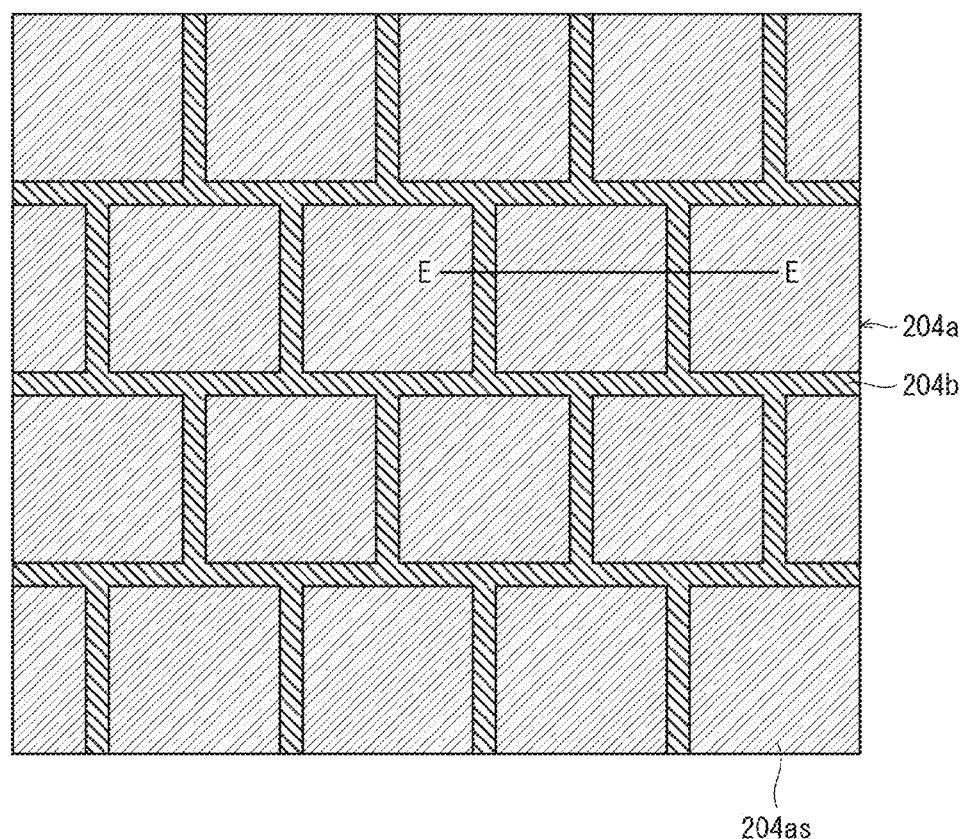
FIG. 12 is a plan view schematically showing an aspect of inorganic sections included in a multi-layered film relating to Embodiment 2.

FIG. 12 is a plan view schematically showing a configuration of a multi-layered film 200 relating to Embodiment 2.

Figure 13:
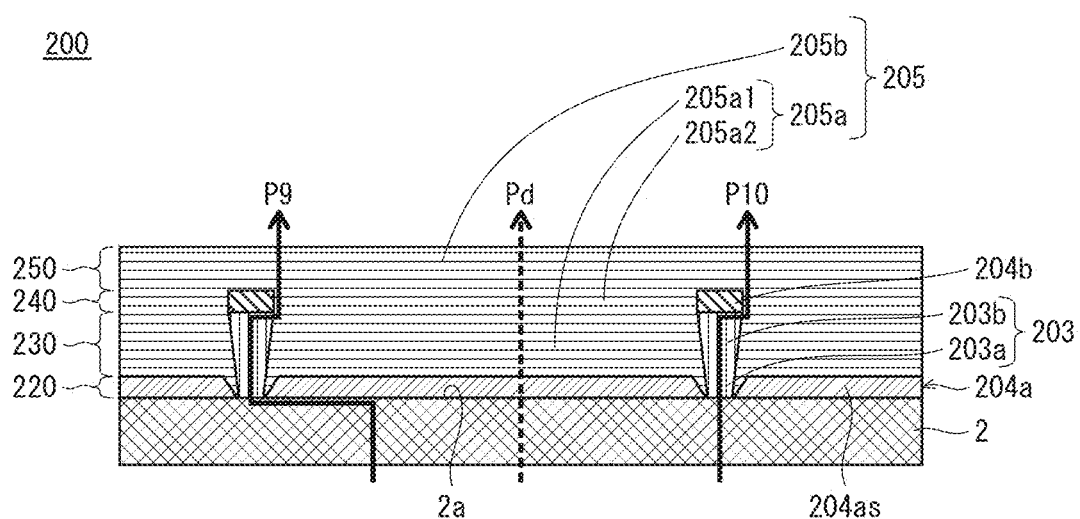
FIG. 13 is a cross-sectional view schematically showing a configuration of the multi-layered film relating to Embodiment 2 taken along a straight line E-E in FIG. 12.

FIG. 13 is a cross-sectional view of the multi-layered film 200 taken along a straight line E-E in FIG. 12. In FIG. 12, illustration of a second organic layer 205 is omitted.

As shown in FIG. 12 and FIG. 13, the multi-layered film 200 has a configuration in which a first inorganic section 204a is formed on a base member 2, and the first inorganic section 204a is constituted from a plurality of plate-like first inorganic members 204as that are arranged in the pattern shown in FIG. 1. A first organic member 203 is formed so as to be positioned in a space (mesh shaped in plan view) between each adjacent two of the first inorganic members 204as. A second inorganic section 204b is formed on the first organic member 203. The first organic member 203 and the second inorganic section 204b are each formed as a continuous layer that has a mesh shape in plan view.

As shown in FIG. 13, the first organic member 203 has an inverse tapered (inverse trapezoid) cross section in the laminating direction. A second organic member portion 205a1 is formed in each of hole regions of the mesh shape constituting the first organic member 203. A second organic member portion (organic material) 205a2 is formed in each of hole regions of the mesh shape constituting the second inorganic section 204b. The second organic member portions 205a1 and 205a2 are integrally made of the same material to constitute a second organic member 205a. A continuous organic layer portion 205b that is continuous in the layer direction is formed so as to cover the second inorganic section 204b and the second organic member portions 205a2. The second organic member 205a and the continuous organic layer portion 205b are integrally made of the same material to constitute a second organic layer 205.

The configuration of the multi-layered film 200 is also expressed as follows. The first inorganic section 204a and first organic member portions 203a constitute a first layer 220. The first organic member portions 203a are each positioned between each adjacent two of the first inorganic members 204as and are each a bottom portion in contact with the base member 2. More precisely, the first layer 220 includes part of a material of the second organic member 205a that enters a minute space between each adjacent inorganic member 204as and first organic member portion 203a. However, this part of the second organic member 205a is extremely minute and is made of an organic material, and accordingly this part is considered to be included in the first organic member portion 203a.

First organic member portions 203b, which are included in the first organic member 203 and are positioned on or above the first organic member portion 203a included in the first organic member 203 (that is, an upper portion of the first organic member 203), and the second organic member portions 205a1 constitute an interlayer 230. The second inorganic section 204b and the second organic member portions 205a2 constitute a second layer 240. The continuous organic layer portion 205b constitutes an upper layer 250. When expressed as above, the multi-layered film 200 has a configuration in which the first layer 220, the interlayer 230, the second layer 240, and the upper layer 250 are laminated on the base member 2 in respective orders.

Also, in the first organic member 203, each of the first organic member portions 203a, which is the bottom portion, is shorter than each of the first organic member portions 203b, which is the upper portion, in terms of length in a direction parallel to a main surface 2a of the base member 2.

2. Flexibility and Bending Tolerance of Multi-Layered Film 200

The multi-layered film 200 has the configuration, as well as the multi-layered film 100 relating to Embodiment 1, in which the first layer 220 is constituted from the plate-like first inorganic members 204as which are arranged so as to be separated from each other, and the first organic member portion 203a is formed in a space between each adjacent two of the first inorganic members 204as. With this configuration, like in the first layer 20 included in the multi-layered film 100 relating to Embodiment 1, a bending stress which is transferred inside the first layer 220 in the layer direction is absorbed by the first organic member portions 203a, thereby preventing occurrence of split and crack in the first inorganic section 204a.

In the second layer 240 included in the multi-layered film 200, the second inorganic section 204b is constituted not from a plurality of plate-like inorganic members formed in the shape of islands, but from a layer that has a mesh shape in plan view and is continuous in the layer direction. Furthermore, the second organic member portion 205a2 is formed in each of the hole regions of the mesh shape constituting the second inorganic section 204b. Accordingly, when the multi-layered film 200 is bent, the second layer 240 is deformable compared with the case where a continuous and uniform inorganic layer is used. Also, a bending stress is absorbed by the second organic member portion 205a2, which is formed in each of the hole regions of the mesh shape constituting the second inorganic section 204b. This reduces a bending stress which is transferred in the layer direction inside the first inorganic section 204a. As a result, it is possible to prevent occurrence of split and crack in the second inorganic section 204b due to concentration of a stress in a less durable part of the second inorganic section 204b.

Also, the interlayer 230 is formed between the first layer 220 and the second layer 240. The first organic member portions 203b and the second organic member portions 205a1, which constitute the interlayer 230, are both made of an organic material, and accordingly a bending stress is also absorbed by the interlayer 230. This suppresses transfer of a stress in the laminating direction (the direction of the layer thickness), thereby further preventing occurrence of split and crack in the first inorganic section 204a and the second inorganic section 204b.

3. Moisture Permeability of Multi-Layered Film 200

In FIG. 13, arrows P9 to P10 each represent an infiltration route of moisture from outside, and a dashed arrow Pd represents the shortest infiltration route of moisture on the assumption that nothing blocks moisture infiltration.

As indicated by the arrow P9 in FIG. 13, moisture that infiltrates from outside through the base member 2 is blocked from moving upward by the first inorganic member 204as having a low moisture permeability. The moisture moves in the layer direction (the lateral direction in FIG. 13) along a lower surface of the first inorganic member 204as to detour around the first inorganic member 204as. Then, the moisture reaches the first organic member portion 203a, which is formed in a space between adjacent first inorganic members 204as.

Since the first organic member portion 203a has a higher moisture permeability than the first inorganic members 204as, the moisture infiltrates further above through the first organic member portion 203a to reach the second inorganic section 204b. The moisture is blocked from moving upward by the second inorganic section 204b having a low moisture permeability. The moisture moves in the layer direction (the lateral direction in FIG. 13) along a lower surface of the second inorganic section 204b to detour around the second inorganic section 204b. Then, the moisture reaches the second organic member portion 205a2, which is formed in the hole region of the mesh shape constituting the second inorganic section 204b.

Since the second organic member portion 205a2 has a higher moisture permeability than the second inorganic section 204b, the moisture infiltrates into the continuous organic layer portion 205b through the second organic member portion 205a2. Finally, the moisture reaches a device layer that is formed on or above the continuous organic layer portion 205b.

In the case where moisture infiltrates from outside through the base member 2 via the infiltration route P10 shown in FIG. 13, the moisture infiltrates into the first organic member portion 203b through the first organic member portion 203a, without being blocked from moving upward by the first inorganic member 204as. Then, the moisture reaches the second inorganic section 204b. The moisture is blocked from moving upward by the second inorganic section 204b, and moves in the layer direction (the lateral direction in FIG. 13) along a lower surface of the second inorganic section 204b to detour around the second inorganic section 204b. Then, the moisture reaches the second organic member portion 205a2.

Since the second organic member portion 205a2 has a higher moisture permeability than the second inorganic section 204b, the moisture infiltrates further above through the second organic member portion 205a2 to infiltrate into the continuous organic layer portion 205b. Finally, the moisture reaches the device layer, which is formed on or above the continuous organic layer portion 205b.

In this way, each time moisture, which infiltrates from outside through the base member 2, is blocked from moving upward by the inorganic section (the first inorganic section 204a and the second inorganic section 204b), the moisture needs to detour around the inorganic section. As a result, this infiltration route of the moisture is longer than the shortest infiltration route Pd. Therefore, even with the configuration of the multi-layered film 200 relating to Embodiment 2, it is possible to prevent the device layer from suffering a harmful influence of moisture which infiltrates from outside for a long time.

4. Manufacturing Method of Multi-Layered Film 200

FIG. 14A to FIG. 15D are each a partial cross-sectional view schematically showing a process in a manufacturing method of the multi-layered film 200 relating to Embodiment 2. FIG. 16 is a schematic process diagram showing a series of manufacturing processes of the multi-layered film 200.

The following describes the manufacturing method of the multi-layered film 200 with reference to FIG. 14A to FIG. 16.

Firstly, a base member 2 is formed on a glass substrate 1. This process shown in FIG. 14A and Step S31 in FIG. 16 is the same as FIG. 4A and Step S1 in FIG. 11, and accordingly detailed description thereof is omitted here.

Figure 14A:
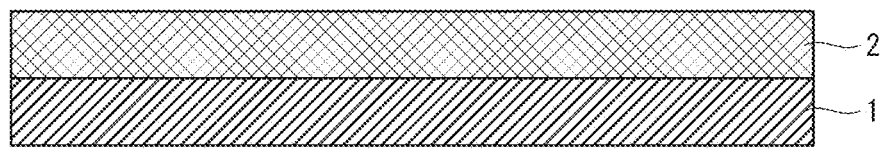
FIG. 14A is a partial cross-sectional view schematically showing part of a manufacturing process of the multi-layered film relating to Embodiment 2, specifically showing a state where a base member is formed on a glass substrate.
Figure 14B:
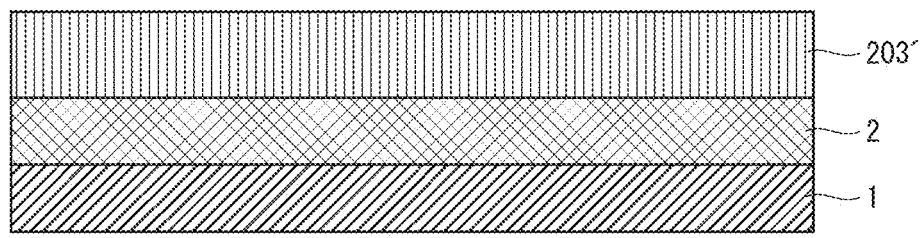
FIG. 14B is a partial cross-sectional view showing a state where a photosensitive organic material layer is formed on the base member.
Figure 15A:
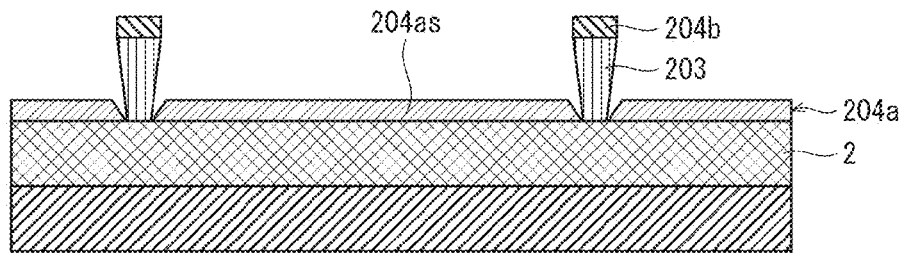
FIG. 15A is a partial cross-sectional view showing a state where a first inorganic section and a second inorganic section are formed on the base member and an organic member, respectively.

Next, as shown in FIG. 14B, a photosensitive organic material layer 203' is formed on the base member 2 (Step S32 in FIG. 16). The photosensitive organic material layer 203' here is formed for example by forming an organic layer having a film thickness of 3 μm from a negative acrylic photosensitive organic material, and then prebaking the organic film on a hot plate at 100 degrees C. for 60 seconds.

Figure 14C:
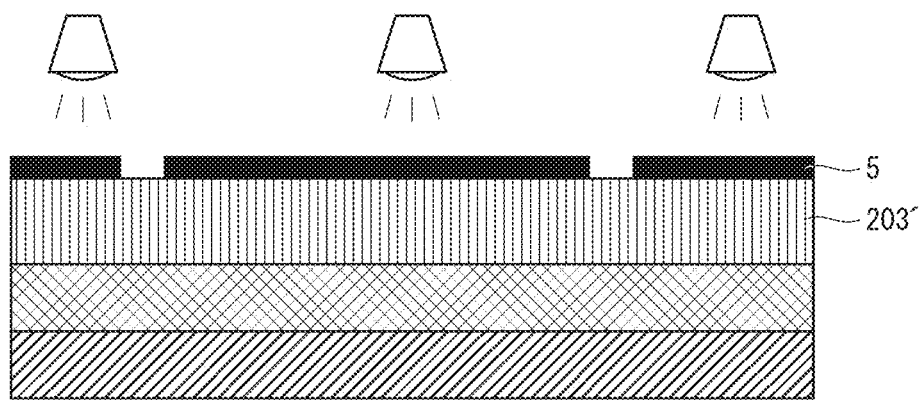
FIG. 14C is a partial cross-sectional view showing a state where the photosensitive organic material layer is exposed.
Figure 14D:
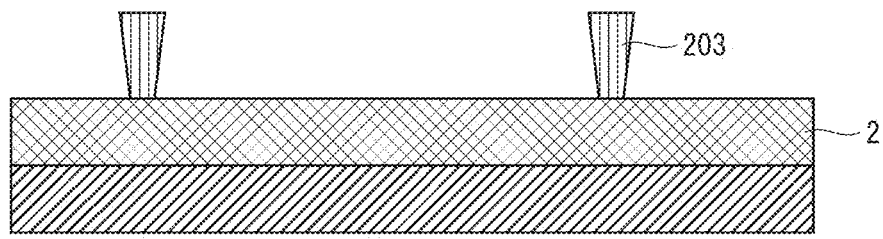
FIG. 14D is a partial cross-sectional view showing a state where the photosensitive organic material layer is developed.

Next, as shown in FIG. 14C, the photosensitive organic material layer 203' is patterned by exposure and development with use of the mask 5 having the repeating pattern shown in FIG. 1 to form a first organic member 203 as shown in FIG. 14D (Step S33 in FIG. 16). Exposure is performed for example by light having a wavelength of 355 nm at an exposure amount of 30 mJ. Development is performed for example by PGMEA (Propylene Glycol Methyl Ether Acetate) for 180 seconds. After development is performed, the first organic member 203 is postbaked at 180 degree C. for three hours.

Next, an inorganic layer is formed on the base member 2 and the first organic member 203. The inorganic layer is made of a silicon nitride film having a film thickness of 500 nm by plasma CVD. Here, the first organic member 203 has an inverse tapered (inverse trapezoid) cross section as shown in FIG. 14D. Accordingly, the inorganic layer has so-called disconnection at an edge portion of the first organic member 203. As a result, not a single continuous layer but two separate types of inorganic members, namely, a first inorganic member 204a and a second inorganic section 204b are formed. As shown in FIG. 15A, the second inorganic section 204b is formed on the first organic member 203. The first inorganic section 204a is formed so as to be positioned in each of parts of the base member 2 where the first organic member 203 does not exist (each of hole regions of the mesh shape constituting the first inorganic member 203). In this way, the first inorganic section 204a and the second inorganic section 204b are formed in a self-aligned manner at the same time as complementary inorganic member layers (Step S34 in FIG. 16).

Figure 15B:
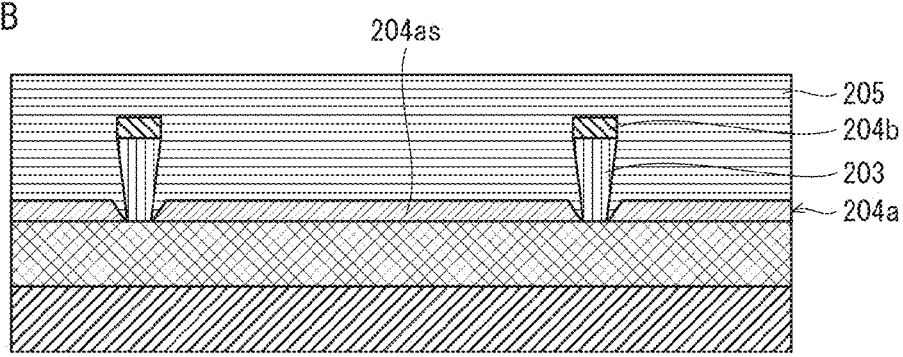
FIG. 15B is a partial cross-sectional view showing a state where an organic layer is formed on the first inorganic section and the second inorganic section.
Figure 16:
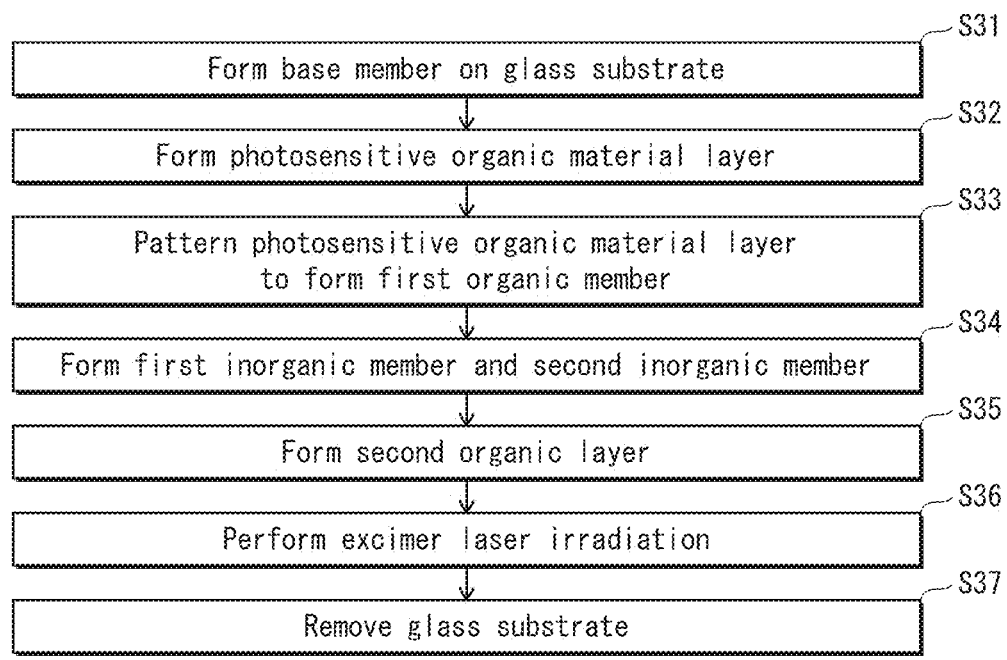
FIG. 16 is a schematic process diagram showing a manufacturing process of the multi-layered film relating to Embodiment 2.

Then, as shown in FIG. 15B, a second organic layer 205 is formed on the first inorganic section 204a and the second inorganic section 204b (Step S35 in FIG. 16). The second organic layer 205 is formed here for example by forming an acrylic resin layer having a film thickness of 2 μm, and then baking the acrylic resin layer at 180 degrees C. for three hours.

Figure 15C:
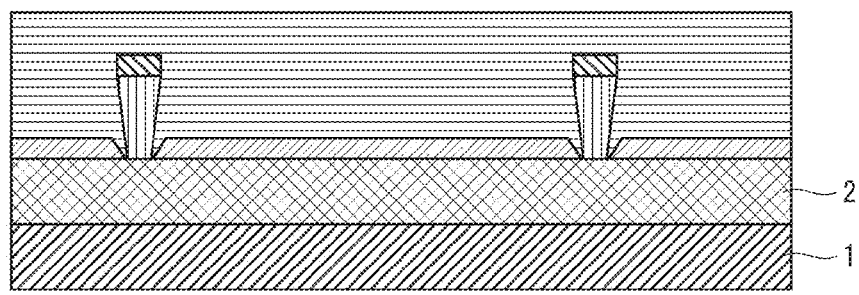
FIG. 15C is a partial cross-sectional view showing a state where excimer laser irradiation is performed from a side of the glass substrate.
Figure 15D:
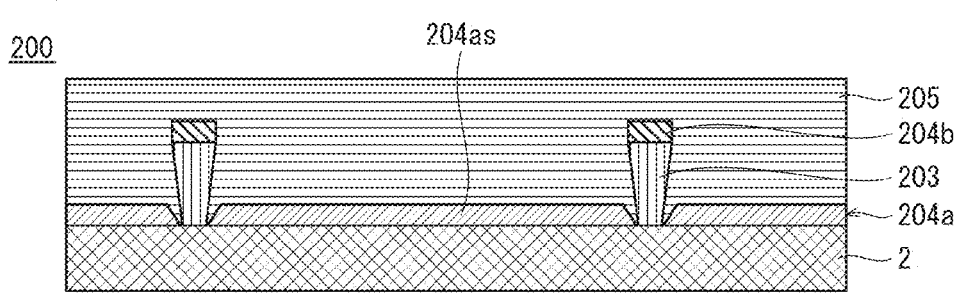
FIG. 15D is a partial cross-sectional view showing the complete multi-layered film relating to Embodiment 2 after the glass substrate is removed.

Then, as shown in FIG. 15C, the entire lower surface of the base member 2 is irradiated with excimer laser from a side of the glass substrate 1 (Step S36 in FIG. 16). This decreases an adhesive strength at an interface between the base member 2 and the glass substrate 1. As a result, the glass substrate 1 is removed (Step S37 in FIG. 16). Finally, a multi-layered film 200 relating to Embodiment 2 is obtained as shown in FIG. 15D.

Note that after the process of forming the first inorganic section 204a and the second inorganic section 204b (Step S34 in FIG. 16) is performed, surface treatment may be performed on respective surfaces of the first inorganic section 204a and the second inorganic section 204b to increase an affinity with the second organic layer 205 prior to the process of forming the second organic layer 205 shown in FIG. 15B (Step S35 in FIG. 16). This surface treatment increases an adhesive strength between the second organic layer 205 and each of the first inorganic section 204a and the second inorganic section 204b, thereby preventing an interface between the second organic layer 205 and each of the first inorganic section 204a and the second inorganic section 204b from serving as a route via which moisture easily infiltrates.

The surface treatment is for example plasma processing, light irradiation, or formation of a self-assembled monolayer such as HMDS.

Also, in order to form the first organic member 203 so as to have an inverse tapered cross section as shown in FIG. 14D, a negative photosensitive organic material should be used because of being subject to formation of an inverse tapered cross section.

5. Summary of Embodiment 2

According to the configuration of the multi-layered film 200 relating to Embodiment 2, the first inorganic section 204a and the second inorganic section 204b are complementarily formed, and accordingly two layers of the inorganic sections cover the entire surface that is to be protected. This blocks moisture infiltration by the shortest route, thereby exhibiting excellent gas barrier properties.

Also, the first inorganic section 204a and the second inorganic section 204b are simultaneously formed in the same process, and accordingly the number of processes are reduced.

The multi-layered film 200 relating to Embodiment 2 has the configuration, as well as the multi-layered film 100 relating to Embodiment 1, in which the first inorganic section 204a and the second inorganic section 204b are each intermittently formed in the layer direction. The first organic member portion 203a is formed so as to be positioned in a space between each adjacent two of the first inorganic members 204as constituting the first inorganic section 204a. The second organic member portion 205a2 is formed in each of the hole regions of the mesh shape constituting the second inorganic section 204b. With this configuration, a bending stress is absorbed by the first organic member portions 203a and the second organic member portions 205a2. This prevents occurrence of split and crack in the first inorganic section 204a and the second inorganic section 204b, thereby exhibiting excellent flexibility and bending tolerance.

<Verification of Gas Barrier Properties and Bending Tolerance>

With the configurations of the multi-layered films 100 and 200 relating to Embodiments 1 and 2, respectively, as described above, it is possible to exhibit both excellent gas barrier properties and bending properties (flexibility and bending tolerance).

The inventor made verification tests on the gas barrier properties and bending tolerance of the multi-layered films 100 and 200.

The verification tests were made for the multi-layered film 100, the multi-layered film 200, and a comparative example. The following shows specific specifications and manufacturing methods of the multi-layered film 100, the multi-layered film 200, and the comparative example which were used for the verification tests.

<Manufacturing Method of Specimens>

(Multi-Layered Film 100)

Polyimide precursor was formed on a 100 mm×100 mm glass substrate 1 so as to be a film having a film thickness of 25 μm by a die coater. Then, the film was baked at 400 degrees C. to chemically convert the polyimide precursor to polyimide. As a result, a base member 2 was obtained.

A silicon nitride film having a film thickness of 333 nm was formed, as a first inorganic material layer 3', on the base member 2. A photosensitive resist layer 4' having a film thickness of 2 μm was made of a positive photosensitive novolac resist material on the first inorganic material layer 3'. The photosensitive resist layer 4' was prebaked on a hot plate at 100 degrees C. for 60 seconds. Then, the photosensitive resist layer 4' was exposed with use of a mask having the repeating pattern shown in FIG. 1 by light having a wavelength of 355 nm at an exposure amount of 15 mJ.

Each side of the square in the pattern shown in FIG. 1 has a length of 40 μm, and a space between each adjacent squares has a width of 2 μm.

After exposure was performed, the photosensitive resist layer 4' was developed by 2.3% aqueous solution of tetramethylammonium hydroxide. As a result, a resist 4 was obtained. The resist 4 was postbaked at 230 degrees C. for 180 seconds. The first inorganic material layer 3' was patterned with the resist 4, by dry etching with use of tetra fluorocarbon gas for 240 seconds. As a result, a first inorganic section 3 was obtained. After the resist 4 was removed, an acrylic resin layer having a film thickness of 2 μm was formed, and the acrylic resin layer was baked at 180 degrees C. for three hours. As a result, a first organic layer 6 was obtained.

A silicon nitride film having a film thickness of 333 nm was formed, as a second inorganic material layer 7', on the first organic layer 6 by plasma CVD. A resist film having a film thickness of 2 μm was formed, as a photosensitive resist layer 8', from a positive photosensitive novolac resist material on the second inorganic material layer 7'. The photosensitive resist layer 8' was prebaked on a hot plate at 100 degrees C. for 60 seconds. Then, the photosensitive resist layer 8' was exposed with use of a mask having the repeating pattern shown in FIG. 1 by light having a wavelength of 355 nm at an exposure amount of 15 mJ. As shown in FIG. 2, the photosensitive resist layer 8' was overlaid on the first inorganic section 3 with the pattern of the photosensitive resist layer 8' shifted by 20 μm in the lower direction and 10 μm in the right direction from the pattern of the first inorganic section 3. Then, the photosensitive resist layer 8' was developed by 2.3% aqueous solution of tetramethylammonium hydroxide. As a result, a resist 8 was obtained.

The second inorganic material layer 7', which is a silicon nitride film, was patterned with the resist 8, by dry etching with use of tetra fluorocarbon gas for 240 seconds. The resist 8 was removed, and then an acrylic resin layer having a film thickness of 2 μm was formed, and the acrylic resin layer was baked at 180 degrees C. for three hours. As a result, a second organic layer 9 was obtained.

A silicon nitride film having a film thickness of 334 nm was formed, as a third inorganic material layer 10', on the second organic layer 9 by plasma CVD. A film having a film thickness of 2 μm was formed, as a photosensitive resist layer 11', from a positive photosensitive novolac resist material on the third inorganic material layer 10'. The photosensitive resist layer 11' was prebaked on a hot plate at 100 degrees C. for 60 seconds. Then, the photosensitive resist layer 11' was exposed with use of a mask having the repeating pattern shown in FIG. 1 by light having a wavelength of 355 nm at an exposure amount of 15 mJ. As shown in FIG. 2, the photosensitive resist layer 11' was overlaid on the first inorganic section 3 with the pattern of the photosensitive resist layer 11' shifted by 10 μm in the upper direction and 5 μm in the left direction from the pattern of the first inorganic section 3. After exposure was performed, the photosensitive resist layer 11' was developed by 2.3% aqueous solution of tetramethylammonium hydroxide. As a result, a resist 11 was obtained.

The third inorganic material layer 10', which is a silicon nitride film, was patterned with the resist 11, by dry etching with use of tetra fluorocarbon gas for 240 seconds. As a result, a third inorganic section 10 was obtained. The resist 11 was removed, and then an acrylic resin layer having a film thickness of 2 μm was formed as a third organic layer 12, and the acrylic resin layer was baked at 180 degrees C. for three hours. As a result, a third organic layer 12 was obtained.

Finally, the entire lower surface of the base member 2 was irradiated with excimer laser from a side of the glass substrate 1, in order to decrease an adhesive strength at an interface between the base member 2 and the glass substrate 1. The glass substrate 1 was removed and a multi-layered film 100 was complete.

(Multi-Layered Film 200)

Polyimide precursor was formed on a glass substrate 1 so as to be a film having a film thickness of 25 μm by a die coater. Then, the film was baked at 400 degrees C. to chemically convert the polyimide precursor to polyimide. As a result, a base member 2 was obtained.

A layer having a film thickness of 3 μm was formed, as a photosensitive organic material layer 203', on the base member 2 from a negative acrylic photosensitive organic material. The photosensitive resist layer 203' was prebaked on a hot plate at 100 degrees C. for 60 seconds. Then, the photosensitive resist layer 203' was exposed by light having a wavelength of 355 nm at an exposure amount of 30 mJ. Then, the photosensitive resist layer 203' was developed by PGMEA for 180 seconds. As a result, a first organic member 203 was obtained. Then, the first organic member 203 was postbaked at 180 degree C. for three hours.

A cross section of the first organic member 203 was observed by cross-sectional SEM. It was demonstrated that the cross section of the first organic member 203 has an inverse tapered shape with a taper angle of approximately 115 degrees.

Next, a silicon nitride film having a film thickness of 500 nm was formed on the first organic member 203 by plasma CVD.

After film formation was complete, the respective cross sections of the first organic member 203 and the silicon nitride film were observed by cross-sectional SEM. It was demonstrated that the silicon nitride film was disconnected at an edge portion of the first organic member 203, which has an inverse tapered cross section, and as a result a first inorganic section 204a and a second inorganic section 204b, which are two complementary inorganic layers, were formed in a self-aligned manner.

An acrylic resin layer having a film thickness of 2 μm was formed on the first inorganic section 204a and the second inorganic section 204b, and then the acrylic resin layer was baked at 180 degrees C. for three hours. As a result, a second organic layer 205 was obtained.

Finally, the entire lower surface of the base member 2 was irradiated with excimer laser from a side of the glass substrate 1, in order to decrease an adhesive strength at an interface between the base member 2 and the glass substrate 1. The glass substrate 1 was removed and a multi-layered film 200 was complete.

Comparative Example

Polyimide precursor was formed on a 100 mm×100 mm glass substrate 1 so as to be a film having a film thickness of 25 μm by a die coater. Then, the film was baked at 400 degrees C. to chemically convert the polyimide precursor to polyimide. As a result, a base member 2 was obtained. A silicon nitride film (barrier layer) having a film thickness of 1000 nm was formed on the entire lower surface of the base member 2. Next, the entire lower surface of the base member 2 was irradiated with excimer laser from a side of a glass substrate 1, in order to decrease an adhesive strength at an interface between the base member 2 and the glass substrate 1. The glass substrate 1 was removed and a film of comparative example was complete.

<Verification Tests>

Verification tests were made by performing the following procedures 1-5 in respective orders on the multi-layered film 100, the multi-layered film 200, and the comparative example, which have been formed by the above manufacturing method of specimens.

Procedure 1: Observe a film by a polarizing microscope to check whether crack has occurred in a film.

Procedure 2: Measure moisture permeability of the film by the Mocon method. Measurement conditions are temperature of 40 degrees C. and humidity of 90%.

Procedure 3: Bend the film 100 times at R=5 mm

Procedure 4: Observe the film by the polarizing microscope after bent 100 times.

Procedure 5: Measure moisture permeability of the film by the Mocon method after bent 100 times. Measurement conditions are temperature of 40 degrees C. and humidity of 90%.

Results of the verification tests are shown in TABLE 1.

TABLE 1

|  | Total thickness of SiN films | Initial warpage | Initial barrier cracks | Initial moisture permeability g/m²day | Barrier cracks after bending | Moisture permeability after bending g/m²day |
|---|---|---|---|---|---|---|
| Comparative example | 1000 nm | 50 mm | Many | $1 \times 10^{-2}$ | Many | $5 \times 10^{-2}$ |
| Multi-layered film 100 | 1000 nm | No | No | $5 \times 10^{-4}$ | No | $5 \times 10^{-4}$ |
| Multi-layered film 200 | 500 nm | No | No | $1 \times 10^{-3}$ | No | $1 \times 10^{-3}$ |

A polyimide film with an inorganic layer functioning as a barrier layer, which was manufactured as comparative example, has a configuration in which a SiN film as a barrier layer is continuous in the layer direction. Accordingly, the comparative example is difficult to relax a stress. A warpage of a curvature radius of approximately 50 mm was observed in the initial status. Furthermore, many cracks in the SiN film (barrier layer) were observed. The comparative example had a moisture permeability of $1 \times 10^{-2}$ g/m² day in the initial status, and exhibited low gas barrier properties due to barrier cracks. Also, the comparative example after bent 100 times at R=5 mm exhibited a deteriorated moisture permeability of $5 \times 10^{-2}$ g/m² day due to further cracks in the barrier layer.

The barrier cracks mean here cracks occurred in an inorganic layer functioning as a barrier layer. The multi-layered film 100 includes, as an inorganic layer functioning as a barrier layer, the first inorganic section 3, the second inorganic section 7, and the third inorganic section 10. The multi-layered film 200 includes, as an inorganic layer functioning as a barrier layer, the first inorganic section 204a and the second inorganic section 204b. The barrier layer of the comparative example functions as a barrier layer, as its name suggests.

The multi-layered film 100 has a configuration in which SiN films (the first inorganic section 3, the second inorganic section 7, and the third inorganic section 10) are each formed in the shape of islands, and a bending stress is relaxed by an organic material that fills a space between each adjacent two of inorganic members constituting the shape of islands. Accordingly, the multi-layered film 100 had no warpage in the initial status. Furthermore, the multi-layered film 100 had no barrier crack in the initial status. The multi-layered film 100 had a moisture permeability of $5 \times 10^{-4}$ g/m² day in the initial status, and exhibited high gas barrier properties. Also, even after the multi-layered film 100 was bent 100 times at R=5 mm, no deterioration in gas barrier properties was observed. This demonstrated that the multi-layered film 100 has both excellent bending tolerance and gas barrier properties.

The multi-layered film 200 has a configuration in which SiN films (the first inorganic section 204a and the second inorganic section 204b) are formed in a self-aligned manner due to an organic layer having an inverse tapered cross section so as to be in the shape of islands and in a mesh shape. A bending stress is relaxed by an organic material that fills a space between each adjacent two of inorganic members constituting the shape of islands and hole regions of the mesh shape. Accordingly, the multi-layered film 200 had no warpage in the initial status. Furthermore, the multi-layered film 200 had no barrier crack in the initial status. The multi-layered film 200 had a moisture permeability of $1 \times 10^{-3}$ g/m² day in the initial status, and exhibited high gas barrier properties. Also, even after the multi-layered film 200 was bent 100 times at R=5 mm, no deterioration in gas barrier properties was observed. This demonstrated that the multi-layered film 200, which was manufactured with a simpler process, has both excellent bending tolerance and gas barrier properties.

The results of the verification tests as described above demonstrated that the multi-layered films 100 and 200 relating to Embodiments 1 and 2, respectively, exhibit both excellent bending tolerance and gas barrier properties.

Embodiment 3

An embodiment as one aspect of the present invention is not limited to a multi-layered film. For example, it is possible to realize the present invention as an electronic device including either of the multi-layered films relating to the above embodiments. The present embodiment describes the case where an electronic device includes the multi-layered film 100 relating to Embodiment 1.

Figure 17:
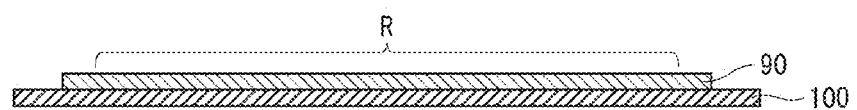
FIG. 17 is a cross-sectional view schematically showing a configuration of an electronic device relating to Embodiment 3.

FIG. 17 is a cross-sectional view schematically showing a configuration of an electronic device 1000 relating to Embodiment 3. As shown in FIG. 17, the electronic device 1000 includes a device layer 90 that is formed on the multi-layered film 100. The device layer 90 includes elements for electronic device. In the present embodiment, the device layer 90 has a configuration in which a plurality of organic EL elements that are formed in an array shape. Also, the device layer 90 has a display region R that is a region other than a periphery thereof.

Figure 18:
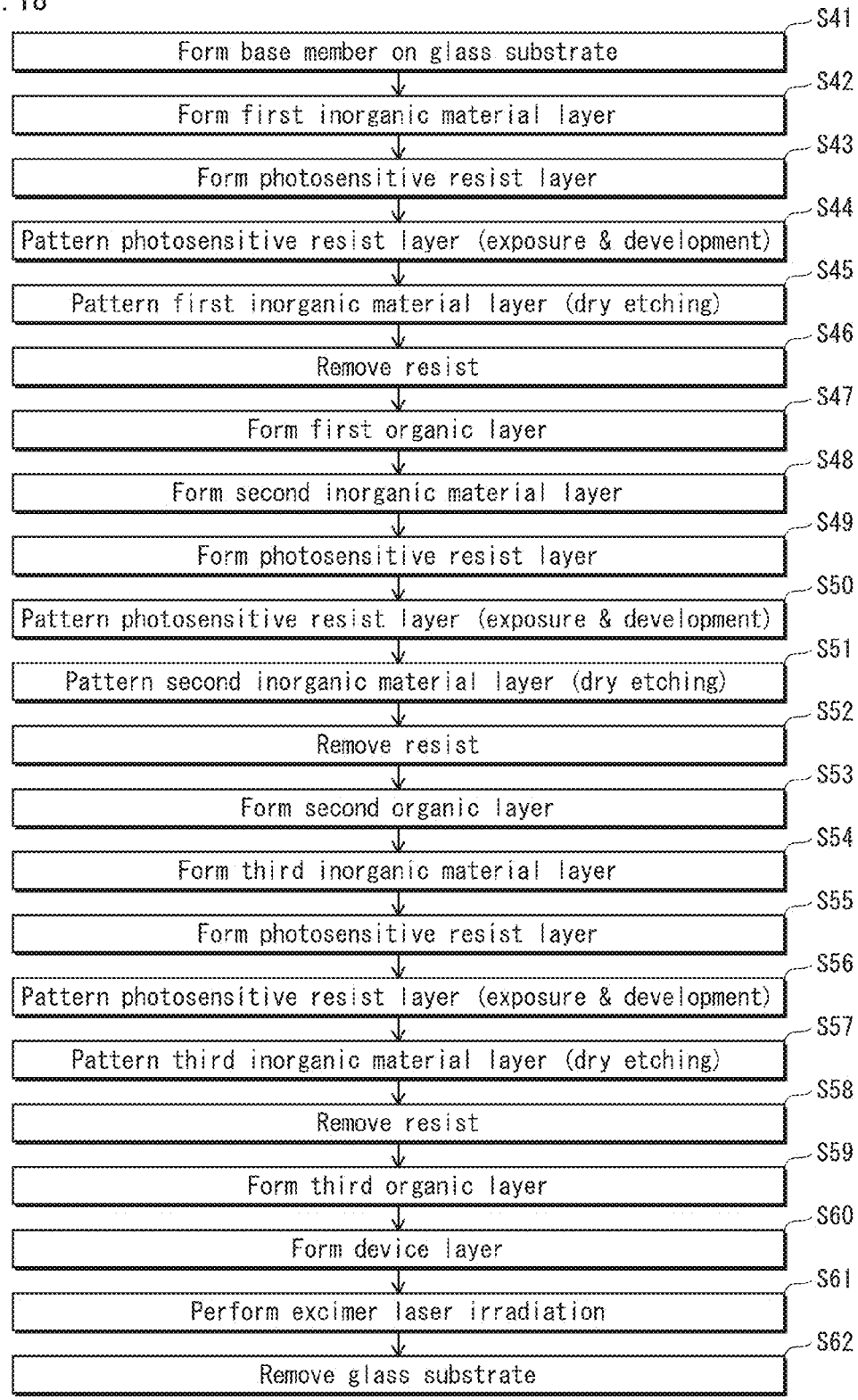
FIG. 18 is a schematic process diagram showing a manufacturing process of an electronic device relating to Embodiment 3.

FIG. 18 is a schematic process diagram showing a manufacturing process of the electronic device 1000. Steps S41 to S59 are the same as Steps S1 to S19 shown in FIG. 11, and accordingly description thereof is omitted here. After formation of a third organic layer 12 in Step S59, a device layer 90 is formed on the third organic layer 12 (Step S60). In the present embodiment, the device layer 90 includes a plurality of organic EL elements formed in an array shape as described above, and is formed by a known manufacturing method.

After formation of the device layer 90 in Step S60, subsequent Steps S61 and S62 are the same as Steps S20 and S21 shown in FIG. 11, and accordingly description thereof is omitted here.

In the multi-layered film 100 used in the electronic device 1000, the first inorganic section 3 and/or the second inorganic section 7 occupies 90% or more of an area of the display region R in plan view. This further surely blocks moisture which infiltrates from outside through the base member 2 from further infiltrating above. Note that in order to improve the gas barrier properties, the inorganic layers should preferably have a high area rate.

Also, after the third organic layer 12 is formed, a planarization layer may be formed prior to formation of the device layer 90. In other words, a planarization layer may be formed between the third organic layer 12 and the device layer 90. In this case, the planarization layer should preferably have a surface roughness of 100 nm or less. This secures planarization properties that are generally necessary to form the device layer 90 on the multi-layered film 100, thereby further improving usability for use in electronic devices. Note that the third organic layer 12 may be used as a planarization layer. Also in this case, the third organic layer 12 should preferably have a surface roughness of 100 nm or less.

<Modifications>

Although the present invention has been described based on Embodiments 1 to 3, the present invention is of course not limited to these embodiments, and the following modifications may be performed.

(Modification 1)

Figure 19:
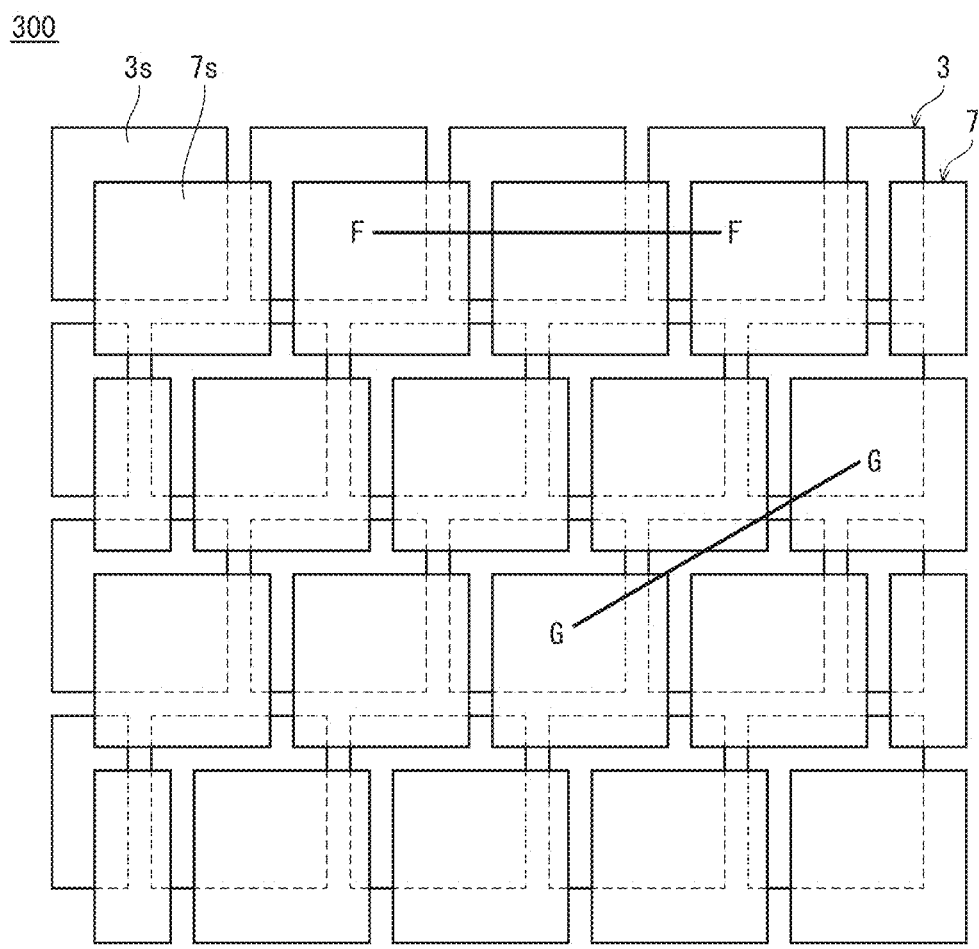
FIG. 19 is a plan view schematically showing an aspect in which patterns of inorganic members included in a multi-layered film relating to Modification 1 are overlaid each other.
Figure 20A:
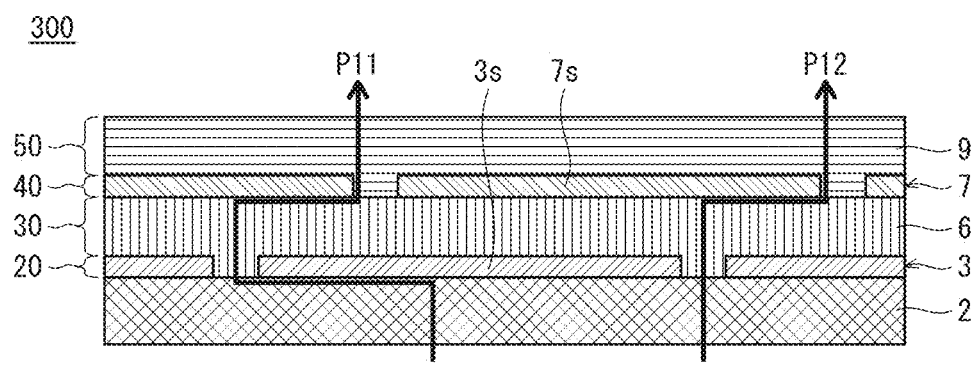
FIG. 20A is a partial cross-sectional view schematically showing a configuration of the multi-layered film relating to Modification 1 taken along a straight line F-F in FIG. 19.
Figure 20B:
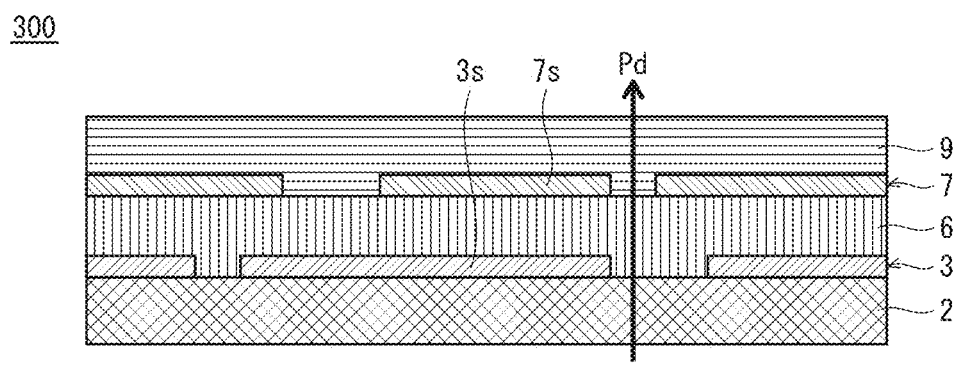
FIG. 20B is a cross-sectional view taken along a straight line G-G in FIG. 19.

FIG. 19 is a plan view schematically showing a configuration of a multi-layered film 300 relating to Modification 1. FIG. 20A is a cross-sectional view of the multi-layered film 300 taken along a straight line F-F in FIG. 19. FIG. 20B is a cross-sectional view of the multi-layered film 300 taken along a straight line G-G in FIG. 19. As shown in FIG. 19, FIG. 20A, and FIG. 20B, the multi-layered film 300 relating to Modification 1 has the same configuration as the multi-layered film 100 relating to Embodiment 1 except the third inorganic section 10 and the third organic layer 12. In FIG. 20A and FIG. 20B, arrows each represent an infiltration route of moisture from outside. As shown in FIG. 20A, in the F-F cross section, moisture, which infiltrates from outside, is blocked from moving upward by a first inorganic member 3s and/or a second inorganic member 7s, and accordingly needs to make a detour. This lengthens the infiltration route, thereby exhibiting excellent gas barrier properties. Compared with this, in the G-G cross section, there exists a part that is covered with neither a first inorganic member 3s nor a second inorganic member 7s. In this way, the same two patterns, which are each not a continuous film, are overlaid each other such that alignment is shifted. With this configuration, the entire area cannot be covered with the two layers. As a result, moisture can infiltrate through a part that is covered with no inorganic section via the shortest route indicated by an arrow Pd as shown in FIG. 20B. However, it is possible to reduce an area that is covered with neither the first inorganic section 3 nor the second inorganic section 7, compared with the case where the first inorganic section 3 and the second inorganic section 7 have the same shape and are aligned. Therefore, the multi-layered film 300 relating to Modification 1 exhibits a certain extent of gas barrier properties.

(Modification 2)

Figure 21A:
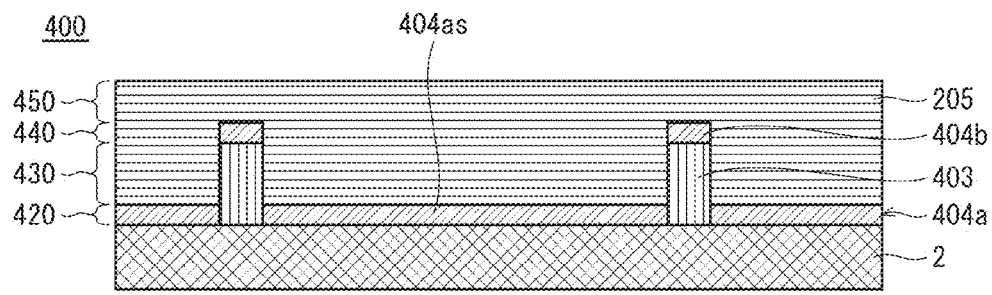
FIG. 21A is a partial cross-sectional view schematically showing a configuration of a multi-layered film relating to Modification 2.

FIG. 21A is a cross-sectional view schematically showing a configuration of a multi-layered film 400 relating to Modification 2. The multi-layered film 400 basically has the same configuration as the multi-layered film 200 relating to Embodiment 2, excepting that a first organic member 403 of the multi-layered film 400 has a cross-sectional shape in the laminating direction that is not an inverse tapered shape but is substantially a rectangular shape. Also, a first inorganic section 404a is constituted from a plurality of plate-like first inorganic members 404 as that are arranged so as to be separated from each other in the layer direction.

The multi-layered film 400 has a configuration in which the first inorganic section 404a and the second inorganic section 404b are complementarily formed, and therefore also exhibits excellent gas barrier properties, as well as the multi-layered film 200. Also, inorganic members and organic members are alternately arranged in the layer direction in a first layer 420 and a second layer 440, as well as the multi-layered film 200. With this configuration, since a bending stress is relaxed by the organic members, split and crack are less likely to occur in the inorganic members, thereby achieving excellent flexibility and bending tolerance.

(Modification 3)

Figure 21B:
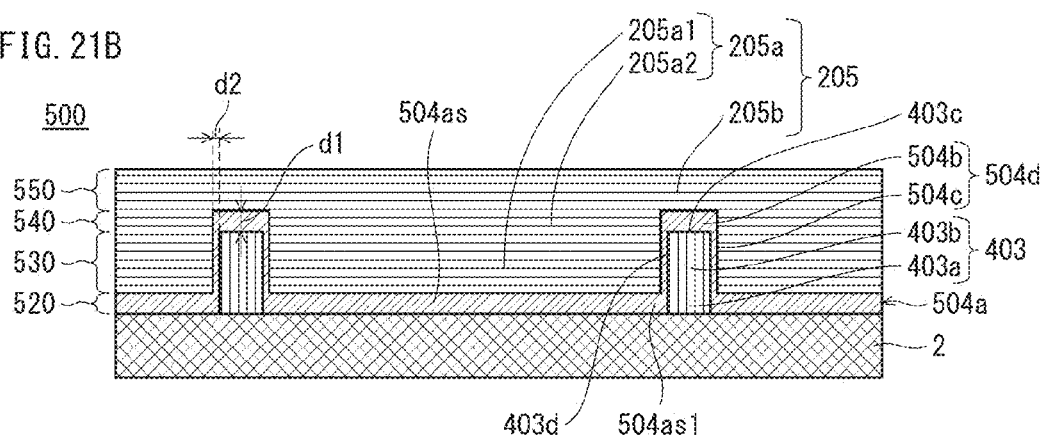
FIG. 21B is a partial cross-sectional view schematically showing a configuration of a multi-layered film relating to Modification 3.

FIG. 21B is a partial cross-sectional view schematically showing a configuration of a multi-layered film 500 relating to Modification 3. The multi-layered film 500 basically has the same configuration as the multi-layered film 400 relating to Modification 2, excepting that a second inorganic member 504d of the multi-layered film 500 has lateral surface portions 504c. A first inorganic section 504a is constituted from a plurality of plate-like first inorganic members 504as that are arranged so as to be separated from each other in the layer direction. Also, the lateral surface portions 504c are each formed so as to extend downward from an edge end of a corresponding one of upper surface portions 504b of the second inorganic member 504d that covers a corresponding portion of an upper surface 403c of a first organic member 403, while covering a corresponding one of lateral surfaces 403d of the first organic member 403, and is continuous with an end edge portion 504as1 of a corresponding one of first inorganic members 504as. The upper surface portions 504b correspond to the second inorganic section 404b of the multi-layered film 500 relating to Modification 2. The upper surface portions 504b and the lateral surface portions 504c constitute the second inorganic member 504d.

In this configuration, an interlayer 530 is constituted from first organic member portions 403b, second organic member portions 205a1, and the lateral surface portions 504c. The interlayer 530 has a configuration in which the lateral surface portions 504c are each positioned between the first organic member portion 403b and the second organic member portion 205a1 in the layer direction. In other words, the interlayer 530 has a configuration in which inorganic members and organic members are alternately arranged in the layer direction. This means that a first layer 520, the interlayer 530, and a second layer 540 each have a configuration in which inorganic members and organic members are alternately arranged in the layer direction. Therefore, the first layer 520, the interlayer 530, and the second layer 540 each exhibit excellent flexibility and bending tolerance for the reasons described above.

Also, according to the multi-layered film 500 relating to the present modification, the first inorganic members 504as of the first inorganic section 504a are each continuous with a corresponding one of the upper surface portions 504b of the second inorganic member 504d via a corresponding one of the lateral surface portions 504c. Accordingly, when the first layer 520, the interlayer 530, and the second layer 540 are regarded as a single layer, a continuous and seamless layer made of an inorganic member is formed in the single layer. Therefore, when moisture infiltrates from outside through the base member 2, the moisture is blocked from moving upward by the continuous and seamless layer which is made of an inorganic member. This exhibits further excellent gas properties.

Note that the lateral surface portions 504c each should preferably have a thickness d2 that is not so large in a direction parallel to a main surface of the base member 2 for the following reasons. If the thickness d2 is large, a bending stress which is transferred inside the layer made of an inorganic member exceeds an absorbing ability of the organic member for absorbing the bending stress. The bending stress concentrates in a less durable part of the lateral surface portions 504c, and this results in easy occurrence of split and crack. The lateral surface portions 504c each should preferably have the thickness d2 that is less than a thickness d1 of each of the upper surface portions 504b and the first inorganic members 504as in a direction perpendicular to the main surface of the base member 2. In the following modifications, a thickness of a lateral surface portion indicates a thickness in a direction parallel to a main surface of a base member, and a thickness of each of an upper surface portion and a first inorganic member indicates a thickness in a direction perpendicular to the main surface of the base member. Also, the upper surface portion and the first inorganic member are simultaneously formed, and accordingly are considered to have substantially the same thickness.

(Modification 4)

Figure 21C:
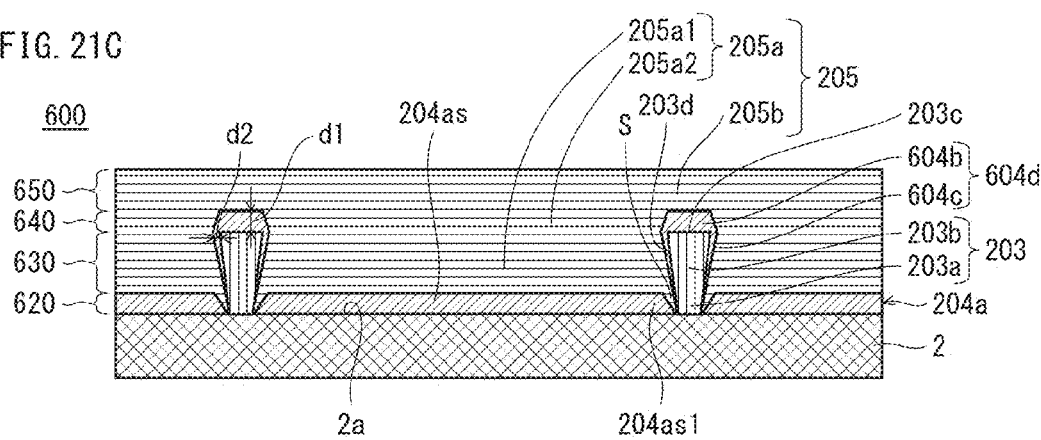
FIG. 21C is a partial cross-sectional view schematically showing a configuration of a multi-layered film relating to Modification 4.

FIG. 21C is a partial cross-sectional view schematically showing a configuration of a multi-layered film 600 relating to Modification 4. The multi-layered film 600 basically has the same configuration as the multi-layered film 200 relating to Embodiment 2, excepting that a second inorganic member 604d of the multi-layered film 600 has lateral surface portions 604c. The lateral surface portions 604c are each formed so as to extend downward from an edge end of a corresponding one of upper surface portions 604b of the second inorganic member 604d that covers an upper surface 203c of a first organic member 203, while covering a corresponding one of lateral surfaces 203d of the first organic member 203, and reach an end edge portion 204as1 of a corresponding one of first inorganic members 204as. The upper surface portions 604b correspond to the second inorganic section 204b of the multi-layered film 200 relating to Embodiment 2. The lateral surface portions 604c are each discontinuous with a corresponding one of the portions of the first inorganic member 204as with a seam S that is a minute space therebetween.

Also, the multi-layered film 600 basically has the same configuration as the multi-layered film 500 relating to Modification 3, excepting that the first organic member 203 has an inverse tapered cross section and the lateral surface portion 604c is discontinuous with the corresponding portion of the first inorganic member 204as.

Note that the seam S may not exist in the entire region between an extending end of the lateral surface portion 604c and the first inorganic member 204as. In other words, the extending end of the lateral surface portion 604c may partially be in contact with or continuous with the first inorganic member 204as.

Note that the word "reach" in the present modification does not necessarily mean that the lateral surface portion 604c is in contact with the first inorganic member 204as. This word "reach" here both expresses a state in which the lateral surface portion 604c is continuous with the first inorganic member 204as and a state in which the lateral surface portion 604c is in proximity to the first inorganic member 204as with a minute space (seam S) therebetween.

Also, since the seam S is an extremely minute space, a state in which the lateral surface portion 604c is in extreme proximity to the first inorganic member 204as with the seam S therebetween may be regarded as a state in which the lateral surface portion 604c is in contact with the first inorganic member 204as. In the following description, a state in which two members are in extreme proximity to each other with a seam therebetween is regarded as a state in which the two members are in contact with each other. The same applies to other modifications.

Therefore, the multi-layered film 600 relating to the present modification exhibits excellent flexibility and bending tolerance, as well as the multi-layered film 500 relating to Modification 3. Also, a further excellent bending tolerance is exhibited owing to existence of the seam S.

It is true that the configuration of the multi-layered film 600 allows moisture which infiltrates from outside through the base member 2 to infiltrate into a second organic layer 205 through a seam S. However, since this seam S is an extremely minute space, the moisture is difficult to infiltrate into the second organic layer 205 through the seam S. Also, since the first organic member 203 has an inverse tapered cross section, the seam S overlaps the second inorganic member 604d in plan view, in other words, an outer rim of the upper surface portion 604b is positioned more outward than the seam S in plan view. This configuration blocks the moisture, which infiltrates through the seam S, from moving straight upward in the multi-layered film 600 via the shortest route, and as a result the moisture needs to detour around the second inorganic member 604d. This means that it takes a longer time for the moisture which infiltrates from outside to infiltrates through the multi-layered film 600 and reach a device layer 90 (see FIG. 17) formed on or above the multi-layered film 600. Therefore, the multi-layered film 600 exhibits excellent gas barrier properties, thereby preventing the device layer 90 (see FIG. 17) from suffering a harmful influence of moisture which infiltrates from outside for a long time.

Generally, the closer to an angle of 90 degrees a tapered angle of the first organic member 203 is, the more the lateral surface portions 604c are each likely to be formed so as to wrap around a corresponding one of the lateral surfaces 203d of the first organic member 203. Conversely, the more acute the tapered angle of the first organic member 203 is, the less the lateral surface portion 604c is likely to be formed so as to wrap around the lateral surface 203d of the first organic member 203. Furthermore, the extent to which the lateral surface portion 604c wraps around the lateral surface 203d differs depending on conditions even if the same film manufacturing method is employed. If this extent is small, the size of the seam S increases and as a result the moisture easily infiltrates. For this reason, it is desirable that the lateral surface portion 604c should wrap around the lateral surface 203d to a large extent as much as possible. In order to increase the extent to which the lateral surface portion 604c wraps around the first organic member 203, in the case of CVD for example, a method of decreasing a silane flow rate to increase a reaction on the surface of the substrate is generally employed.

(Modification 5)

In the above embodiments and modifications, the pattern shown in FIG. 1 is used as an example of the pattern of the inorganic members. However, the pattern of the inorganic members is not limited to the pattern shown in FIG. 1. The shape of the inorganic members in plan view is not limited to a square, and may be any shape such as a circle, an ellipse, a rectangle, and a polygon.

In the pattern shown in FIG. 1, a plurality of rows of inorganic members are arranged such that each adjacent rows of inorganic members are shifted from each other by substantially half a length of a side of each inorganic member which is a square. However, the arrangement is not limited to this. Alternatively, each adjacent rows of inorganic members may be shifted from each other for example by an arbitrary length such as one third the side of the square and one fourth the side of the square. Further alternatively, each adjacent rows of inorganic members may not be shifted from each other.

According to the multi-layered film 100 relating to Embodiment 1, the first inorganic members 3s, the second inorganic members 7s, and the third inorganic members 10s all have substantially the same shape (square shape) and size in plan view. Alternatively, the shape and/or the size of the inorganic members may differ for each layer. Further alternatively, at least one of the layers may have inorganic members of two or more different shapes and/or sizes in combination. Yet alternatively, a plurality of patterns (sub patterns) in combination may be used as a single repeating pattern.

(Modification 6)

Embodiment 3 has described the case where the device layer 90 of the electronic device 1000 is constituted from organic EL elements. However, the present invention is not limited to this configuration, and the device layer 90 may be alternatively for example constituted from liquid crystal elements, photoelectric conversion elements, RFID elements, or the like.

(Modification 7)

Embodiment 3 has described the case where the electronic device 1000 includes the multi-layered film 100 relating to Embodiment 1. However, the present invention is not limited to this configuration, and the electronic device 1000 may alternatively include any of the multi-layered films relating to Embodiment 2 and the modifications.

(Modification 8)

The multi-layered film 100 relating to Embodiment 1 has the configuration in which the first inorganic section 3, the second inorganic section 7, and the third inorganic section 10 are each formed in the shape of islands. However, the present invention is not limited to this configuration, and alternatively, any one of the first inorganic section 3, the second inorganic section 7, and the third inorganic section 10 may be formed as a continuous and uniform inorganic layer. Even with this configuration of the present modification, split and crack are less likely to occur in the two inorganic sections which are each formed in the shape of islands. Accordingly, it is possible to exhibit excellent gas barrier properties, compared with the case where the three inorganic sections are all each formed as a continuous and uniform inorganic layer.

In this case, one of the three inorganic sections that is the closest to the base member 2 should be formed as a continuous and uniform inorganic layer, and remaining two inorganic sections that are closer to a third organic layer 12 (closer to a device layer 90) each should be formed in the shape of islands. With this configuration, even when split and crack occur in the continuous and uniform inorganic layer, it is possible to suppress influence on the device layer 90.

(Modification 9)

The multi-layered films relating to the above embodiments and modifications each may further include a continuous and uniform inorganic layer in any position on or above the base member 2. Also, the electronic device relating to Embodiment 3 and the above modifications each may further include a thin, continuous and uniform layer formed of an inorganic layer in any position between the base member 2 and the device layer 90. For example, in the case where the configuration of the present modification is applied to the multi-layered film 100 relating to Embodiment 1, the modified multi-layered film 100 would have totally four inorganic layers including the first inorganic section 3, the second inorganic section 7, the third inorganic section 10, and a continuous and uniform inorganic layer. Also, in the case where the configuration of the present modification is applied to the multi-layered film 200 relating to Embodiment 2, the modified multi-layered film 200 would have totally three inorganic layers including the first inorganic section 204a, the second inorganic section 204b, and a continuous and uniform inorganic layer.

(Modification 10)

The multi-layered film 500 relating to Modification 3 has the configuration in which the lateral surface portions 504c of the second inorganic members 504 are each continuous with a corresponding one of the first inorganic members 504as. However, the present invention is not limited to this configuration.

FIG. 22A is a partial cross-sectional view schematically showing a configuration of a multi-layered film 700A relating to Modification 10. According to the multi-layered film 700A, lateral surface portions 704c of a second inorganic member 704d are each formed so as to extend downstream from an end edge of a corresponding one of upper surface portions 704b of a second inorganic member 704d, and may be in contact with an end edge portion 204as1 of a corresponding one of first inorganic members 204as via a seam S that is a minute space, without being continuous with each other.

The multi-layered film 700A has a configuration in which the lateral surface portions 704c each cover respective lateral surfaces of corresponding first organic member portions 403a and 403b of a first organic member 403, in other words, entirely cover a corresponding one of lateral surface 403d of the first organic member 403. A lower end portion of each of the lateral surface portions 704c has a thickness in a direction parallel to a main surface 2a of a base member 2 that decreases toward a lower end thereof. The end edge portions 204as1 of the first inorganic members 204as each have a thickness in a direction perpendicular to the main surface 2a of the base member 2 that decreases toward the first organic member 403. The lateral surface portions 704c are each in contact with a corresponding one of the first inorganic members 204as via the seam S, at the lowest end of the first organic member 403 or at a position in extreme proximate to the lowest end. When viewed in plan, a contact portion C where the first inorganic member 204as is in contact with the lateral surface portion 704c overlaps the second inorganic member 704d. In other words, the second inorganic member 704d is in contact with the first inorganic member 204as not only at the outermost circumferential edge thereof. Specifically, in the cross section shown in FIG. 22A, a virtual straight line Q extending from the contact portion C in the direction perpendicular to the main surface 2a of the base member 2 is positioned closer to the first organic member 403 than a virtual straight line P extending from the outer circumferential edge of the second inorganic member 704d in the direction perpendicular to the main surface 2a of the base member 2 is positioned. Accordingly, when moisture infiltrates through a seam S positioned in the contact portion C, the moisture cannot move straight upward by the shortest route and needs to detour around the second inorganic member 704d. This lengthens the infiltration route, and as a result it takes a longer time for the moisture to reach a device layer that is positioned on or above the multi-layered film 700A.

Also, the thickness of each of the lateral surface portions 704c is thinner than the thickness of each of the upper surface portions 704b and the first inorganic members 204as. With this configuration, when a bending stress is applied, the bending stress can be absorbed by the lateral surface portions 704c to some extent. Accordingly, crack and the like are less likely to occur in the first inorganic members 204as and the second inorganic member 704d. Furthermore, the bending stress can be absorbed by the seam. Accordingly, crack and the like are less likely to occur in the first inorganic members 204as and the second inorganic member 704d.

As described above, the multi-layered film 700A relating to the present modification exhibits excellent flexibility, bending tolerance, and gas barrier properties, as well as the multi-layered films 500 and 600 relating to Modifications 3 and 4, respectively.

(Modification 11)

The multi-layered film 700A relating to Modification 10 has the configuration in which the lateral surface portions 704c each entirely cover a corresponding one of the lateral surfaces 403d of the first organic member 403, and the lateral surface portions 704c are each in contact with a corresponding one of the first inorganic members 204as, at the lowest end of the first organic member 403 or at a position in extreme proximate to the lowest end. However, the aspect in which the lateral surface portion 704c is in contact with the corresponding first inorganic member 204as is not limited to this configuration.

FIG. 22B is a partial cross-sectional view schematically showing a configuration of a multi-layered film 700B relating to Modification 11. According to the multi-layered film 700B, lateral surface portions 704c each cover a corresponding one of lateral surfaces 403d of a first organic member 403 except the lowest end of the lateral surface 403d. An end edge portion 204as1 of each of first inorganic members 204as reaches the first organic member 403. The lateral surface portion 704c is in contact with the corresponding first inorganic member 204as at a contact portion C. An air gap V exists between the contact portion C and a corresponding one of lower end portions of the first organic member 403.

Even in the case where the air gap V exists in this way, the lateral surface portion 704c is in contact with the corresponding first inorganic member 204as at the contact portion C, and the contact portion C overlaps a second inorganic member 704d in plan view. Also, a thickness of each of the lateral surface portions 704c is thinner than a thickness of each of the upper surface portions 704b and the first inorganic members 204as. Therefore, the multi-layered film 700B relating to Modification 11 exhibits excellent flexibility, bending tolerance, and gas barrier properties, as well as the multi-layered film 700A relating to Modification 10.

The lateral surface portion 704c of the present modification covers the corresponding lateral surface 403d of the first organic member 403 except the lowest end of the lateral surface 403d, and accordingly differs in terms of shape from the lateral surface portion 704c in Modification 10. However, since essential features are common such as a material and formation method between the lateral surface portion 604c in the present modification and the lateral surface portion 604c in Modification 10, these lateral surface portions are regarded as substantially identical, and the same numeral references are used. The same applies to Modifications 12 and 13.

(Modification 12)

FIG. 22C is a partial cross-sectional view schematically showing a configuration of a multi-layered film 700C relating to Modification 12. According to the multi-layered film 700C as shown in FIG. 22C, lateral surface portions 704c each cover a corresponding one of lateral surfaces 403d of a first organic member 403 down to the lowest end portion of the lateral surfaces 403d. An end edge portion 204as1 of each of first inorganic members 204as does not reach the first organic member 403. The first inorganic member 204as is in contact with the corresponding lateral surface portion 704c at a contact portion C. An air gap V exists between the contact portion C and a main surface 2a of a base member 2. The contact portion C overlaps a second inorganic member 704d in plan view. Also, a thickness of each of the lateral surface portions 704c is thinner than a thickness of each of the upper surface portions 704b and the first inorganic members 204as.

Therefore, the multi-layered film 700C relating to the present modification exhibits excellent flexibility, bending tolerance, and gas barrier properties, as well as the multi-layered films 700A and 700B relating to Modifications 10 and 11, respectively.

(Modification 13)

FIG. 22D is a partial cross-sectional view schematically showing a configuration of a multi-layered film 700D relating to Modification 13. According to the multi-layered film 700D as shown in FIG. 22D, lateral surface portions 704c each cover a corresponding one of lateral surfaces 403d of a first organic member 403 except the lowest end portion of the lateral surface 403d. An end edge portion 204as1 of each of first inorganic members 204as does not reach the first organic member 403. The first inorganic member 204as is in contact with the corresponding lateral surface portion 704c at a contact portion C. An air gap V exists between the contact portion C and a main surface 2a of a base member 2. The contact portion C overlaps a second inorganic member 704d in plan view. Also, a thickness of each of the lateral surface portions 704c is thinner than a thickness of each of the upper surface portions 704b and the first inorganic members 204as.

Therefore, the multi-layered film 700D relating to the present modification exhibits excellent flexibility, bending tolerance, and gas barrier properties, as well as the multi-layered films 700A, 700B, and 700C relating to Modifications 10, 11, and 12, respectively.

(Modification 14)

According to the multi-layered film 600 relating to Modification 4, the first organic member 203 has an inverse tapered cross section, and the lateral surface portions 604c each cover a corresponding one of the lateral surface 203d of the first organic member 203 down to the lower portion of the lateral surface 203d. An end edge portion 204as1 of each of first inorganic members 204as reaches a corresponding one of lower end portions of the first organic member 203. However, the present invention is not limited to this configuration.

Figure 23A:
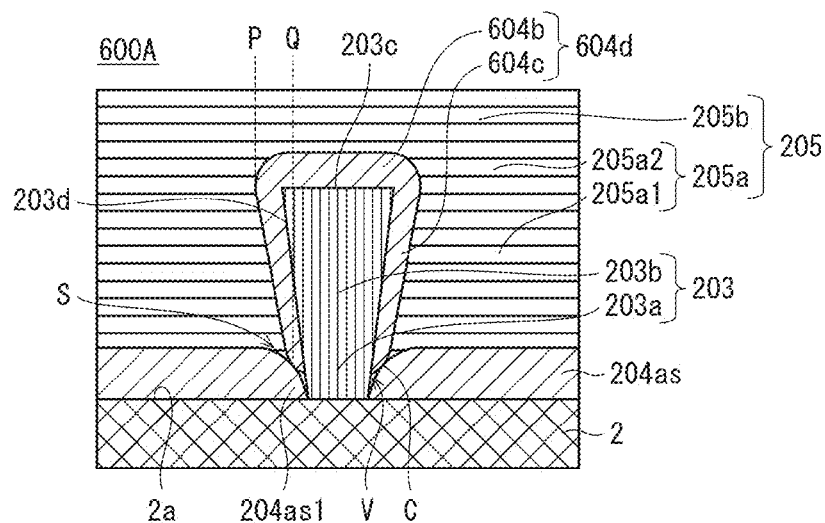
FIG. 23A is a partial cross-sectional view schematically showing a configuration of a multi-layered film relating to Modification 14.

FIG. 23A is a partial cross-sectional view schematically showing a configuration of a multi-layered film 600A relating to Modification 14. According to the multi-layered film 600A, lateral surface portions 604c each cover a corresponding one of lateral surfaces 203d of a first organic member 203 except the lowest end portion of the lateral surface 203d. An end edge portion 204as1 of each of first inorganic members 204as reaches a first organic member 203. The lateral surface portions 604c are each in contact with a corresponding one of first inorganic members 204as at a contact portion C. An air gap V exists between the contact portion C and a corresponding one of lower end portions of the first organic member 203.

Even in the case where the air gap V exists in this way, the lateral surface portion 604c is in contact with the corresponding first inorganic member 204as at the contact portion C, and the contact portion C overlaps a second inorganic member 604d in plan view. Also, a thickness of each of the lateral surface portions 604c in a direction parallel to a main surface 2a of a base member 2 or a direction perpendicular to a lateral surface of the first organic member 203 is thinner than a thickness of each of an upper surface portions 604b and the first inorganic members 204as. Therefore, the multi-layered film 600A relating to the present modification exhibits excellent flexibility, bending tolerance, and gas barrier properties, as well as the multi-layered film 600 relating to Modification 4.

The lateral surface portion 604c in the present modification covers the corresponding lateral surface of 203d of the first organic member 203 except the lowest end of the lateral surface 203d, and accordingly differs in terms of shape from the lateral surface portion 604c in Modification 4. However, since essential features are common such as a material and formation method between the lateral surface portion 604c in the present modification and the lateral surface portion 604c in Modification 4, these lateral surface portions are regarded as substantially identical, and the same numeral references are used. The same applies to Modifications 15 and 16.

(Modification 15)

Figure 23B:
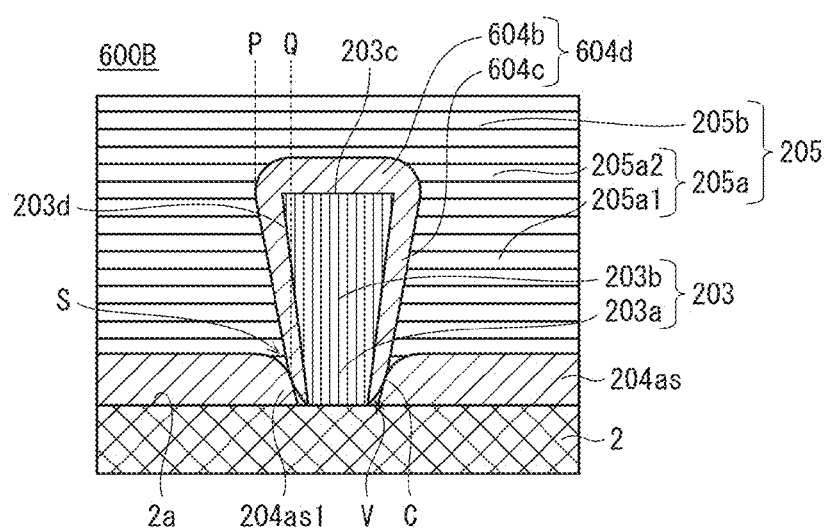
FIG. 23B is a partial cross-sectional view schematically showing a configuration of a multi-layered film relating to Modification 15.

FIG. 23B is a partial cross-sectional view schematically showing a configuration of a multi-layered film 600B relating to Modification 15. According to the multi-layered film 600B as shown in FIG. 23B, lateral surface portions 604c each cover a corresponding one of lateral surfaces 203d of a first organic member 203 down to the lowest end portion of the lateral surfaces 203d. An end edge portion 204as1 of each of first inorganic members 204as does not reach the first organic member 203. The first inorganic member 204as is in contact with the lateral surface portion 604c at a contact portion C. An air gap V exists between the contact portion C and a main surface 2a of a base member 2. The contact portion C overlaps a second inorganic member 604d in plan view. Also, a thickness of each of the lateral surface portions 604c is thinner than a thickness of each of upper surface portion 604b and the first inorganic members 204as.

Therefore, the multi-layered film 600B relating to the present modification exhibits excellent flexibility, bending tolerance, and gas barrier properties, as well as the multi-layered films 600 and 600A relating to Modifications 4 and 14, respectively.

(Modification 16)

Figure 23C:
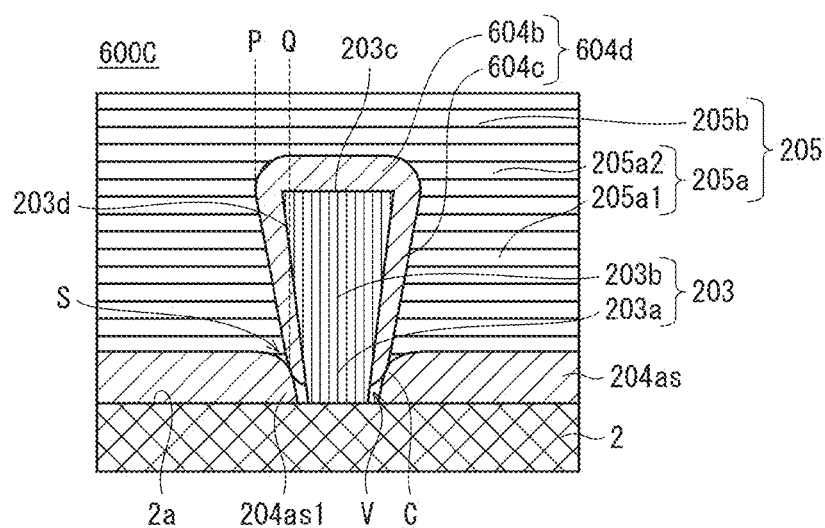
FIG. 23C is a partial cross-sectional view schematically showing a configuration of a multi-layered film relating to Modification 16.

FIG. 23C is a partial cross-sectional view schematically showing a configuration of a multi-layered film 600C relating to Modification 16. According to the multi-layered film 600C as shown in FIG. 23C, lateral surface portions 604c each cover a corresponding one of lateral surfaces 203d of a first organic member 203 except the lowest end portion of the lateral surface 203d. An end edge portion 204as1 of each of first inorganic members 204as does not reach the first organic member 203. The lateral surface portion 604c is in contact with a first inorganic member 204as at a contact portion C. An air gap V exists between the contact portion C and a corresponding one of lower end portions of the first organic member 203. Also, an air gap V exists between the contact portion C and a main surface 2a of a base member 2. The contact portion C overlaps a second inorganic member 604d in plan view. Also, a thickness of each of the lateral surface portions 604c is thinner than a thickness of each of upper surface portions 604b and the first inorganic members 204as.

Therefore, the multi-layered film 600C relating to the present modification exhibits excellent flexibility, bending tolerance, and gas barrier properties, as well as the multi-layered films 600, 600A, and 600B relating to Modifications 4, 14 and 15, respectively.

(Modification 17)

In Modifications 4, 14, 15, and 16, the first organic member, which has an inverse tapered cross section, is constituted from a single member. However, the configuration of the first organic member is not limited to this.

Figure 24A:
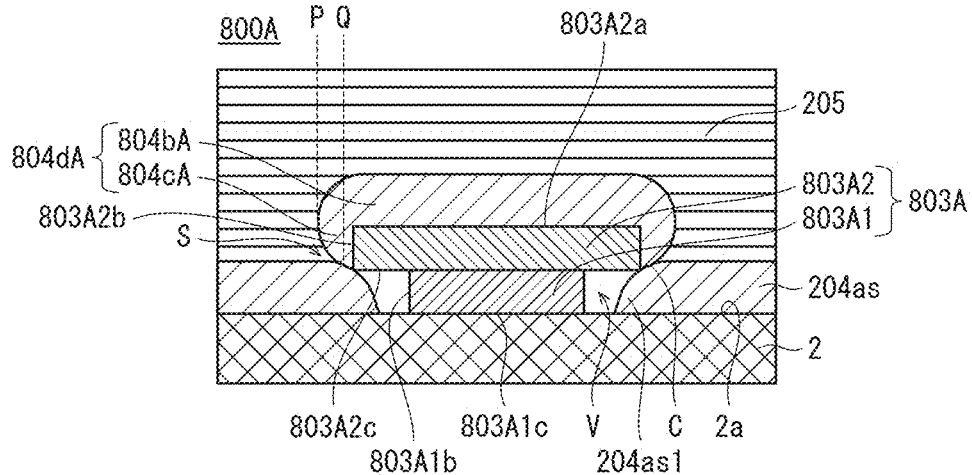
FIG. 24A is a partial cross-sectional view schematically showing a configuration of a multi-layered film relating to Modification 17.

FIG. 24A is a partial cross-sectional view schematically showing a configuration of a multi-layered film 800A relating to Modification 17. According to the multi-layered film 800A as shown in FIG. 24A, a first organic member 803A has a laminated structure of a plurality of layers. The first organic member 803A is composed of a first phase layer 803A1 that is formed on a base member 2 and a second phase layer 803A2 that is laminated on the first phase layer 803A1. The first phase layer 803A1 is longer than the second phase layer 803A2 in terms of length in a direction parallel to a main surface 2a of the base member 2. Specifically, an upper surface 803A2a of the second phase layer 803A2 (upper portion) is positioned on or above a lower surface 803A1c of the first phase layer 803A1 (bottom portion) constituting the first organic member 803A that is in contact with the base member 2, and the upper surface 803A2a is longer than the lower surface 803A1c in terms of length in the parallel direction. In this way, the second phase layer 803A2, which is longer than the first phase layer 803A1 in terms of length in the parallel direction, is laminated on the first phase layer 803A1. By making the upper side (the side opposite to the base member 2) longer than the lower side (the side of the base member 2) in terms of length in the parallel direction, it is possible to form a cross-sectional shape of the first organic member 803A so as to be similar to an inverse tapered shape.

Even in the case where the first organic member 803A is formed so as to have a cross-sectional shape similar to an inverse tapered shape through the laminated structure, formation of an inorganic layer on the first organic member 803A results in simultaneous formation of a second inorganic member 804dA and first inorganic members 204as as shown in FIG. 24A. The second inorganic member 804dA is constituted from upper surface portions that each cover a corresponding one of the upper surfaces 803A2a of the second phase layer 803A2 of the first organic member 803A and lateral surface portions 804cA that each cover a corresponding one of lateral surfaces 803A2b of the second phase layer 803A2. The first inorganic members 204as are positioned on the base member 2 so as to be positioned between each adjacent two portions of the first organic member 803A.

Although depending on the difference in terms of length in the parallel direction between the first phase layer 803A1 and the second phase layer 803A2, there is a case where the lateral surface portions 804cA each do not sufficiently wrap around a corresponding one of lateral surfaces 803A1b of the first phase layer 803A1, and there are few portions of the second inorganic member 804dA that are positioned on the lower surfaces 803A2c of the second phase layer 803A2 and the lateral surfaces 803A1*b* of the first phase layer 803A1 as shown in FIG. 24A. Also, there is a case where an end edge portion 204*as*1 of a first inorganic member 204*as* does not reach the first phase layer 803A1, and a comparative large air gap V exists. Even in this case, the second inorganic member 804*d*A is in contact with the corresponding first inorganic member 204*as* at a contact portion C, and the contact portion C overlaps the second inorganic member 804*d*A in plan view. Also, a thickness of each of the lateral surface portions 804*c*A is thinner than a thickness of each of the upper surface portions 804*b*A and the first inorganic members 204*as*. Therefore, the multi-layered film 800A relating to the present modification exhibits excellent flexibility, bending tolerance, and gas barrier properties.

Here, the inventors prepared a specimen and observed a cross section of the specimen by an electronic microscope. This is in order to check how first inorganic members and a second inorganic member are actually formed on a first organic member having a laminated structure of a plurality of layers such as the laminated structure in the multi-layered film 800A relating to the above Modification 17. The specimen was prepared by forming a laminated structure body 903A including a first phase layer 903A1 and a second phase layer 903A2 that are laminated in respective orders on a base member 2 that is a Si substrate, and then forming an inorganic SiN layer on the laminated structure body 903A and the base member 2.

Note that, as the laminated structure body 903A included in the specimen, not an organic material but an inorganic material was used for convenience because formation using an inorganic material is comparatively easy. Specifically, the first phase layer 903A1 was made of IGZO (oxide material of indium (In), gallium (Ga), and zinc (Zn)), and the second phase layer 903A2 was made of MoW (alloy of molybdenum and tungsten). The first phase layer 903A1 is longer than the second phase layer 903A2 in terms of length in the parallel direction.

Note that an osmium (Os) deposition film that is made of a material including Os is formed on first inorganic members 204*as* and a second inorganic member 804*d*A. The Os deposition film is formed in order to, when specimen is cut for cross section observation, reduce a damage given to the specimen to protect the structure of the specimen.

Figure 25A:
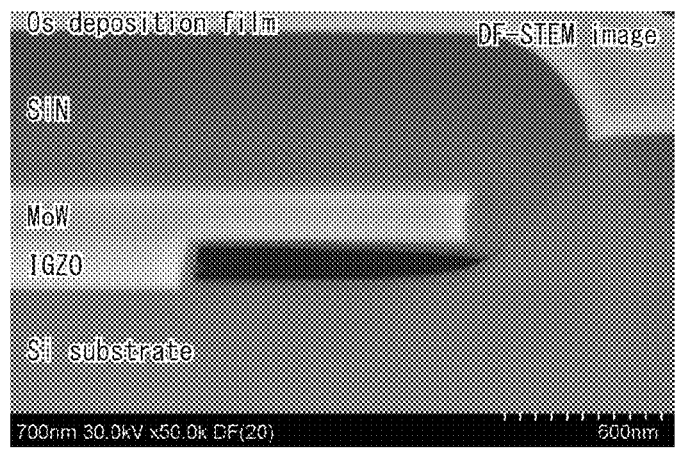
FIG. 25A shows a DF-STEM image of a cross section of a multi-layered film having the same configuration as the multi-layered film relating to Modification 17.
Figure 25B:
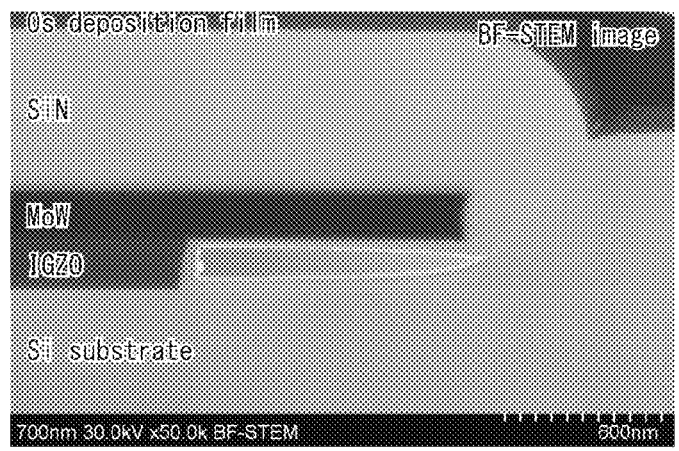
FIG. 25B shows a BF-STEM image of the cross section shown in FIG. 25A.
Figure 25C:
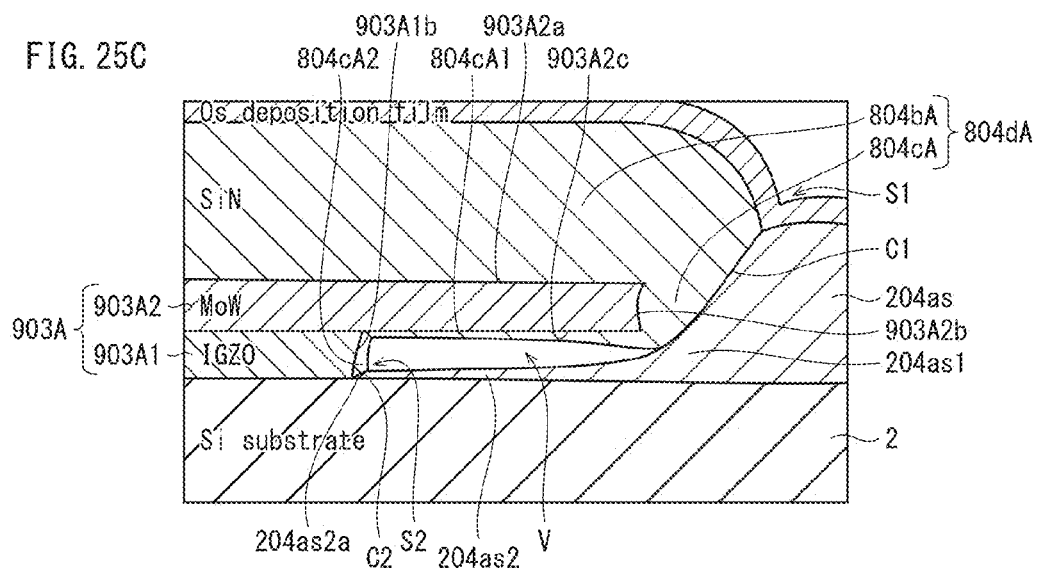
FIG. 25C schematically shows the cross section shown in FIG. 25A and FIG. 25B.

FIG. 25A and FIG. 25B each show an electronic microscope image of a cross section of the specimen taken along a plane perpendicular to the base member 2 of the specimen. FIG. 25A shows a DF-STEM image, and FIG. 25B shows a BF-STEM image. FIG. 25C schematically shows the cross section shown in the electronic microscope images of FIG. 25A and FIG. 25B for easy understanding.

As shown in FIG. 25A to FIG. 25C, the second inorganic member 804*d*A has upper surface portions 804*b*A that each cover a corresponding one of upper surfaces 903A2*a* of the second phase layer 903A2, and has lateral surface portions 804*c*A that each cover a corresponding one of lateral surfaces 903A2*b* of the second phase layer 903A2. Furthermore, the second inorganic member 804*d*A has thin film portions 804*c*A1 that each result from the corresponding lateral surface portion 804*c*A so as to wrap around a corresponding one of lower surfaces 903A2*c* of the second phase layer 903A2, and has thin film portions 804*c*A2 that each result from the corresponding lateral surface portion 804*c*A so as to wrap around a corresponding one of lateral surfaces 903A1*b* of the first phase layer 903A1 from the thin film portion 804*c*A1, as shown in FIG. 25A to FIG. 25C.

The first inorganic members 204*as* each have an end edge portion 204*as*1 that is in contact with the corresponding lateral surface portion 804*c*A so as to crawl under the lateral surface portion 804*c*A. Accordingly, a contact portion C1, where the first inorganic member 204*as* is in contact with the lateral surface portion 804*c*A, overlaps the second inorganic member 804*d*A in plan view. The first inorganic member 204*as* has, on a main surface 2*a* of the base member 2, an extremely thin film portion 204*as*2 that results from the end edge portion 204*as*1 extending from the contact portion C1. The thin film portion 204*as*2 is an extremely thin layer. The thin film portion 204*as*2 has a front end region 204*as*2*a* that is in contact with the corresponding thin film portion 804*c*A2 that covers the lateral surface of the first phase layer 903A1. Also, an air gap V exists in a region surrounded by the thin film portions 804*c*A1, 804*c*A2, and 204*as*2.

As described above, it was observed that the actual second inorganic member wraps around the lower surfaces and the lateral surfaces of the first organic member to form a thin film. Also, it was observed that the actual first inorganic members each crawl under the corresponding lower surface of the first organic member to form a thin film. Although the specimen has a comparative large air gap V as described above, the specimen is regarded to have the configuration in which the first inorganic members 204*as* are each in contact with the corresponding second inorganic member 804*d*A having the air gap V therebetween at two contact portions C1 and C2. With this configuration, when moisture permeates through the base member 2, the moisture infiltrates into the air gap V after permeating through a seam S2 positioned in the contact portion C2 where the first inorganic member 204*as* is in contact with the second inorganic member 804*d*A. Since the air gap V is surrounded by the thin film portions 804*c*A1, 804*c*A2, and 204*as*2 which are made of an inorganic material, the moisture cannot permeate through these thin film portions. There is a case that if the thin film portions are extremely thin, the moisture can permeate the thin film portions. In this case, however, it is still not easy for the moisture to permeate the thin film portions. Accordingly, in order for the moisture, which infiltrates into the air gap V, to move further upward in the multi-layered film, the moisture needs to permeate through the seam S1 positioned in the contact portion C1 where the first inorganic member 204*as* is in contact with the second inorganic member 804*d*A. The seam S1 has a longer distance than the seam S2, and therefore the seam S1 causes the moisture to take a longer time to infiltrate than the seam S2.

The specimen has the configuration in which the thickness of each of the lateral surface portions 804*c*A is thinner than the thickness of each of the upper surface portions 804*b*A and the first inorganic members 204*as*. The first inorganic member 204*as* is in contact with the corresponding second inorganic member 804*d*A. Therefore, it was confirmed that the specimen exhibits excellent flexibility and bending tolerance. Also, two seams, namely the seam S1 and the seam S2, exist on an infiltration route of moisture which permeates the base member 2, and this takes a long time for the moisture to further infiltrate. Therefore, it was confirmed that the specimen exhibits excellent gas barrier properties. Furthermore, the contact portions C1 and C2, where the first inorganic member 204*as* is in contact with the corresponding second inorganic member 804*d*A, each overlap the second inorganic member 804*d*A in plan view. Accordingly, moisture which infiltrates through the seams cannot move straight upward via the shortest route and needs to detour around the second inorganic member 804*d*A. This lengthens an infiltration route of the moisture, and as a result the moisture takes a long time to reach a device layer that is formed on or above the second inorganic member 804*d*A.

Therefore, it was confirmed that the specimen exhibits excellent gas barrier properties.

The laminated structure body 903A differs from the first organic member 803A relating to Modification 17 in terms of that the laminated structure body 903A includes the first phase layer 903A1 and the second phase layer 903A2 which are made of an inorganic material. However, the laminated structure body 903A is common with the first organic member 803A in terms of laminated structure itself. Accordingly, it is considered that also in the case where an inorganic layer is formed on the first organic member 803A relating to Modification 17, which has a laminated structure of two layers made of an organic material, the first inorganic member 204as and the second inorganic member 804dA are formed in the same aspect as in the specimen and therefore the same effect is exhibited.

Note that Japanese Patent No. 4556757 should be referred to for example, for a method of forming a member that is constituted from laminated layers differing from each other in terms of length in the parallel direction, such as the first organic member 803A of the present modification and the laminated structure body 903A shown in FIG. 25A to FIG. 25C. The same applies respective methods of forming a first organic member 803B relating to Modification 18 and a first organic member 803C relating to Modification 19 which are shown below.

(Modification 18)

Embodiment 17 has described the example where the first organic member 803A has a laminated structure of two layers. However, the present invention is not limited to this configuration.

Figure 24B:
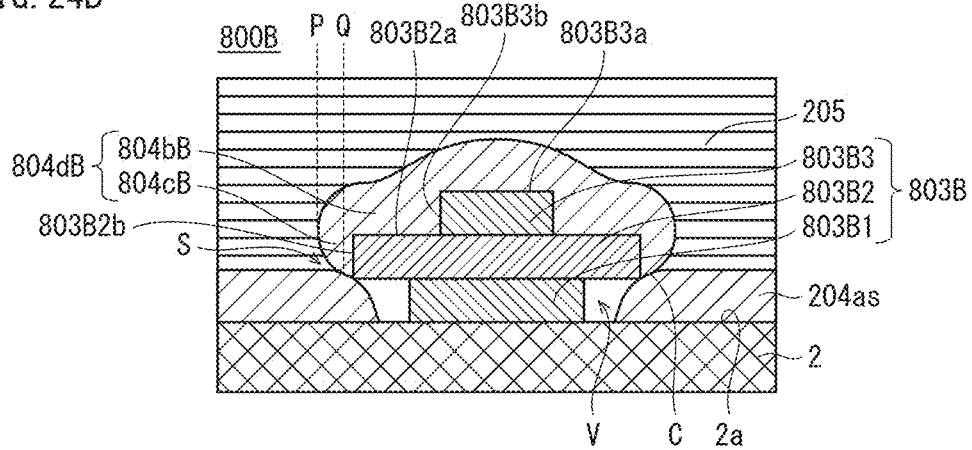
FIG. 24B is a partial cross-sectional view schematically showing a configuration of a multi-layered film relating to Modification 18.

FIG. 24B is a partial cross-sectional view schematically showing a configuration of a multi-layered film 800B relating to Modification 18. According to the multi-layered film 800B, a first organic member 803B is composed of three layers of a first phase layer 803B1, a second phase layer 803B2, and a third phase layer 803B3 that are laminated on a base member 2 in respective orders.

Also, in the case where the first organic member 803B is composed of three or more laminated layers, the uppermost layer does not necessarily need to be the longest among the laminated layers in terms of length in the parallel direction. According to the multi-layered film 800B as shown in FIG. 24B, the second phase layer 803B2 is longer than the third phase layer 803B3 in terms of length in the parallel direction. By making the second phase layer 803B2 (the upper portion) longer than the first phase layer 803B1 (the bottom portion) in terms of length in the parallel direction like in the multi-layered film 800B, it is possible to form the first organic member 803B so as to have a similar cross-sectional shape to an inverse tapered shape. Even in this case, when an inorganic layer is formed on the first organic member 803B, first inorganic members 204as are formed on the base member 2 simultaneously with a second inorganic member 804dB, as shown in FIG. 24B. The second inorganic member 804dB is constituted from upper surface portions 804bB and lateral surface portions 804cB. The upper surface portions 804bB each cover a corresponding one of upper surfaces 803B3a of the third phase layer 803B3 and a corresponding one of upper surfaces 803B2a of the second phase layer 803B2. The lateral surface portions 804cB each cover a corresponding one of lateral surfaces 803B3b of the third phase layer 803B3 and a corresponding one of lateral surfaces 803B2b of the second phase layer 803B2. The first inorganic members 204as are each in contact with a corresponding one of the lateral surface portions 804cB at a contact portion C, and the contact portion C overlaps the second inorganic member 804dB in plan view. Also, a thickness of each of the lateral surface portions 804cB is thinner than a thickness of each of the upper surface portions 804bB and the first inorganic members 204as.

Therefore, the multi-layered film 800B relating to the present modification also exhibits excellent flexibility, bending tolerance, and gas barrier properties.

Note that the thickness of the upper surface portion 804bB indicates a thickness of the thickest part of the upper surface portion 804bB.

(Modification 19)

In the case where a first organic member is composed of three or more laminated layers, the lowermost layer does not necessarily need to be the shortest among the laminated layers in terms of length in the direction parallel to the main surface 2a of the base member 2.

Figure 24C:
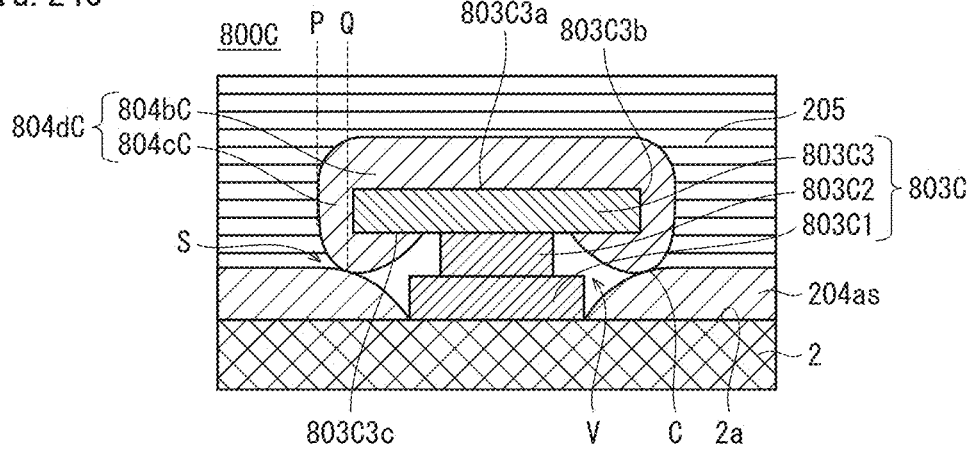
FIG. 24C is a partial cross-sectional view schematically showing a configuration of a multi-layered film relating to Modification 19.

FIG. 24C is a partial cross-sectional view schematically showing a configuration of a multi-layered film 800C relating to Modification 19. According to the multi-layered film 800C, a first organic member 803C is composed of three layers of a first phase layer 803C1, a second phase layer 803C2, and a third phase layer 803C3 that are laminated on a base member 2 in respective orders. According to the multi-layered film 800B as shown in FIG. 24B, the second phase layer 803C2 is shorter than the first phase layer 803C1, which is the lowermost layer among the three layers, in terms of length in the parallel direction. Even in this case, by making the third phase layer 803C3 longer than the first phase layer 803C1 in terms of length in the parallel direction, it is possible to form the first organic member 803C so as to have a similar cross-sectional shape to an inverse tapered shape as a whole. Even in this case, when an inorganic layer is formed on the first organic member 803C, first inorganic members 204as are formed on the base member 2 simultaneously with a second inorganic member 804dC as shown in FIG. 24C. The second inorganic member 804dC is constituted from upper surface portions 804bC and lateral surface portions 804cC. The upper surface portions 804bC each cover a corresponding one of upper surfaces 803C3a of the third phase layer 803C3. The lateral surface portions 804cC each cover a corresponding one of lateral surfaces 803C3b of the third phase layer 803C3 and partially wrap around a corresponding one of lower surfaces 803C3c of the third phase layer 803C3. The first inorganic members 204as are each in contact with a corresponding one of the lateral surface portions 804cC at a contact portion C, and the contact portion C overlaps the second inorganic member 804dC in plan view. Also, a thickness of each of the lateral surface portions 804cC is thinner than a thickness of each of the upper surface portions 804bC and the first inorganic members 204as.

Therefore, the multi-layered film 800C relating to the present modification also exhibits excellent flexibility, bending tolerance, and gas barrier properties.

Note that in the case where the first organic member 803C has a laminated structure of three or more layers such that the uppermost layer is the longest in terms of length in the parallel direction and the length in the parallel direction decreases toward the lowermost layer. With this configuration, the lateral surface portions 804cC are easily formed each so as to wrap around the corresponding lateral surface of the first organic member 803C. This increases an area where the lateral surface portion 804cC is in contact with the corresponding first inorganic member 204as, thereby reducing the size of an air gap V. Therefore, the multi-layered film 800B exhibits further improved gas barrier properties.

(Modification 20)

In the above embodiments and modifications, the base member has a single-layer structure. However, the present invention is not limited to this configuration, and the base member may alternatively have a multi-layer structure.

For example, the base member may be constituted from an insulating layer, an adhesive layer, a metal thin film, and the like that are laminated on a resin layer.

<Supplement>

The embodiments and modifications described above each show a preferred specific example of the present invention. The numerical values, shapes, materials, and so on described in the above embodiments and modifications are just examples, and do not intend to limit the present invention.

Also, the figures shown in the above embodiments and modifications are each a pattern diagram, and accordingly the configuration elements illustrated in the figures are not necessarily exactly scaled. Furthermore, the present invention is not limited by the description of the above embodiments, and may be appropriately modified without departing from the scope of the present invention. For example, the present invention may be a multi-layered film or an electronic device that is realized by appropriate combination of the configurations of the above embodiments and part of the configurations of the above modifications.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A multi-layered film comprising:
   a base member that is plate-like and flexible;
   a plurality of first inorganic members that are each plate-like, and are arranged on the base member so as to be spaced from each other in a direction parallel to a main surface of the base member;
   a first organic member that is provided on the base member so as to be positioned between each adjacent two of the first inorganic members and surround each of the first inorganic members;
   a second inorganic member that covers an upper surface and lateral surfaces of the first organic member; and
   a second organic member that fills a space that is provided on or above the first inorganic members, and is surrounded, in a plan view, by the second inorganic member, wherein
   each of lateral portions of the second inorganic member that covers a corresponding one of the lateral surfaces of the first organic member is thinner than each of the first inorganic members and each of upper portions of the second inorganic member that covers a corresponding portion of the upper surface of the first organic member.

2. The multi-layered film of claim 1, wherein
the first inorganic members are each spaced from the first organic member in the direction parallel to the main surface of the base member.

3. The multi-layered film of claim 1, wherein
the first inorganic members each have a contact portion that is in contact with a corresponding one of the lateral surface portions of the second inorganic member.

4. The multi-layered film of claim 3, wherein
when viewed in plan, the contact portion of each of the first inorganic members overlaps the second inorganic member.

5. The multi-layered film of claim 1, wherein
in a cross section perpendicular to the main surface of the base member,
each of bottom portions of the first organic member that is in contact with the base member is shorter than each of upper portions of the first organic member that is positioned on or above a corresponding one of the bottom portions, in terms of length in the direction parallel to the main surface of the base member.

6. The multi-layered film of claim 5, wherein
the first organic member is composed of laminated layers that include at least two layers differing from each other in terms of the length in the parallel direction,
the bottom portions of the first organic member constitute a first phase layer that is included in the laminated layers and is positioned on the base member, and
the upper portions of the first organic member constitute one or more layers that are included in the laminated layers, and at least one of the one or more layers is longer than the first phase layer in terms of the length in the parallel direction.

7. The multi-layered film of claim 1, wherein
an end edge portion of each of the first inorganic members that is in the most proximity to the first organic member is continuous with a corresponding one of the lateral surface portions of the second inorganic member.

8. An electronic device comprising:
the multi-layered film of claim 1; and
a device layer that is provided on or above the multi-layered film.

9. The electronic device of claim 8, further comprising:
a planarization layer that is provided between the multi-layered-film and the device layer, wherein
the planarization layer has a surface roughness of 100 nm or less.

10. The electronic device of claim 8, wherein
the device layer is constituted from one type of organic EL elements, liquid crystal elements, photoelectric conversion elements, and RFID elements.

11. The electronic device of claim 8, wherein
the device layer has a display region for displaying images, and
when viewed in plan, at least one type of the first inorganic members and the second inorganic member occupies 90% or more of an area of the display region.

* * * * *